(12) United States Patent
Wang et al.

(10) Patent No.: US 12,278,240 B2
(45) Date of Patent: Apr. 15, 2025

(54) IC LOGIC DEVICE, LAYOUT, SYSTEM, AND METHOD

(71) Applicant: TAIWAN SEMICONDUCTOR MANUFACTURING COMPANY, LTD., Hsinchu (TW)

(72) Inventors: I-Wen Wang, Hsinchu (TW); Chia-Chun Wu, Hsinchu (TW); Hui-Zhong Zhuang, Hsinchu (TW); Yung-Chen Chien, Hsinchu (TW); Jerry Chang Jui Kao, Hsinchu (TW); Xiangdong Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 406 days.

(21) Appl. No.: 17/750,168

(22) Filed: May 20, 2022

(65) Prior Publication Data

US 2023/0261002 A1 Aug. 17, 2023

Related U.S. Application Data

(60) Provisional application No. 63/310,478, filed on Feb. 15, 2022.

(51) Int. Cl.
*H01L 27/00* (2006.01)
*H01L 27/118* (2006.01)
*G06F 30/392* (2020.01)

(52) U.S. Cl.
CPC ...... *H01L 27/11807* (2013.01); *G06F 30/392* (2020.01); *H01L 2027/11881* (2013.01)

(58) Field of Classification Search
CPC ..... H01L 27/11807; H01L 2027/11881; G06F 30/392
See application file for complete search history.

(56) References Cited

U.S. PATENT DOCUMENTS

| 9,870,992 B1 | 1/2018 | Kim |
| 11,784,646 B1 * | 10/2023 | Huang ............... G06F 30/392 327/333 |
| 2017/0141034 A1 | 5/2017 | Kim |
| 2018/0025972 A1 | 1/2018 | Kim |

(Continued)

FOREIGN PATENT DOCUMENTS

TW 202114146 4/2021

*Primary Examiner* — Richard A Booth
(74) *Attorney, Agent, or Firm* — Hauptman Ham, LLP

(57) ABSTRACT

An IC device includes first and second power rails extending in a first direction and carrying one of a power supply or reference voltage, a third power rail extending between the first and second power rails and carrying the other of the power supply or reference voltage, and a plurality of transistors including first through fourth active areas extending between the first and second power rails, a plurality of gate structures extending perpendicularly to the first direction, and first and second conductive segments extending in the second direction across the third power rail. Each of the second and third active areas is adjacent to the third power rail, each of the first and second conductive segments is electrically connected to S/D structures in each of the second and third active areas, and the plurality of transistors is configured as one of an AOI, an OAI, or a four-input NAND gate.

20 Claims, 32 Drawing Sheets

(56) References Cited

U.S. PATENT DOCUMENTS

2020/0042668 A1\* 2/2020 Peng .................... H01L 23/535
2020/0134123 A1   4/2020 Wang et al.
2023/0036522 A1\* 2/2023 Chen ................... H01L 23/5286

\* cited by examiner

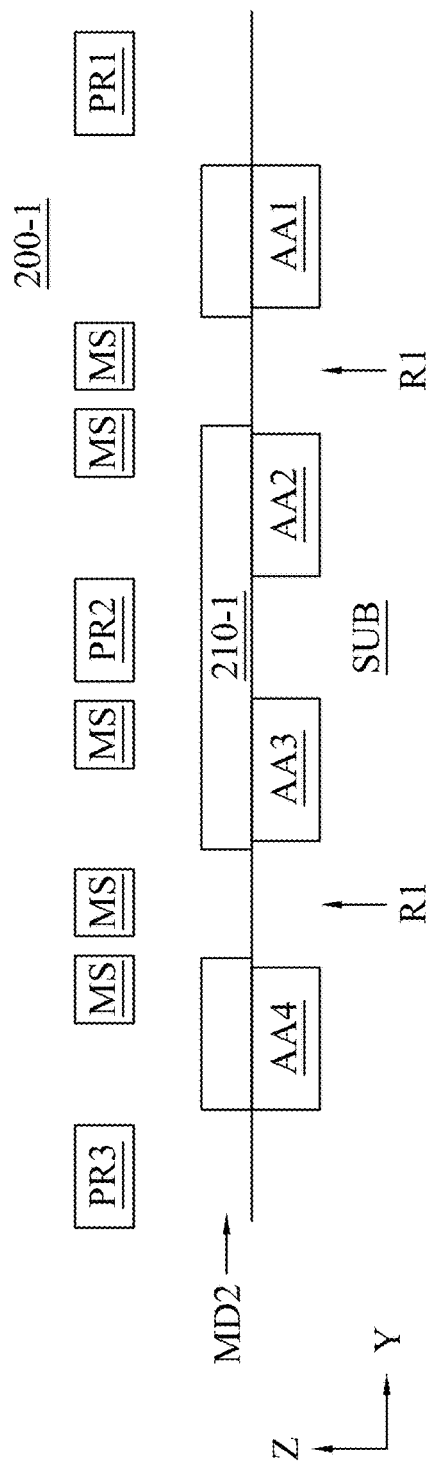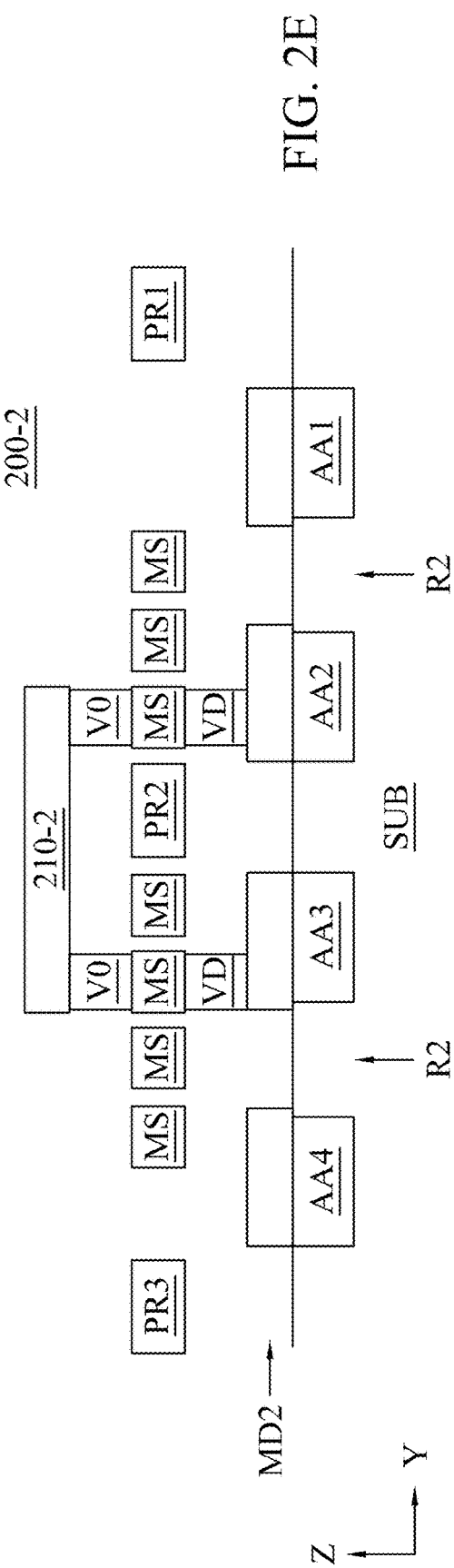

1500

1510 — Form first and second active areas in a first row extending in a first direction and third and fourth active areas in a second row adjacent to the first row, wherein each active area includes a plurality of S/D structures

1520 — Construct first and second conductive segments extending in a second direction, wherein each of the first and second conductive segments overlies and is electrically connected to S/D structures in each of the second and third active areas

1530 — Construct additional conductive segments, a plurality of gate structures, and a plurality of via structures, thereby forming one of an AOI, OAI, or four-input NAND device including the first and second conductive segments and pull-up pulldown transistors in each of the first and second rows

1540 — Construct first through third power rails extending in the first direction, wherein the first and second power rails are aligned with the first row, the second and third power rails are aligned with the second row, and each of the first and second conductive segments crosses a plane perpendicular to the first and second conductive segments and including the second power rail

FIG. 15

IC LOGIC DEVICE, LAYOUT, SYSTEM, AND METHOD

PRIORITY CLAIM

The present application claims the priority of U.S. Provisional Application No. 63/310,478, filed Feb. 15, 2022, which is incorporated herein by reference in its entirety.

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications. Various electronic design automation (EDA) tools are used to generate, revise, and verify designs for semiconductor devices while ensuring that IC structure design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2D is a cross-sectional view of an IC layout diagram and corresponding IC logic device, in accordance with some embodiments.

FIG. 2E is a cross-sectional view of an IC layout diagram and corresponding IC logic device, in accordance with some embodiments.

FIG. 15 is a flowchart of a method of manufacturing an IC logic device, in accordance with some embodiments.

DETAILED DESCRIPTION

Figure 1B:
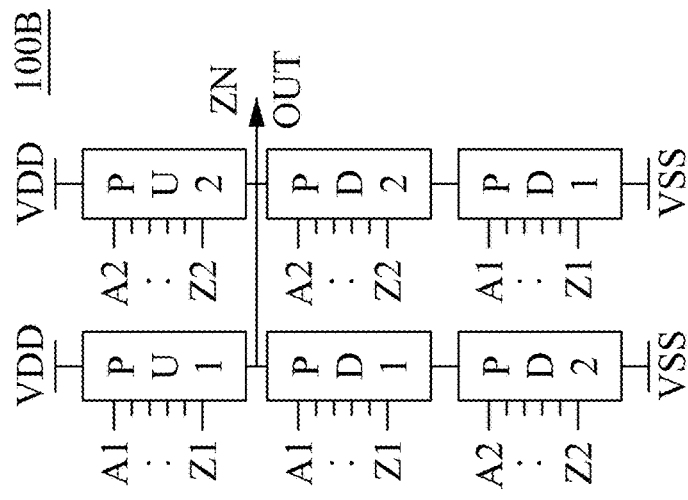
FIGS. 1A-1C are diagrams of IC logic devices, in accordance with some embodiments.

The following disclosure provides many different embodiments, or examples, for implementing different features of the provided subject matter. Specific examples of components, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC device based on an IC layout diagram includes three power rails and a plurality of transistors including four active areas, a plurality of gates, and first and second conductive segments extending across the middle power rail. Each of the first and second conductive segments is electrically connected to source/drain (S/D) structures in each of the second and third active areas, and the plurality of transistors is configured as a logic device such as an and-or-inverter (AOI), an or-and-inverter (OAI), or a four-input NAND gate. Compared to approaches in which such logic devices are otherwise configured, e.g., based on a total of two power rails, conductive segment lengths, and thereby speed degradation and electromigration-based reliability risks, are reduced.

Figure 1A:
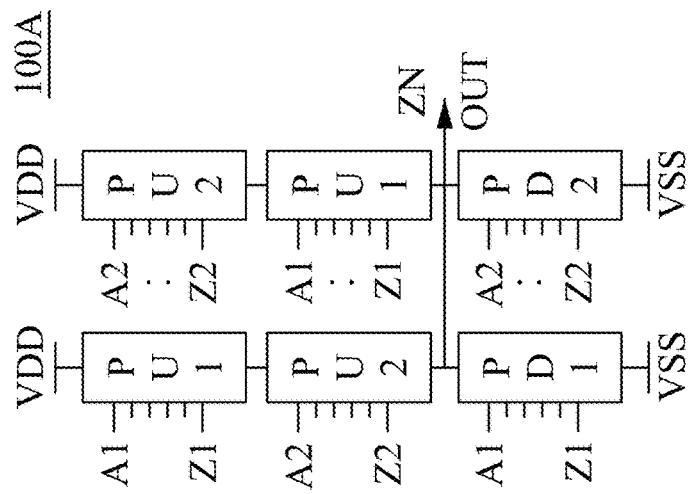
Figure 1C:
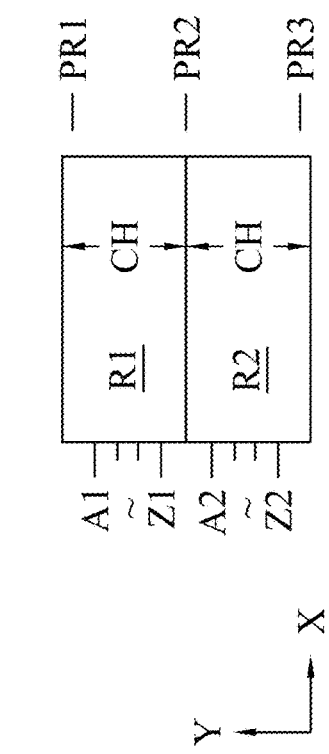

As discussed below, FIGS. 1A-1C depict top-level circuit topologies, each of FIGS. 2A-13A is a schematic diagram of a logic circuit embodiment, and each of FIGS. 2B-2E and 3B-13B depicts a plan or cross-sectional view of a corresponding device/layout diagram embodiment in which the reference designators represent both IC device features and the IC layout features used to at least partially define the corresponding IC device features in a manufacturing process, e.g., a method 1500 discussed below with respect to FIG. 15 and/or an IC manufacturing flow associated with an IC manufacturing system 1800 discussed below with respect to FIG. 18. In some embodiments, one or more of FIG. 2B-2E or 3B-13B is some or all of an IC layout diagram generated by executing some or all of the operations of a method 1600 discussed below with respect to FIG. 16, e.g., using a system 1700 discussed below with respect to FIG. 17. Accordingly, each of FIGS. 2B-2E and 3B-13B represents a plan view of both an IC layout diagram and a corresponding IC device.

Each of the figures herein, e.g., FIGS. 1A-13B, is simplified for the purpose of illustration. The figures are views of IC structures and devices with various features included and excluded to facilitate the discussion below. In various embodiments, an IC structure, device and/or layout diagram includes one or more features corresponding to power distribution structures, metal interconnects, contacts, vias, gate structures, S/D structures, bulk connections, or other transistor elements, isolation structures, or the like, in addition to the features depicted in FIGS. 1A-13B.

FIGS. 1A-1C are top-level diagrams of IC logic devices, in accordance with some embodiments. FIG. 1A depicts a pull-up configuration 100A, FIG. 1B depicts a pull-down configuration 100B, and FIG. 1C depicts a device/layout diagram 100C corresponding to both of configurations 100A and 100B and includes X and Y directions. In some embodiments, device/layout diagram 100C is referred to as cell 100C.

Each of pull-up configuration 100A and pull-down configuration 100B includes pull-up (PMOS) transistor groups PU1 and PU2 and pull-down (NMOS) transistor groups PD1 and PD2 arranged between a power supply voltage VDD and a power supply reference voltage VSS. Gates of each of pull-up transistor group PU1 and pull-down transistor group PD1 are configured to receive input signals A1-Z1, and gates of each of pull-up transistor group PU2 and pull-down transistor group PD2 are configured to receive input signals A2-Z2. Each of pull-up configuration 100A and pull-down configuration 100B includes an output terminal OUT coupled between pull-up transistor groups PU1/PU2 and pull-down transistor groups PD1/PD2, and configured to carry an output signal ZN based on input signals A1-Z1 and A2-Z2 and the corresponding configuration of pull-up transistor groups PU1/PU2 and pull-down transistor groups PD1/PD2.

Pull-up configuration 100A includes two instances of each of pull-up transistor groups PU1 and PU2 configured to selectively couple output signal ZN to power supply voltage VDD, and a single instance of each of pull-down transistor groups PD1 and PD2 configured to selectively couple output signal ZN to power supply reference voltage VSS.

Pull-down configuration 100B includes a single instance of each of pull-up transistor groups PU1 and PU2 configured to selectively couple output terminal OUT to power supply voltage VDD, and two instances of each of pull-down transistor groups PD1 and PD2 configured to selectively couple output terminal OUT to power supply reference voltage VSS.

Device/layout diagram 100C includes power rails PR1-PR3 extending in the X direction, a row R1 extending in the X direction between power rails PR1 and PR2 and a row R2 extending in the X direction between power rails PR2 and PR3.

Power rails PR1-PR3 correspond to metal regions/segments. A metal region/segment is a region in an IC layout diagram included in the manufacturing process as part of defining a metal segment structure including one or more conductive materials, e.g., polysilicon, copper (Cu), aluminum (Al), tungsten (W), cobalt (Co), ruthenium (Ru), or one or more other metals or other suitable materials, in a given metal layer of the manufacturing process. In various embodiments, one or more of power rails PR1-PR3 corresponds to a first metal layer (also referred to as a metal zero layer in some embodiments), a second or higher level metal layer, a buried metal layer, or a backside metal layer of the manufacturing process.

In some embodiments, either power rails PR1 and PR3 are configured to carry power supply voltage VDD and power rail PR2 is configured to carry power supply reference voltage VSS, or power rails PR1 and PR3 are configured to carry power supply reference voltage VSS and power rail PR2 is configured to carry power supply voltage VDD.

Rows R1 and R2 are collectively bounded by a border PRb, also referred to a cell boundary or place-and-route boundary PRb in some embodiments. Border PRb includes segments (not labelled) extending along the X direction and aligned with power rails PR1 and PR3 in a Z direction (not shown) perpendicular to the X and Y directions, and segments (not labelled) extending along the Y direction and aligned in the Z direction with gate regions/structures (not shown in FIG. 1C), e.g., gate region/structure G1 and one of gate regions/structures G10, G12, or G14 discussed below with respect to FIGS. 2B-2E and 3B-13B.

Each of rows R1 and R2 has a height CH in the Y direction. In some embodiments, height CH corresponds to a pitch of power rails PR1-PR3. In some embodiments, height CH is referred to as cell height CH, and device/layout diagram 100C is referred to as a double height cell.

As depicted in FIG. 1C, each of pull-up configuration 100A and pull-down configuration 100B is implemented as device/layout diagram 100C including pull-up transistor group(s) PU1 and pull-down transistor group(s) PD1 positioned in row R1 configured to receive input signals A1-Z1, and pull-up transistor group(s) PU2 and pull-down transistor group(s) PD2 positioned in row R2 configured to receive input signals A2-Z2.

As further discussed below with respect to FIGS. 2B-2E and 3B-13B, device/layout diagram 100C also includes two or more conductive regions/segments (not shown in FIG. 1C) extending in the Y direction from row R1 to row R2 and thereby across power rail PR2. Each of the two or more conductive regions/segments is electrically connected to a S/D structure included in one or more transistors of pull-up transistor group(s) PU1 or pull-down transistor group(s) PD1 in row R1 and to a S/D structure included in one or more transistors of pull-up transistor group(s) PU2 or pull-down transistor group(s) PD2 in row R2. The two or more conductive regions are considered to extend across power rail PR2 by overlapping power rail PR2 in the layout diagram, and the two or more conductive segments are considered to extend across power rail PR2 by intersecting an X-Z plane (not shown) in which power rail PR2 is located.

By including the two or more conductive regions/segments in one of pull-up configuration 100A or pull-down configuration 100B, device/layout diagram 100C includes conductive features having lengths shorter than those of approaches in which corresponding logic devices are otherwise configured, e.g., based on a total of two power rails, speed degradation and electromigration-based reliability risks thereby being reduced.

The transistor group configurations depicted in FIGS. 1A-1C are non-limiting examples provided for the purpose of illustration. In some embodiments, device/layout diagram 100C is otherwise configured to include two or more conductive regions/segments extending across power rail PR2. In some embodiments, pull-up configuration 100A implemented as device/layout diagram 100C includes more than two instances of one or both of pull-up transistor groups PU1 or PU2 in a corresponding row R1 or R2, one or more pull-up transistor groups in addition to pull-up transistor groups PU1 and PU2 in a given one of rows R1 or R2, and/or pull-up transistor groups configured to receive unequal numbers of input signals, e.g., input signals A1-Z1 and A2-Z2. In some embodiments, pull-down configuration 100B implemented as device/layout diagram 100C includes more than two instances of one or both of pull-down transistor groups PD1 or PD2, one or more pull-down transistor groups in addition to pull-down transistor groups PD1 and PD2 in a corresponding row R1 or R2, and/or pull-down transistor groups configured to receive unequal numbers of input signals in a given one of rows R1 or R2.

FIGS. 2A-13A are schematic diagrams of respective IC logic devices 200-1300, in accordance with some embodiments. Each of IC logic devices 200-1300 is a non-limiting example of one of pull-up configuration 100A or pull-down configuration 100B implemented as device/layout diagram 100C, the devices/diagrams also being referred to as cells 200-1, 200-2, and 300-1300 in some embodiments. Each of FIGS. 2A-13A and corresponding FIGS. 2B-2E and 3B-13B depicts an instance of pull-up and pull-down transistors, e.g., pull-up transistors PU1 and PU2 and/or pull-down transistors PD1 and PD2, in which transistors are not labeled individually or collectively for the purpose of clarity.

In each of devices 200-1300 depicted in FIGS. 2A-13A, pull-up transistors include PMOS transistors coupled between power supply voltage VDD and output terminal OUT and configured to receive input signals, and pull-down transistors include NMOS transistors coupled between output terminal OUT and power supply reference voltage VSS and configured to receive the input signals. First subsets of each of the pull-up and pull-down transistors are positioned in row R1 and second subsets of each of the pull-up and pull-down transistors are positioned in row R2 as discussed below and illustrated in corresponding FIGS. 2B-2E and 3B-13B.

Figure 2A:
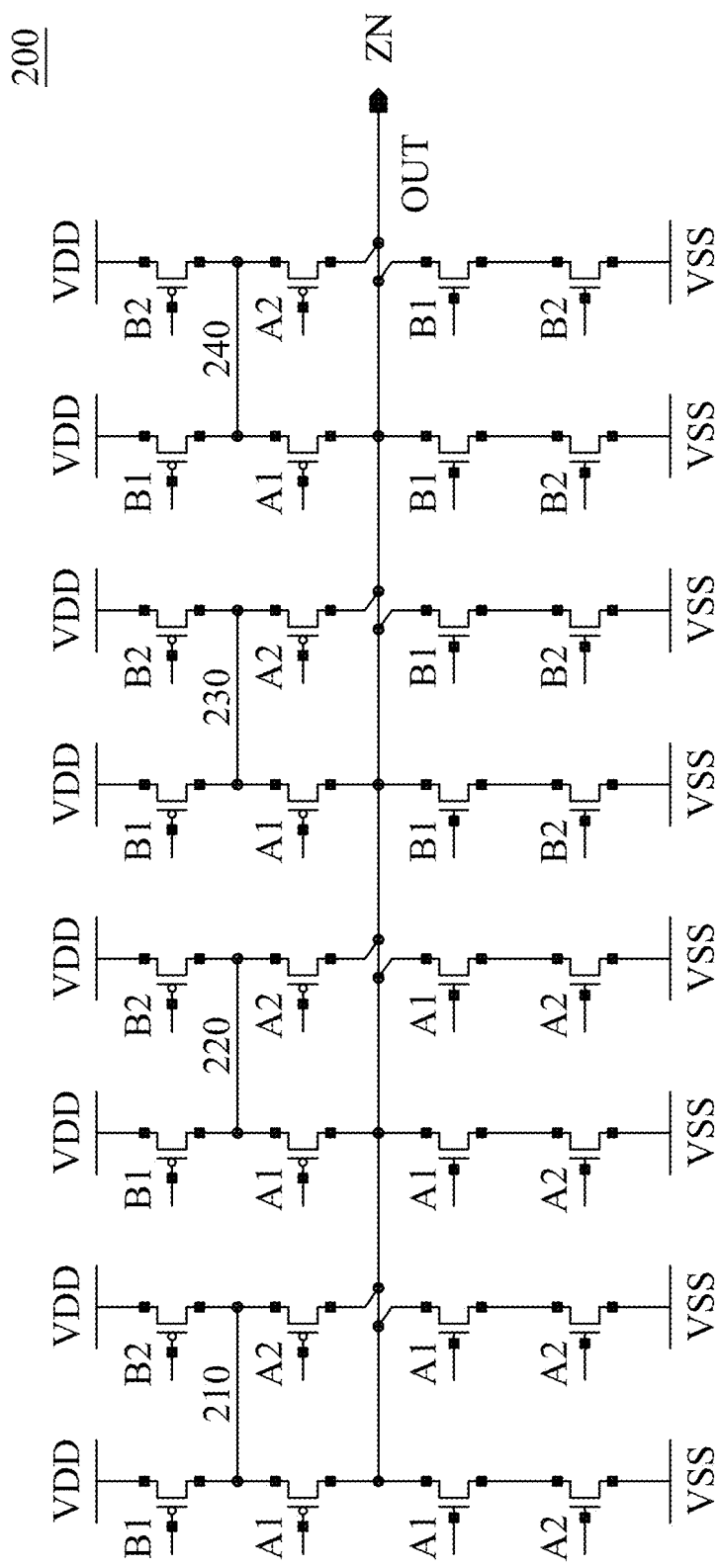
FIG. 2A is a schematic diagram of an IC logic device, in accordance with some embodiments.

Device 200 depicted in FIG. 2A is a non-limiting example of pull-up configuration 100A in which the pull-up transistors include a total of eight PMOS transistors in row R1 configured to receive input signals B1 and B2 and a total of eight PMOS transistors in row R2 configured to receive input signals A1 and A2, and the pull-down transistors include a total of eight NMOS transistors in row R1 configured to receive input signals B1 and B2, and a total of eight NMOS transistors in row R2 configured to receive input signals A1 and A2. Device 200 includes conductive paths 210-240 configured to electrically connect shared S/D terminals of pull-up transistors in row R1 to shared S/D terminals of pull-up transistors in row R2 as discussed below with respect to FIGS. 2B-2E, and is thereby configured as an AOI device capable of generating output signal ZN responsive to input signals A1, A2, B1, and B2. In some embodiments, device 200 is referred to as an AOI22D4 device.

Figure 3A:
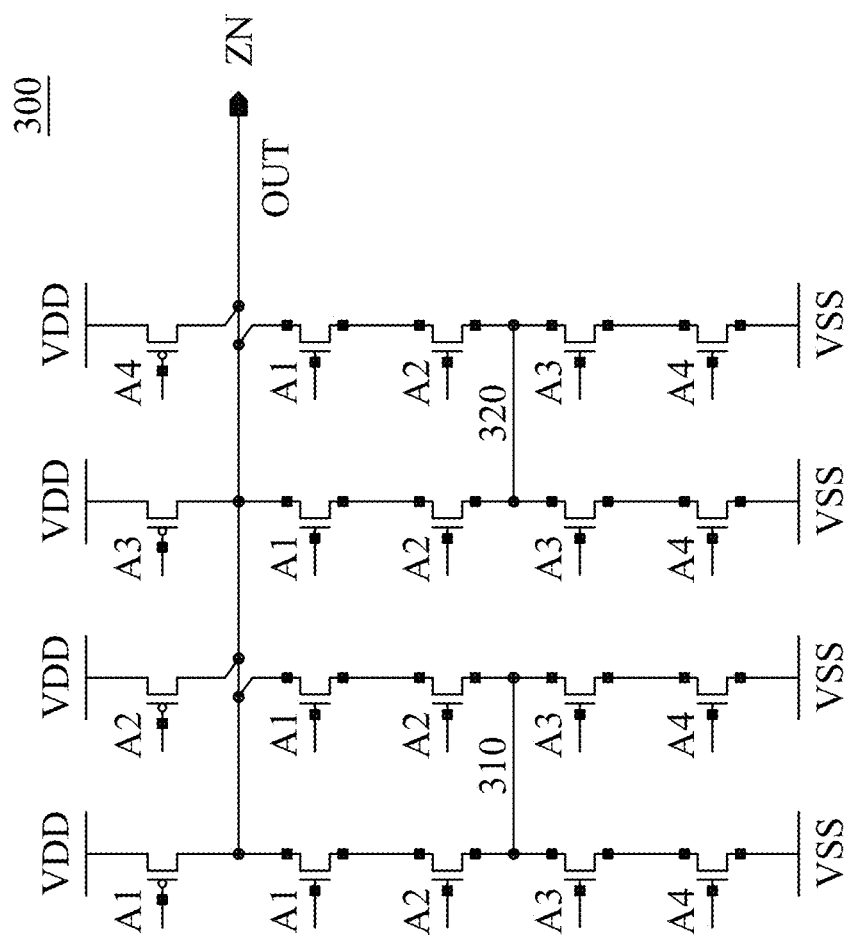
FIG. 3A is a schematic diagram of an IC logic device, in accordance with some embodiments.

Device 300 depicted in FIG. 3A is a non-limiting example of pull-down configuration 100B in which the pull-up transistors include a total of two PMOS transistors in row R1 configured to receive input signals A3 and A4 and a total of two PMOS transistors in row R2 configured to receive input signals A1 and A2, and the pull-down transistors include a total of eight NMOS transistors in row R1 configured to receive input signals A3 and A4, and a total of eight NMOS transistors in row R2 configured to receive input signals A1 and A2. Device 300 includes conductive paths 310 and 320 configured to electrically connect shared S/D terminals of pull-down transistors in row R1 to shared S/D terminals of pull-down transistors in row R2 as discussed below with respect to FIG. 3B, and is thereby configured as a four-input NAND device capable of generating output signal ZN responsive to input signals A1, A2, A3, and A4. In some embodiments, device 300 is referred to as an ND4D4 device.

Figure 4A:
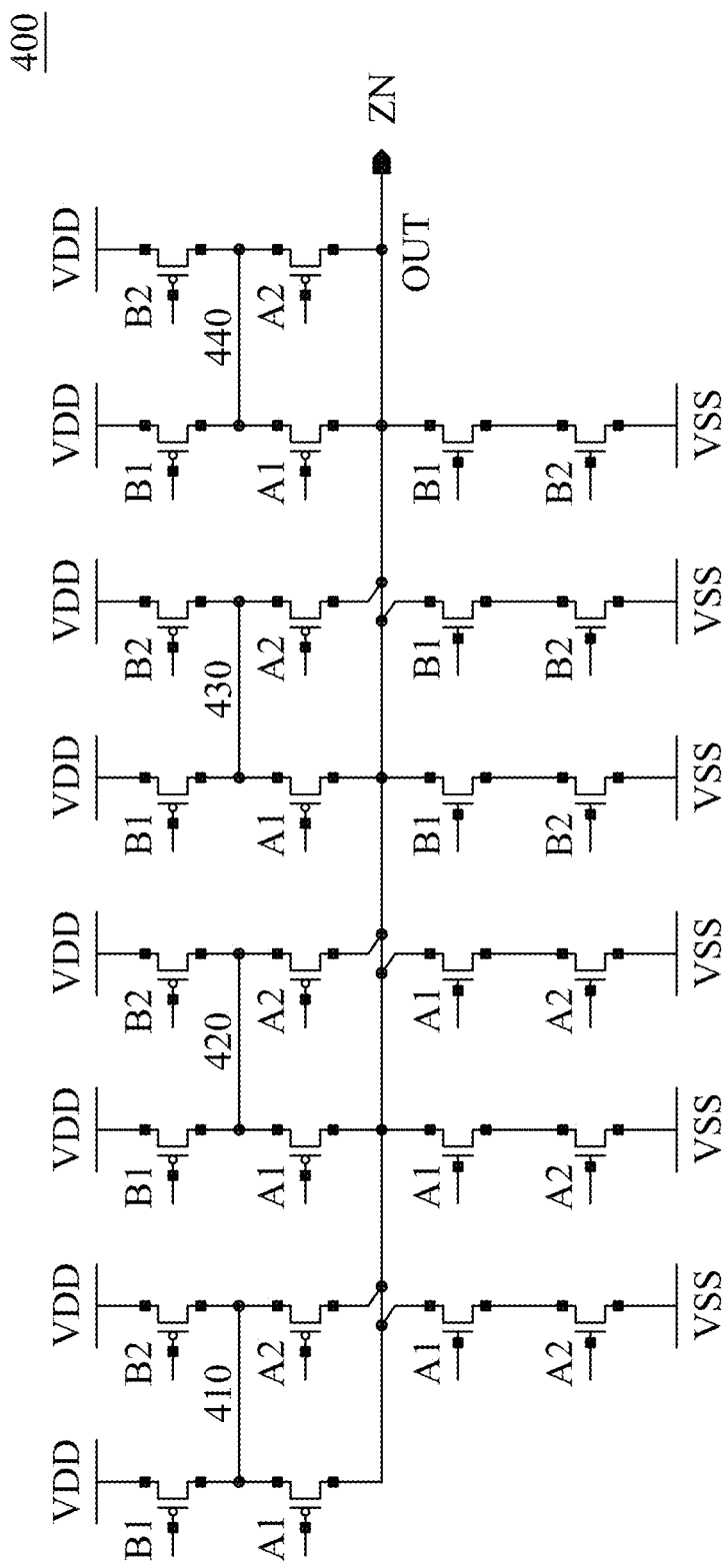
FIG. 4A is a schematic diagram of an IC logic device, in accordance with some embodiments.

Device 400 depicted in FIG. 4A is a non-limiting example of pull-up configuration 100A in which the pull-up transistors include a total of eight PMOS transistors in row R1 configured to receive input signals B1 and B2 and a total of eight PMOS transistors in row R2 configured to receive input signals A1 and A2, and the pull-down transistors include a total of six NMOS transistors in row R1 configured to receive input signals B1 and B2, and a total of six NMOS transistors in row R2 configured to receive input signals A1 and A2. Device 400 includes conductive paths 410-440 configured to electrically connect shared S/D terminals of pull-up transistors in row R1 to shared S/D terminals of pull-up transistors in row R2 as discussed below with respect to FIG. 4B, and is thereby configured as a skew cell AOI device capable of generating output signal ZN responsive to input signals A1, A2, B1, and B2. In some embodiments, device 400 is referred to as an AOI22SKRD4 device.

Figure 5A:
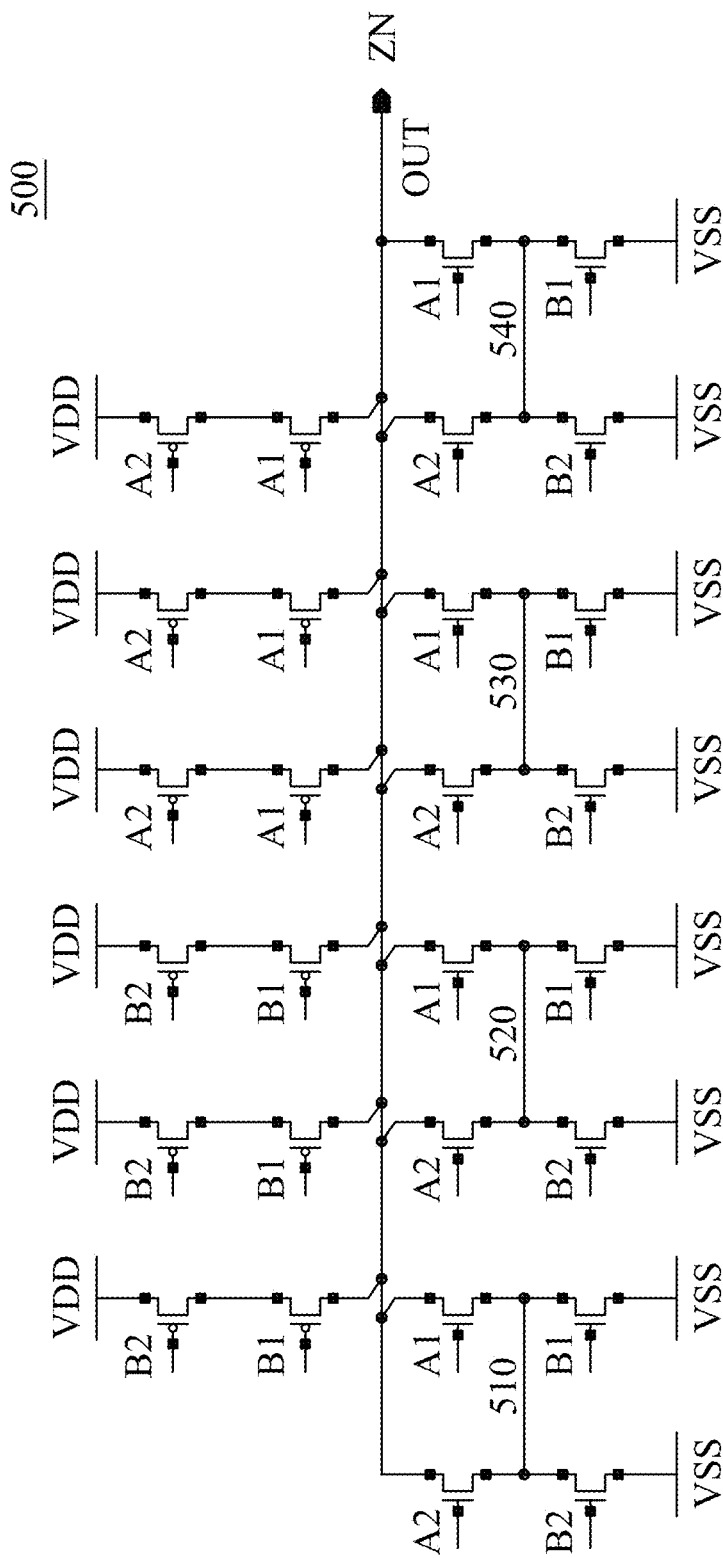
FIG. 5A is a schematic diagram of an IC logic device, in accordance with some embodiments.

Device 500 depicted in FIG. 5A is a non-limiting example of pull-down configuration 100B in which the pull-up transistors include a total of six PMOS transistors in row R1 configured to receive input signals B1 and B2 and a total of six PMOS transistors in row R2 configured to receive input signals A1 and A2, and the pull-down transistors include a total of eight NMOS transistors in row R1 configured to receive input signals B1 and B2, and a total of eight NMOS transistors in row R2 configured to receive input signals A1 and A2. Device 500 includes conductive paths 510-540 configured to electrically connect shared S/D terminals of pull-down transistors in row R1 to shared S/D terminals of pull-down transistors in row R2 as discussed below with respect to FIG. 5B, and is thereby configured as a skew cell OAI device capable of generating output signal ZN responsive to input signals A1, A2, B1, and B2. In some embodiments, device 500 is referred to as an OAI22SKFD4 device.

Figure 6A:
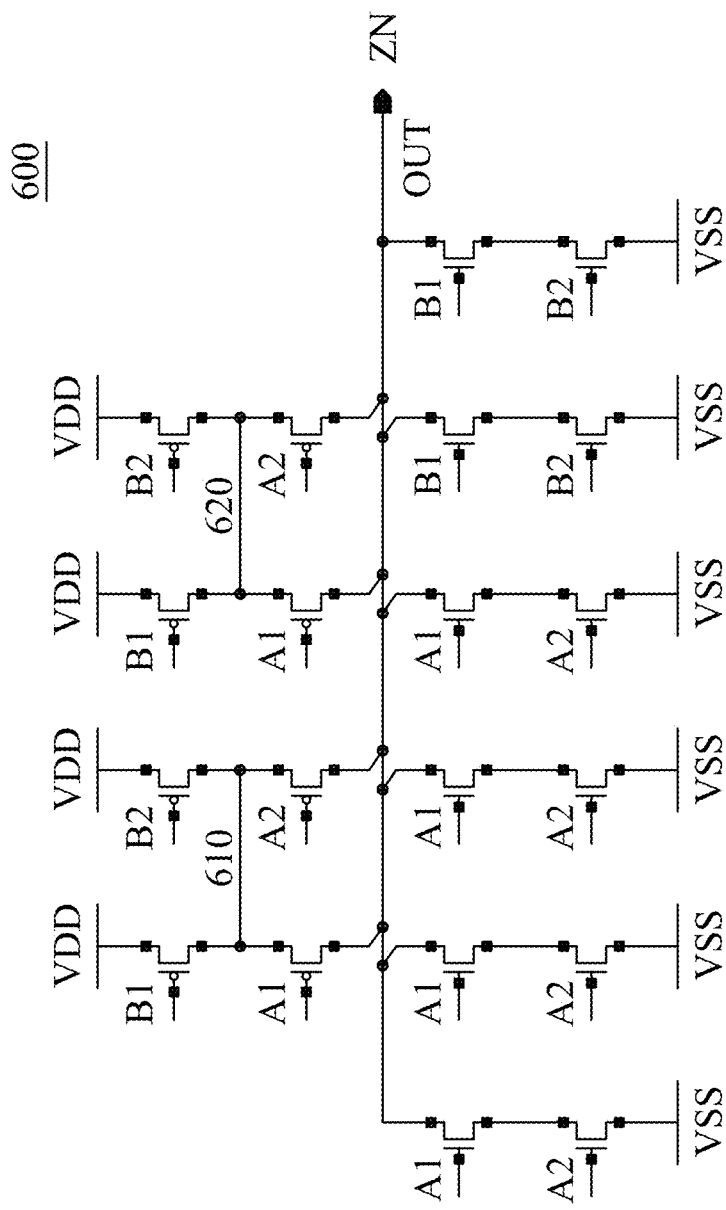
FIG. 6A is a schematic diagram of an IC logic device, in accordance with some embodiments.

Device 600 depicted in FIG. 6A is a non-limiting example of pull-up configuration 100A in which the pull-up transistors include a total of four PMOS transistors in row R1 configured to receive input signals B1 and B2 and a total of four PMOS transistors in row R2 configured to receive input signals A1 and A2, and the pull-down transistors include a total of four NMOS transistors in row R1 configured to receive input signals B1 and B2, and a total of eight NMOS transistors in row R2 configured to receive input signals A1 and A2. Device 600 includes conductive paths 610 and 620 configured to electrically connect shared S/D terminals of pull-up transistors in row R1 to shared S/D terminals of pull-up transistors in row R2 as discussed below with respect to FIG. 6B, and is thereby configured as an AOI device capable of generating output signal ZN responsive to input signals A1, A2, B1, and B2. In some embodiments, device 600 is referred to as an AOI22OPTPAD4 device.

Figure 7A:
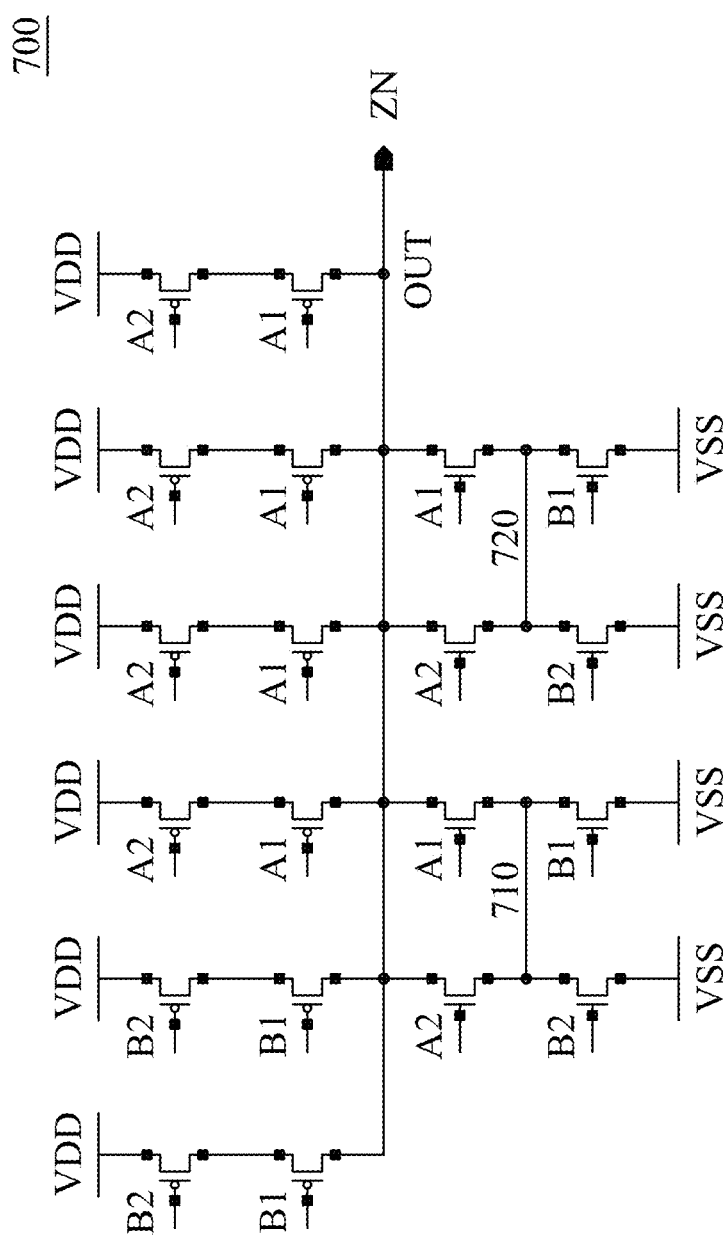
FIG. 7A is a schematic diagram of an IC logic device, in accordance with some embodiments.

Device 700 depicted in FIG. 7A is a non-limiting example of pull-down configuration 100B in which the pull-up transistors include a total of four PMOS transistors in row R1 configured to receive input signals B1 and B2 and a total of eight PMOS transistors in row R2 configured to receive input signals A1 and A2, and the pull-down transistors include a total of four NMOS transistors in row R1 configured to receive input signals B1 and B2, and a total of four NMOS transistors in row R2 configured to receive input signals A1 and A2. Device 700 includes conductive paths 710 and 720 configured to electrically connect shared S/D terminals of pull-down transistors in row R1 to shared S/D terminals of pull-down transistors in row R2 as discussed below with respect to FIG. 7B, and is thereby configured as an OAI device capable of generating output signal ZN responsive to input signals A1, A2, B1, and B2. In some embodiments, device 700 is referred to as an OAI22OPTPAD4 device.

Figure 8A:
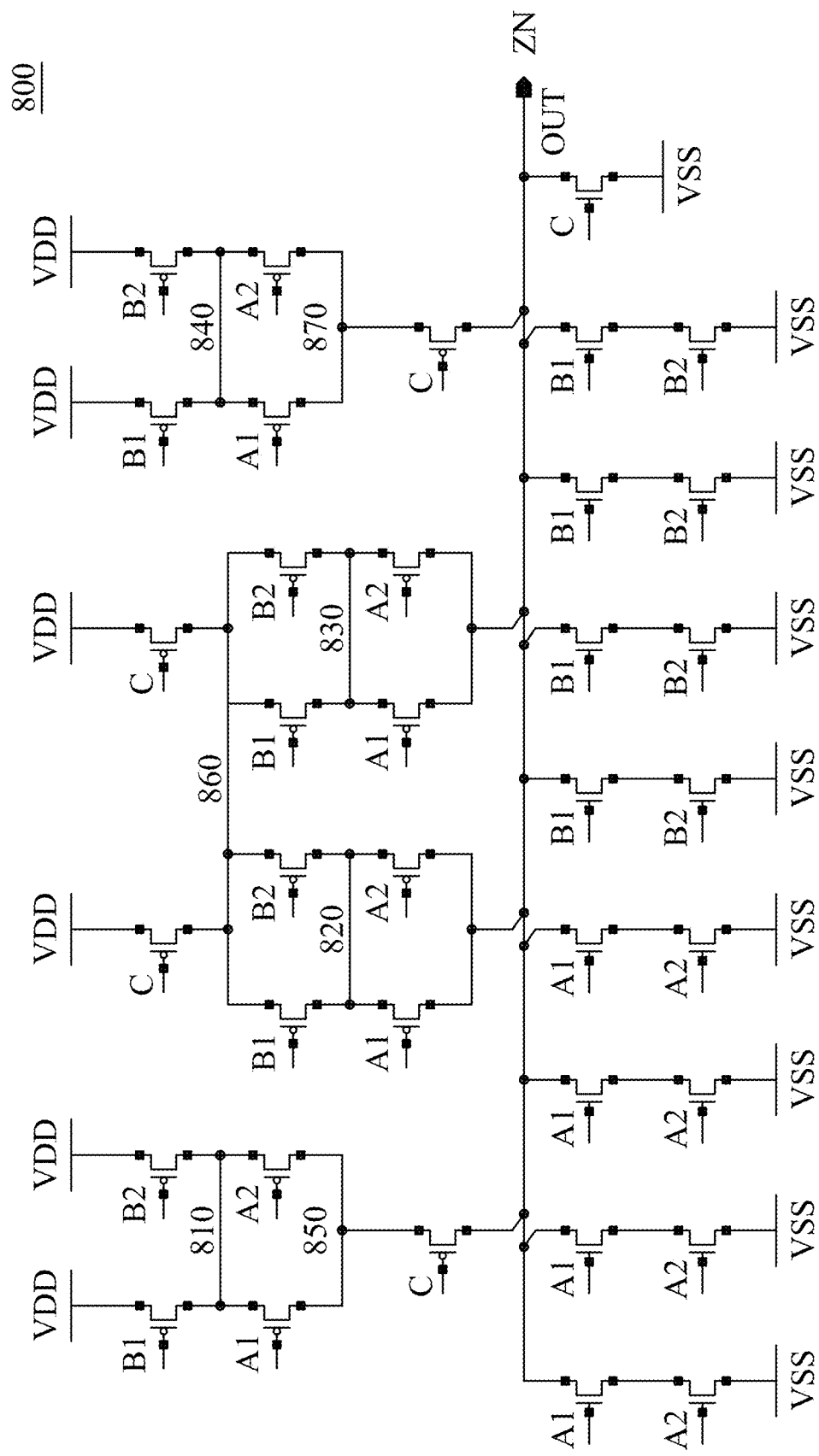
FIG. 8A is a schematic diagram of an IC logic device, in accordance with some embodiments.

Device 800 depicted in FIG. 8A is a non-limiting example of pull-up configuration 100A in which the pull-up transistors include a total of ten PMOS transistors in row R1 configured to receive input signals B1, B2, and C, and a total of ten PMOS transistors in row R2 configured to receive input signals A1, A2, and C, and the pull-down transistors include a total of nine NMOS transistors in row R1 configured to receive input signals B1, B2, and C, and a total of nine NMOS transistors in row R2 configured to receive input signals A1, A2, and C. Device 800 includes conductive paths 810-870 of which paths 810-840 are configured to electrically connect shared S/D terminals of pull-up transistors in row R1 to shared S/D terminals of pull-up transistors in row R2 as discussed below with respect to FIG. 8B, and is thereby configured as an AOI device capable of generating output signal ZN responsive to input signals A1, A2, B1, B2, and C. In some embodiments, device 800 is referred to as an AOI221D4 device.

Figure 9A:
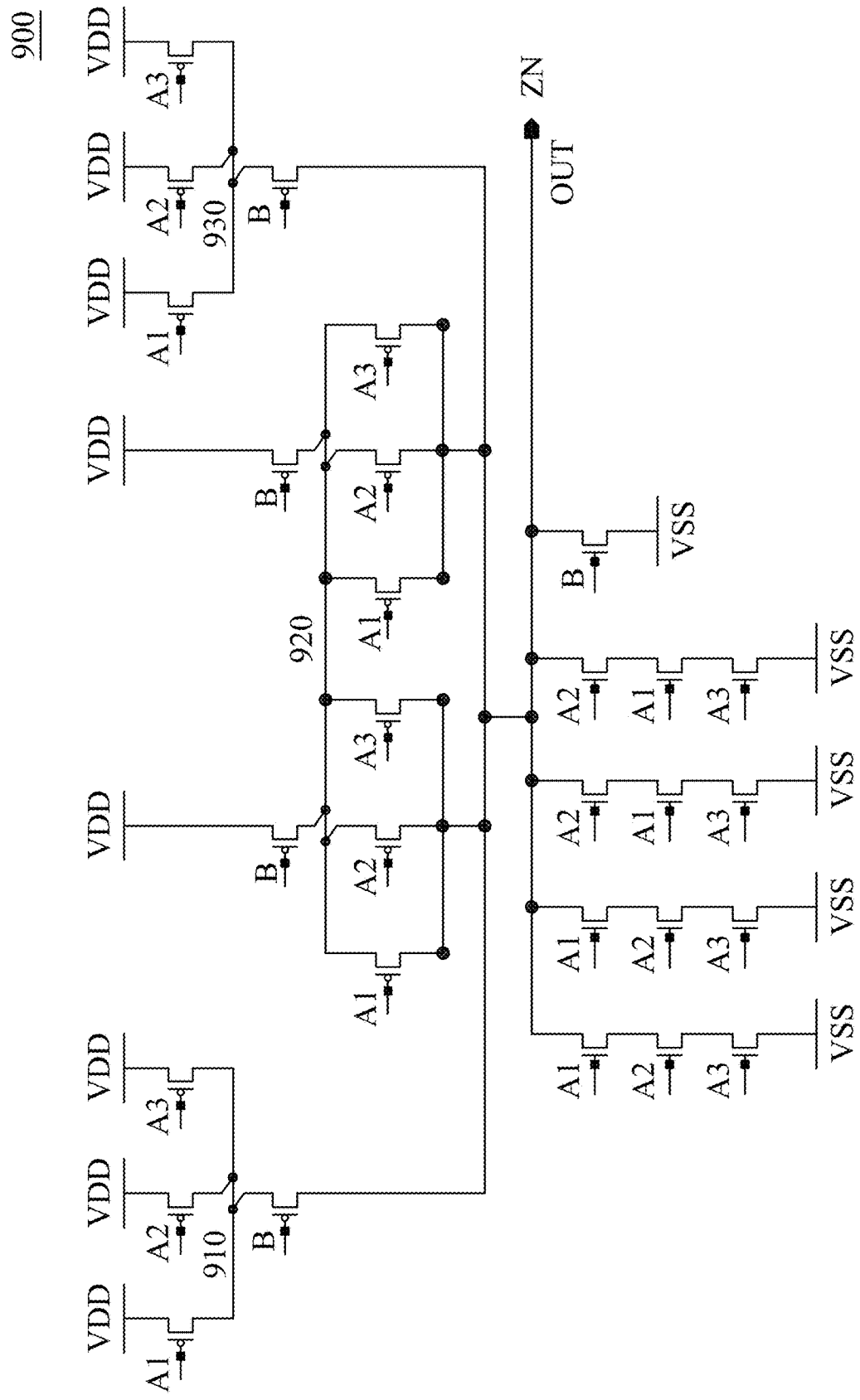
FIG. 9A is a schematic diagram of an IC logic device, in accordance with some embodiments.

Device 900 depicted in FIG. 9A is a non-limiting example of pull-up configuration 100A in which the pull-up transistors include a total of eight PMOS transistors in row R1 configured to receive input signals A1-A3 and B and a total of eight PMOS transistors in row R2 configured to receive input signals A1-A3 and B, and the pull-down transistors include a total of seven NMOS transistors in row R1 configured to receive input signals A1-A3 and B, and a total of seven NMOS transistors in row R2 configured to receive input signals A1-A3 and B. Device 900 includes conductive paths 910-930 configured to electrically connect shared S/D terminals of pull-up transistors in row R1 to shared S/D terminals of pull-up transistors in row R2 as discussed below with respect to FIG. 9B, and is thereby configured as an AOI device capable of generating output signal ZN responsive to input signals A1-A3 and B. In some embodiments, device 900 is referred to as an AOI31D4 device.

Figure 10A:
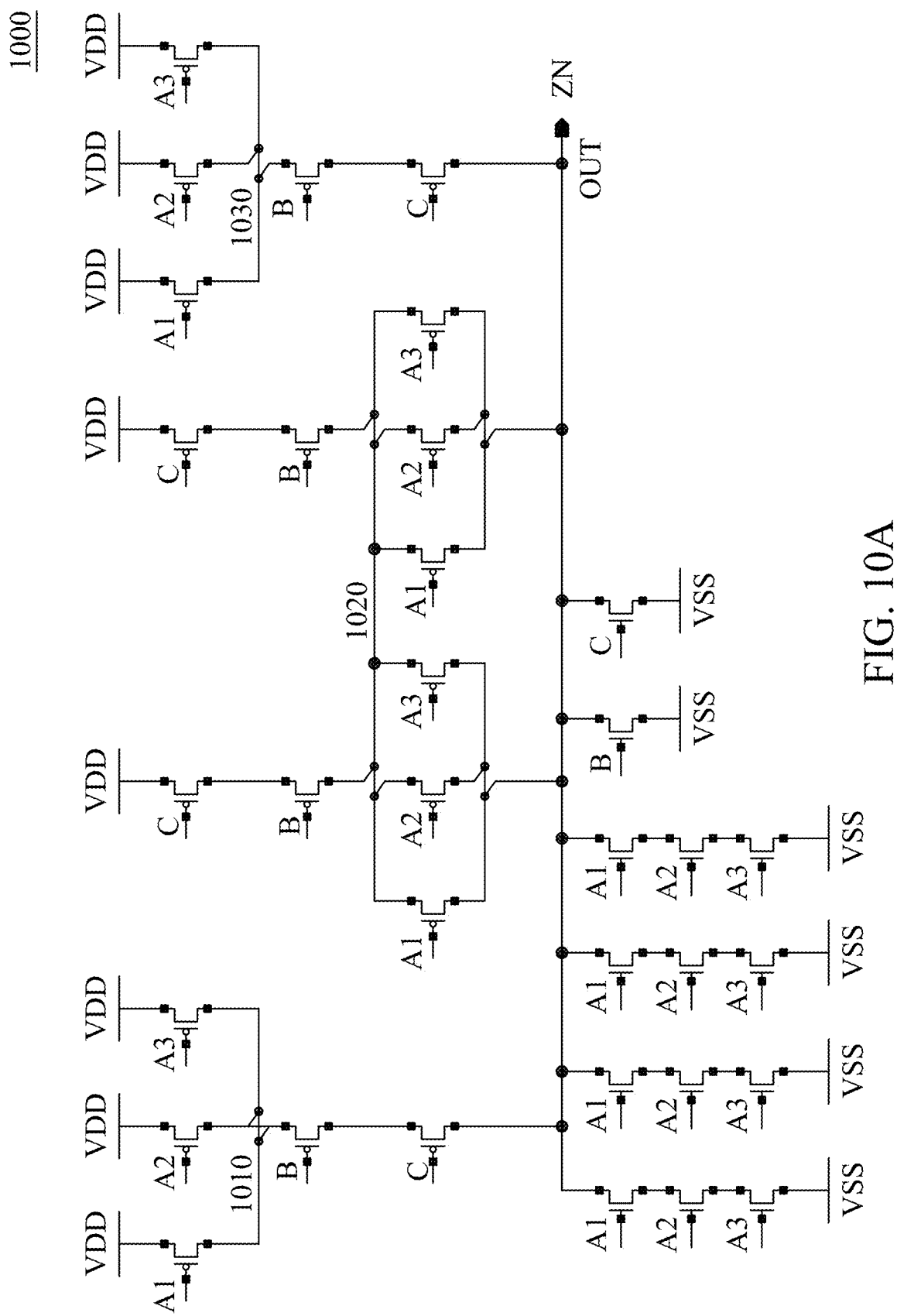
FIG. 10A is a schematic diagram of an IC logic device, in accordance with some embodiments.

Device 1000 depicted in FIG. 10A is a non-limiting example of pull-up configuration 100A in which the pull-up transistors include a total of ten PMOS transistors in row R1 configured to receive input signals A1-A3, B, and C, and a total of ten PMOS transistors in row R2 configured to receive input signals A1-A3, B, and C, and the pull-down transistors include a total of eight NMOS transistors in row R1 configured to receive input signals A1-A3, B, and C, and a total of eight NMOS transistors in row R2 configured to receive input signals A1-A3, B, and C. Device 1000 includes conductive paths 1010-1030 configured to electrically connect shared S/D terminals of pull-up transistors in row R1 to shared S/D terminals of pull-up transistors in row R2 as discussed below with respect to FIG. 10B, and is thereby configured as an AOI device capable of generating output signal ZN responsive to input signals A1-A3, B, and C. In some embodiments, device 1000 is referred to as an AOI311D4 device.

Figure 11A:
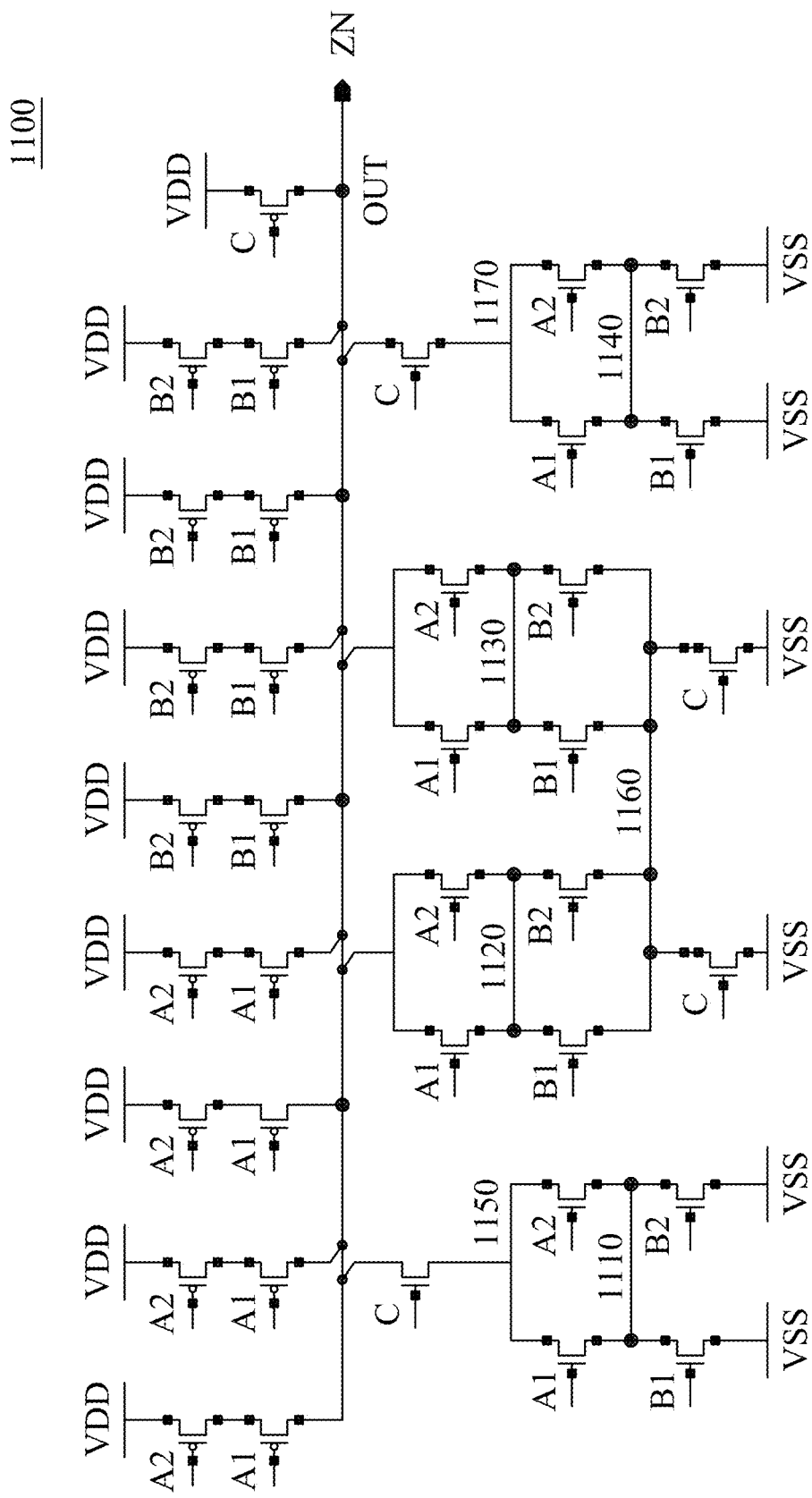
FIG. 11A is a schematic diagram of an IC logic device, in accordance with some embodiments.

Device 1100 depicted in FIG. 11A is a non-limiting example of pull-down configuration 100B in which the pull-up transistors include a total of nine PMOS transistors in row R1 configured to receive input signals B1, B2, and C, and a total of nine PMOS transistors in row R2 configured to receive input signals A1, A2, and C, and the pull-down transistors include a total of ten NMOS transistors in row R1 configured to receive input signals B1, B2, and C, and a total of ten NMOS transistors in row R2 configured to receive input signals A1, A2, and C. Device 1100 includes conductive paths 1110-1170 of which paths 1110-1140 are configured to electrically connect shared S/D terminals of pull-down transistors in row R1 to shared S/D terminals of pull-down transistors in row R2 as discussed below with respect to FIG. 11B, and is thereby configured as an OAI device capable of generating output signal ZN responsive to input signals A1, A2, B1, B2, and C. In some embodiments, device 1100 is referred to as an OAI221D4 device.

Figure 12A:
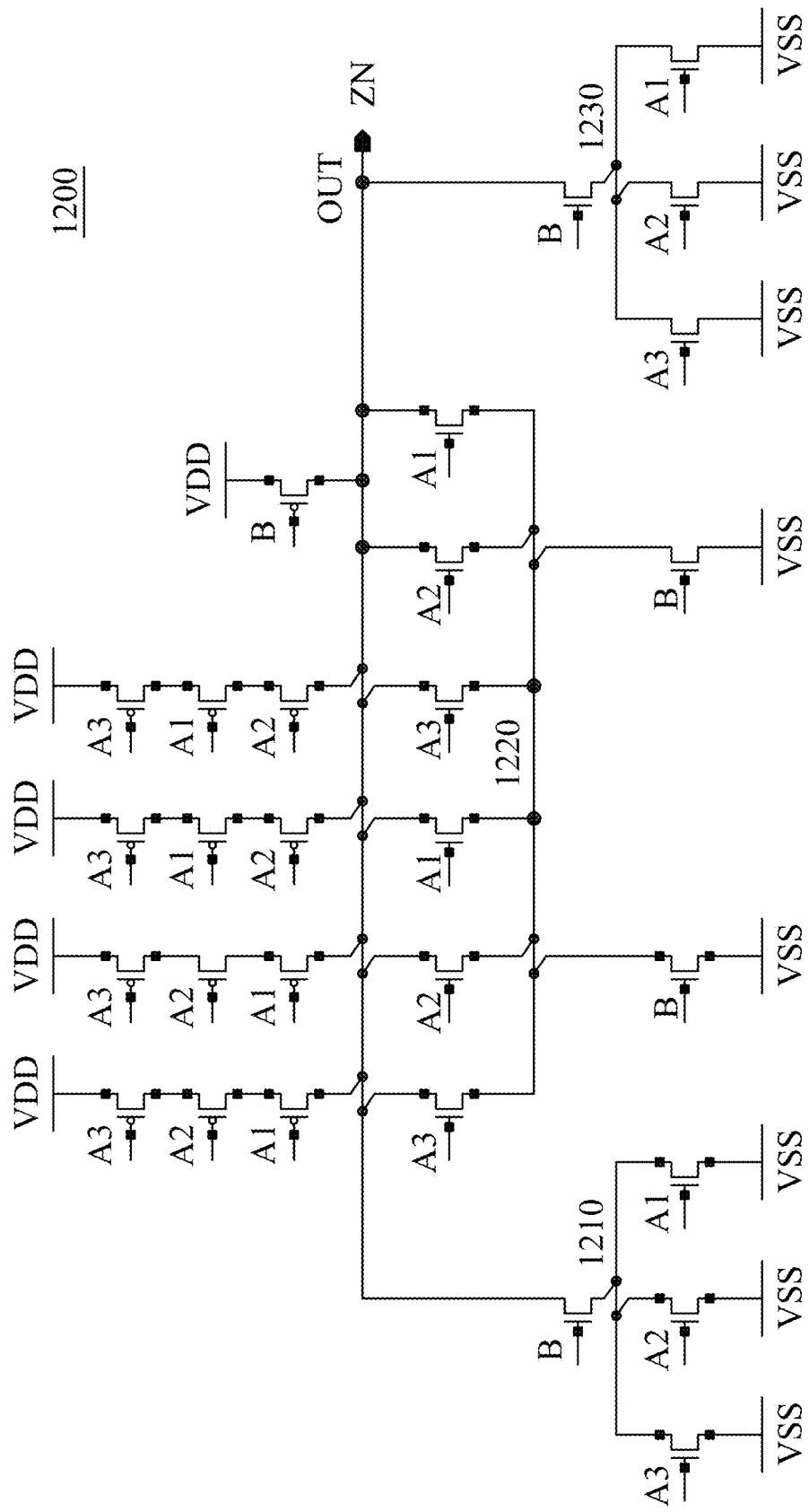
FIG. 12A is a schematic diagram of an IC logic device, in accordance with some embodiments.

Device 1200 depicted in FIG. 12A is a non-limiting example of pull-down configuration 100B in which the pull-up transistors include a total of seven PMOS transistors in row R1 configured to receive input signals A1-A3 and B and a total of seven PMOS transistors in row R2 configured to receive input signals A1-A3 and B, and the pull-down transistors include a total of eight NMOS transistors in row R1 configured to receive input signals A1-A3 and B, and a total of eight NMOS transistors in row R2 configured to receive input signals A1-A3 and B. Device 1200 includes conductive paths 1210-1230 configured to electrically connect shared S/D terminals of pull-down transistors in row R1 to shared S/D terminals of pull-down transistors in row R2 as discussed below with respect to FIG. 12B, and is thereby configured as an OAI device capable of generating output signal ZN responsive to input signals A1-A3 and B. In some embodiments, device 1200 is referred to as an OAI31D4 device.

Figure 13A:
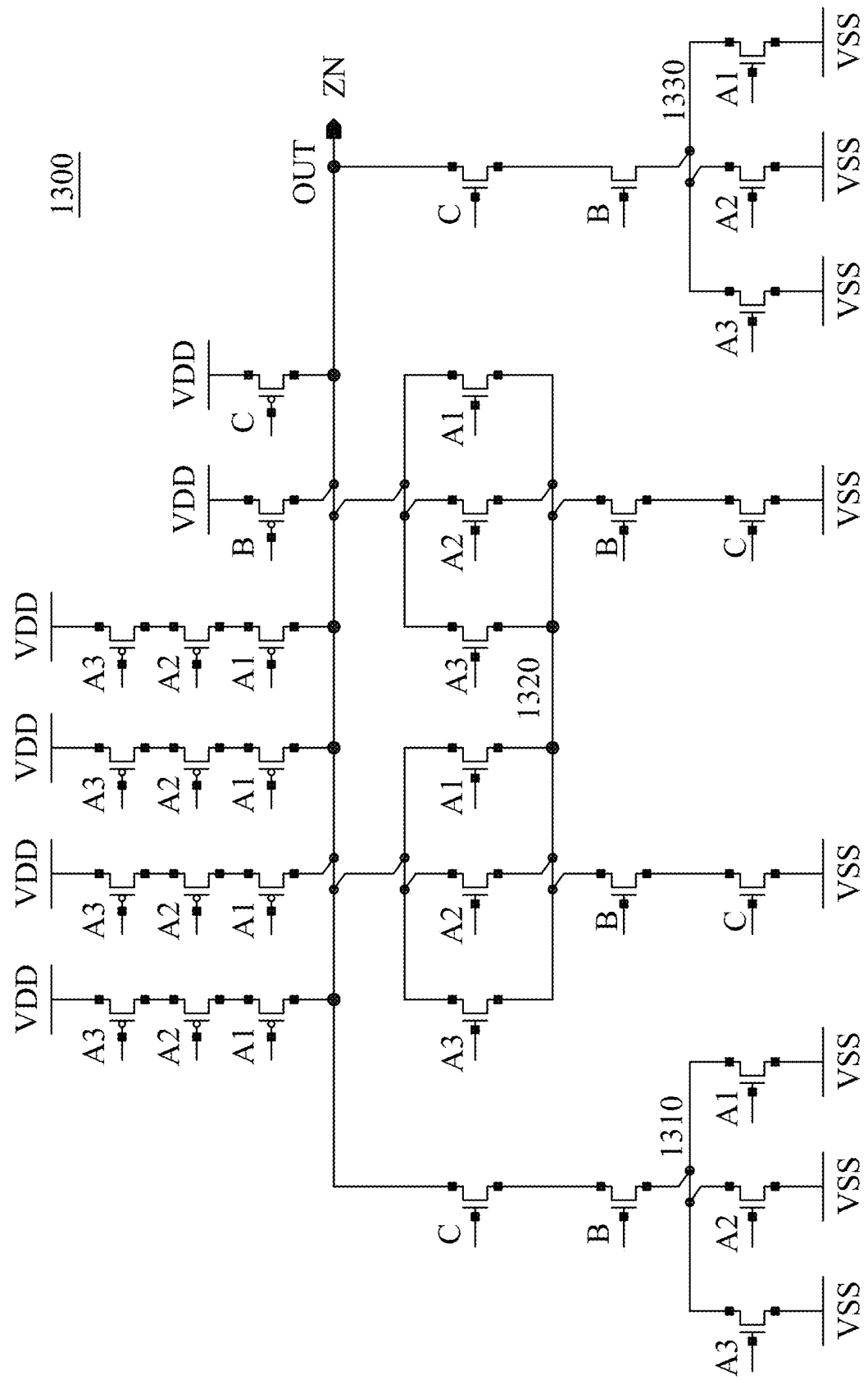
FIG. 13A is a schematic diagram of an IC logic device, in accordance with some embodiments.

Device 1300 depicted in FIG. 13A is a non-limiting example of pull-down configuration 100B in which the pull-up transistors include a total of eight PMOS transistors in row R1 configured to receive input signals A1-A3, B, and C, and a total of eight PMOS transistors in row R2 configured to receive input signals A1-A3, B, and C, and the pull-down transistors include a total of ten NMOS transistors in row R1 configured to receive input signals A1-A3, B, and C, and a total of ten NMOS transistors in row R2 configured to receive input signals A1-A3, B, and C. Device 1300 includes conductive paths 1310-1330 configured to electrically connect shared S/D terminals of pull-down transistors in row R1 to shared S/D terminals of pull-down transistors in row R2 as discussed below with respect to FIG. 13B, and is thereby configured as an OAI device capable of generating output signal ZN responsive to input signals A1-A3, B, and C. In some embodiments, device 1300 is referred to as an OAI311D4 device.

Figure 2B:
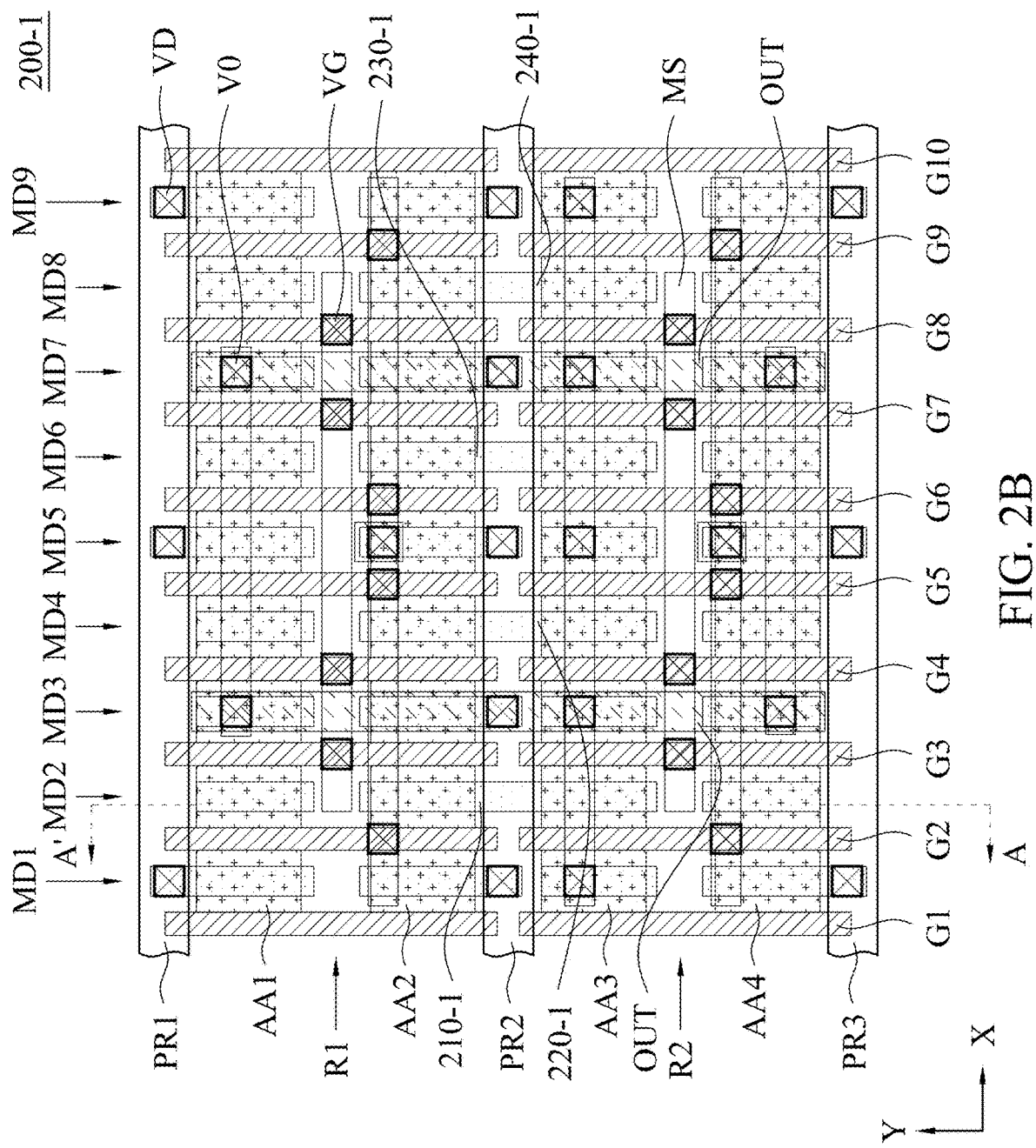
FIG. 2B is a plan view of an IC layout diagram and corresponding IC logic device, in accordance with some embodiments.

FIGS. 2B, 2C, and 3B-13B are plan views of respective IC layout diagrams/devices 200-1, 200-2, and 300-1300 (including the X and Y directions) corresponding to the schematic diagrams depicted in FIGS. 2A-13A, in accordance with some embodiments. FIG. 2D is a cross-sectional view of IC layout diagram/device 200-1 in a Y-Z plane indicated by a line A-A' depicted in FIG. 2B, and FIG. 2E is a cross-sectional view of IC layout diagram/device 200-2 in a Y-Z plane indicated by a line B-B' depicted in FIG. 2C. The cross-sections depicted in FIGS. 2D and 2E are non-limiting examples provided to illustrate a conductive segment extending across a middle power rail.

As depicted in FIGS. 2B-2E and 3B-13B, each diagram/device 200-1, 200-2, and 300-1300 includes active regions/areas AA1-AA4 extending in the X direction in a semiconductor substrate SUB (labelled in FIGS. 2D and 2E only), some or all of pluralities of metal-like defined (MD) regions/segments MD1-MD13 extending in the Y direction, some or all of pluralities of gate regions/structures G1-G14 extending in the Y direction, and power rails PR1-PR3. Active regions/areas AA1 and AA2 are positioned between power rails PR1 and PR2 in row R1, and active regions/areas AA3 and AA4 are positioned between power rails PR2 and PR3 in row R2. The MD regions/segments of each of plurality of MD regions/segments MD1-MD13 and the gate regions/structures of each of plurality of gate regions/structures G1-G14 are aligned along the Y direction.

Locations at which MD regions/segments of plurality of MD regions/segments MD1-MD13 overlap/overlie active regions/areas AA1-AA4 correspond to S/D structures of one or more transistors that include adjacent portions of the gate regions/structures of plurality of gate regions/structures G1-G14. The locations and transistors are not individually labelled in FIGS. 2B-2E and 3B-13B for the purpose of clarity.

Each diagram/device 200-1, 200-2, and 300-1300 also includes instances of metal regions/segments MS extending in the X and Y directions and instances of vias VD, VG, and V0, a single one of each being labelled for the purpose of clarity. The arrangements of the referenced features in accordance with the various embodiments are discussed below with respect to FIGS. 2B-2E and 3B-13B.

An active region/area, e.g., active region/area AA1-AA4, is a region in the IC layout diagram included in the manufacturing process as part of defining an active area, also referred to as an oxide diffusion or definition (OD), in the semiconductor substrate, either directly or in an n-well or p-well region/area (not shown for the purpose of clarity), in which one or more IC device features, e.g., a S/D structure, is formed. In some embodiments, an active area is an n-type or p-type active area of a planar transistor, a fin field-effect transistor (FinFET), or a gate-all-around (GAA) transistor. In various embodiments, an active area (structure) includes one or more of a semiconductor material, e.g., silicon (Si), silicon-germanium (SiGe), silicon-carbide (SiC), or the like, a dopant material, e.g., boron (B), phosphorous (P), arsenic (As), gallium (Ga), or another suitable material.

In some embodiments, an active area is a region in an IC layout diagram included in the manufacturing process as part of defining a nano-sheet structure, e.g., a continuous volume of one or more layers of one or more semiconductor materials having either n-type or p-type doping. In various embodiments, individual nano-sheet layers include a single monolayer or multiple monolayers of a given semiconductor material.

In the embodiments depicted in FIGS. 2B-2E and 3B-13B, either active regions/areas AA1 and AA4 are n-type active regions/areas adjacent to respective power rails PR1 and PR3 configured to carry power supply reference voltage VSS and active regions/areas AA2 and AA3 are p-type active regions/areas adjacent to power rail PR2 configured to carry power supply voltage VDD, or active regions/areas AA1 and AA4 are p-type active regions/areas adjacent to respective power rails PR1 and PR3 configured to carry power supply voltage VDD and active regions/areas AA2 and AA3 are n-type active regions/areas adjacent to power rail PR2 configured to carry power supply reference voltage VSS.

An MD region/segment, e.g., a region/segment of one of pluralities of MD regions/segments MD1-MD13, is a conductive region in the IC layout diagram included in the manufacturing process as part of defining an MD segment, also referred to as a conductive segment or MD conductive line or trace, in and/or on the semiconductor substrate. In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., the first metal layer. In various embodiments, an MD segment includes one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In various embodiments, an MD segment includes a section of the semiconductor substrate and/or an epitaxial layer having a doping level, e.g., based on an implantation process, sufficient to cause the segment to have the low resistance level. In various embodiments, a doped MD segment includes one or more dopant materials having doping concentrations of about $1*10^{16}$ per cubic centimeter ($cm^{-3}$) or greater.

In some embodiments, a manufacturing process includes two MD layers, and the MD regions/segments of pluralities of MD regions/segments MD1-MD13 refer to either of the two MD layers in the manufacturing process.

In the embodiments depicted in FIGS. 2B-2E and 3B-13B, each MD region/segment of pluralities of MD regions/segments MD1-MD13 overlaps one or more of active regions/areas AA1-AA4. In various embodiments, one or more MD segments, e.g., some or all of pluralities of MD segments MD1-MD13, abuts or includes some or all of one or more S/D structures in the corresponding one or more active areas.

The MD regions/segments of pluralities of MD regions/segments MD1-MD13 have configurations along the Y direction in accordance with cut-MD regions (not depicted for the purpose of clarity), also referred to as cut-metal regions in some embodiments. A cut-MD region is a region in the IC layout diagram included in the manufacturing process as part of defining a discontinuity in a given MD segment, thereby electrically isolating the corresponding adjacent MD segments from each other.

A gate region/structure, e.g., a gate region/structure of pluralities of gate regions/structures G1-G14, is a region in the IC layout diagram included in the manufacturing process as part of defining a gate structure. A gate structure is a volume including one or more conductive segments, e.g., a gate electrode, including one or more conductive materials, e.g., polysilicon, copper (Cu), aluminum (Al), tungsten (W), cobalt (Co), ruthenium (Ru), or one or more other metals or other suitable materials, substantially surrounded by one or more insulating materials, the one or more conductive segments thereby being configured to control a voltage provided to an adjacent gate dielectric layer.

A dielectric layer, e.g., a gate dielectric layer, is a volume including one or more insulating materials, e.g., silicon dioxide, silicon nitride ($Si_3N_4$), and/or one or more other suitable material such as a low-k material having a k value less than 3.8 or a high-k material having a k value greater than 3.8 or 7.0 such as aluminum oxide ($Al_2O_3$), hafnium oxide ($HfO_2$), tantalum pentoxide ($Ta_2O_5$), or titanium oxide ($TiO_2$), suitable for providing a high electrical resistance between IC structure elements, i.e., a resistance level above a predetermined threshold corresponding to one or more tolerance levels of a resistance-based effect on circuit performance.

Pluralities of gate regions/structures G1-G14 have configurations along the Y direction in accordance with cut-gate regions (not depicted for the purpose of clarity), also referred to as cut-poly regions in some embodiments. A cut-gate region is a region in the IC layout diagram included in the manufacturing process as part of defining a discontinuity in the gate electrode of a given gate structure, thereby electrically isolating the corresponding adjacent portions of the gate electrode from each other.

In the embodiments depicted in FIGS. 2B-2E and 3B-13B, each of plurality of gate regions/structures G1 and the highest numbered one of pluralities of gate regions/structures G1-G14, e.g., plurality of gate regions/structures G10, G12, or G14, includes a first gate region/structure having endpoints overlapping/underlying power rails PR1 and PR2, and a second gate region/structure having endpoints overlapping/underlying power rails PR2 and PR3. The corresponding gate regions/structures, also referred to as dummy gate regions/structures in some embodiments, are not included in active circuits and delineate boundaries of diagrams/devices 200-1, 200-2, and 300-1300 along the Y direction.

In some embodiments, one or both of plurality of gate regions/structures G1 and the highest numbered one of pluralities of gate regions/structures G1-G14 is otherwise configured so as to delineate boundaries of diagrams/devices 200-1, 200-2, and 300-1300 along the Y direction, e.g., by including a single region/segment having endpoints overlapping/underlying power rails PR1 and PR3 or by including more than two regions/segments extending between power rails PR1 and PR3.

Metal regions/segments MS are instances of regions in the IC layout diagram included in the manufacturing process as part of defining metal segments extending in the X or Y direction in a given metal layer of the manufacturing process. In the embodiments depicted in FIGS. 2B-2E and 3B-13B, metal regions/segments MS extend in the X direction in the first metal layer and metal regions/segments MS extend in the Y direction in the second metal layer, also referred to as a metal one layer in some embodiments. In some embodiments, metal regions/segments MS otherwise extend in the X and Y directions in the metal layers, e.g., by extending in the Y direction in the first metal layer and extending in the X direction in the second metal layer.

A via region/structure, e.g., a via region/structure VD, VG, or V0, is a region in the IC layout diagram included in the manufacturing process as part of defining a via structure including one or more conductive materials configured to provide an electrical connection between an overlying conductive structure, e.g., a power rail PR1-PR3 or metal segment MS, and an underlying conductive structure. The underlying conductive structure corresponds to an MD segment or S/D structure in the case of a via region/structure VD, a gate electrode in the case of a via region/structure VG, and a first metal layer region/segment, e.g., metal region/segment MS, in the case of a via region/structure V0.

As depicted in FIGS. 2B-2E and 3B-13B, each diagram/device 200-1, 200-2, and 300-1300 includes instances of MD regions/segments of pluralities of MD regions/segments MD1-MD13 that overlap/overlie one of active regions/areas AA1, AA2, or AA4 and overlap/underlie a respective one of power rails PR1-PR3 at a location corresponding to an instance of via region/structure VD. Each such location thereby depicts an electrical connection between a S/D structure in the corresponding active area AA1, AA2, or AA4 and the adjacent power rail PR1-PR3.

Each diagram/device 200-1, 200-2, and 300-1300 further includes instances of metal regions/segments MS extending in the X direction in the first metal layer in each of rows R1 and R2 and overlapping/overlying one or more MD regions/segments of pluralities of MD regions/segments MD1-MD13 at locations corresponding to instances of via region/structure VD, each such location thereby depicting an electrical connection between a S/D structure in the corresponding active area AA1-AA4 and the overlying instance of metal region/segment MS Each diagram/device 200-1, 200-2, and 300-1300 further includes instances of metal regions/segments MS extending in the X direction in the first metal layer in each of rows R1 and R2 and overlapping/overlying one or more gate regions/structures of pluralities of gate regions/structures G1-G14 at locations corresponding to instances of via region/structure VG, each such location thereby depicting an electrical connection between the corresponding gate structure and the overlying instance of metal region/segment MS.

Each diagram/device 200-1, 200-2, and 300-1300 further includes instances of metal regions/segments MS extending in the Y direction in the second metal layer and overlapping/overlying one or more of the instances of metal regions/segments MS in the first metal layer at locations corresponding to instances of via region/structure V0, each such location thereby depicting an electrical connection between the corresponding instances of metal region/segment MS in the first and second metal layers. As depicted in each of FIGS. 2B, 2C, and 3B-13B, at least one such instance of metal region/segment MS in the second metal layer corresponds to output terminal OUT.

Active areas AA1-AA4, pluralities of MD regions/segments MD1-MD13 and gate regions/structures G1-G14, and the instances of metal regions/segments MS and via regions/structures VD, VG, and V0 are thereby configured as a plurality of pull-up and pull-down transistors in accordance with the schematic diagrams depicted in FIGS. 2A-13A and further in accordance with each corresponding diagram/device depicted in FIGS. 2B-2E and 3B-13B, as discussed below.

Figure 2C:
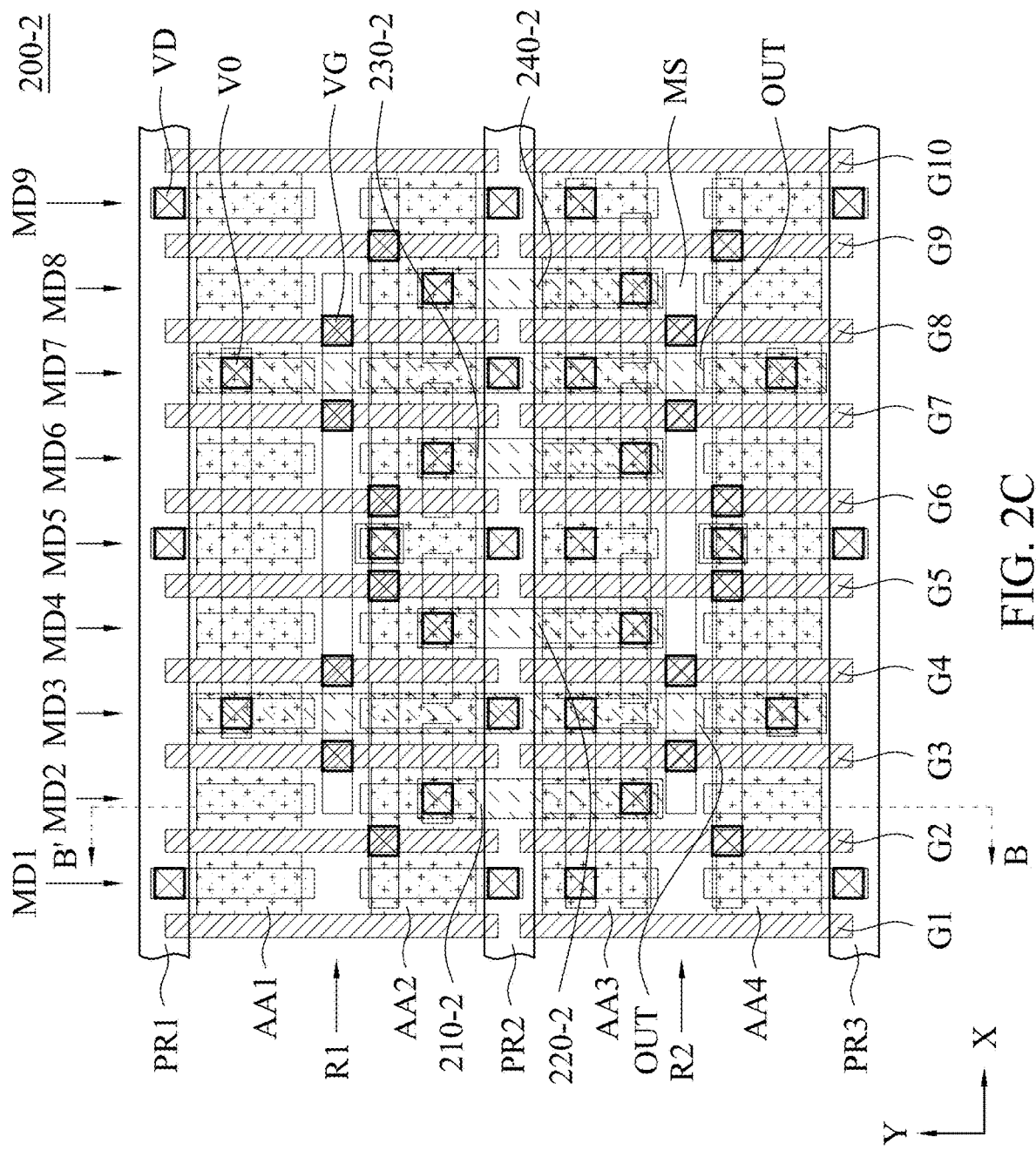
FIG. 2C is a plan view of an IC layout diagram and corresponding IC logic device, in accordance with some embodiments.

Each of diagram/device 200-1 depicted in FIGS. 2B and 2D and diagram/device 200-2 depicted in FIGS. 2C and 2E includes n-type active regions/areas AA1 and AA4 adjacent to respective power rails PR1 and PR3 configured to carry power supply reference voltage VSS, p-type active regions/areas AA2 and AA3 adjacent to power rail PR2 configured to carry power supply voltage VDD, pluralities of gate regions/structures G1-G10, and pluralities of MD regions/structures MD1-MD9. The instances of metal regions/segments MS extending in the Y direction and overlapping/overlying pluralities of MD regions/segments MD3 and MD7 are configured as output terminal OUT.

In diagram/device 200-1, pluralities of MD regions/segments MD2, MD4, MD6, and MD8 include respective MD regions/segments 210-1 through 240-1 that overlap/underlie power rail PR2 and overlap/overlie active regions/areas AA2 and AA3, thereby depicting electrical connections between corresponding S/D structures of active areas AA2 and AA3 through MD regions/segments 210-1 through 240-1, also referred to as conductive paths 210-1 through 240-1 in some embodiments. The features corresponding to conductive path 210-1 are depicted in the example cross-sectional view of FIG. 2D.

In diagram/device 200-2, instances of metal regions/segments MS, metal regions/segments 210-2 through 240-2, overlap/overlie power rail PR2 and each of active regions/areas AA2 and AA3 at locations corresponding to instances of via regions/structures VD and V0 and metal regions/segments MS extending in the X direction, thereby depicting electrical connections between corresponding S/D structures of active areas AA2 and AA3 through metal regions/segments 210-2 through 240-2, also referred to as conductive paths 210-2 through 240-2 in some embodiments. The features corresponding to conductive path 210-2 are depicted in the example cross-sectional view of FIG. 2E.

The portions of active region/area AA2 and pluralities of gate regions G2-G9 included in, and adjacent to, the corresponding S/D structures are configured as PMOS pull-up transistors in row R1 in which the gate structures are configured to receive input signals B1 and B2, and the portions of active region/area AA3 and pluralities of gate regions G2-G9 included in, and adjacent to, the corresponding S/D structures are configured as PMOS pull-up transistors in row R2 in which the gate structures are configured to receive input signals A1 and A2 as discussed above with respect to FIG. 2A. Portions of active regions/areas AA1 and AA4 and adjacent pluralities of gate regions G2-G9 are configured as NMOS pull-down transistors in respective rows R1 and R2 in which the gate structures are configured to receive respective input signals B1/B2 and A1/A2. MD regions/segments 210-1 through 240-1 and metal regions/segments MS 210-2 through 240-2 are thereby configured as conductive regions/segments of respective AOI devices 200-1 and 200-2 extending in the Y direction between rows R1 and R2 and across power rail PR2 in accordance with schematic diagram 200 depicted in FIG. 2A, whereby the benefits discussed above are capable of being obtained.

Figure 3B:
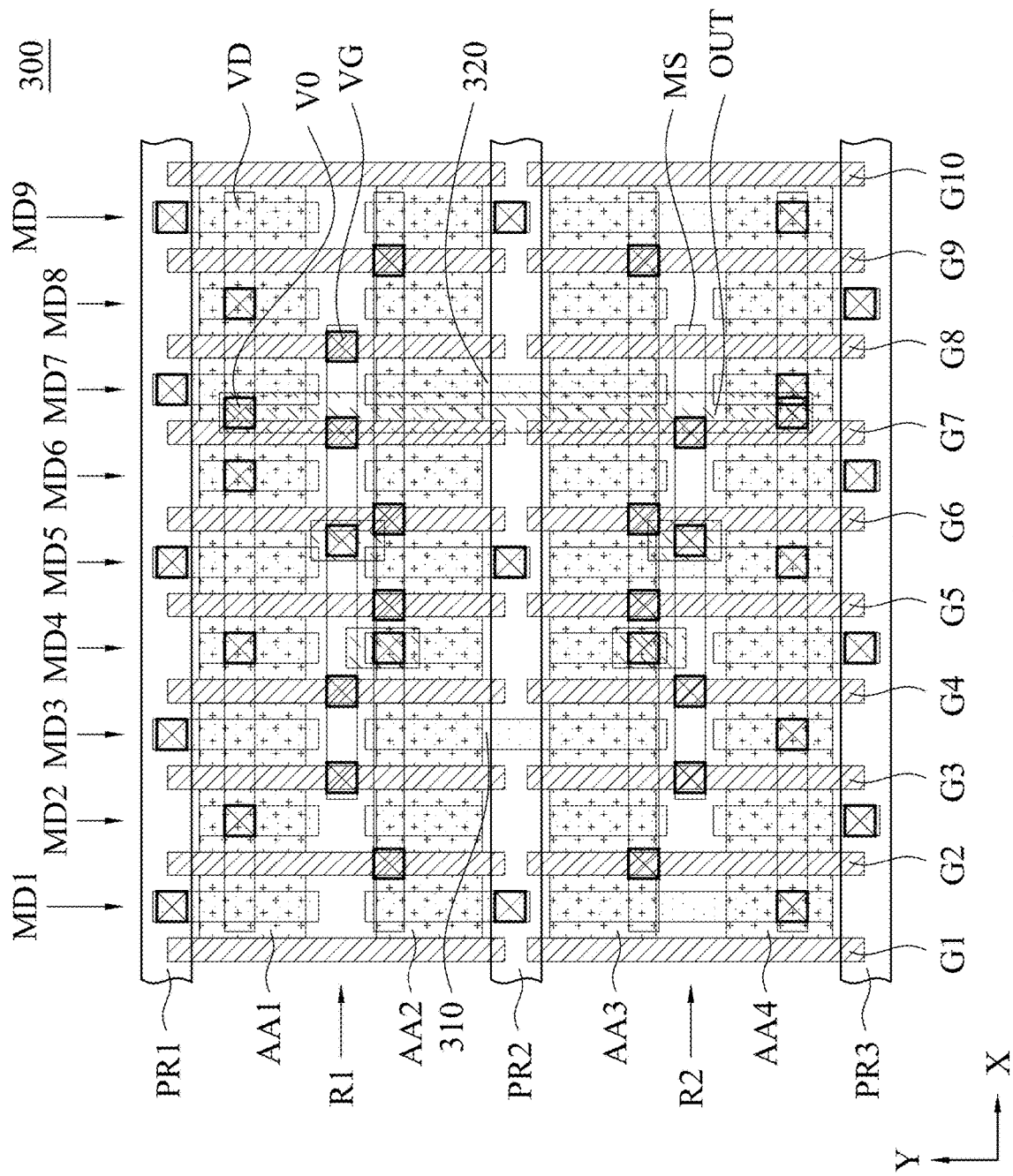
FIG. 3B is a plan view of an IC layout diagram and corresponding IC logic device, in accordance with some embodiments.

Diagram/device 300 depicted in FIG. 3B includes p-type active regions/areas AA1 and AA4 adjacent to respective power rails PR1 and PR3 configured to carry power supply voltage VDD, n-type active regions/areas AA2 and AA3 adjacent to power rail PR2 configured to carry power supply reference voltage VSS, pluralities of gate regions/structures G1-G10, and pluralities of MD regions/structures MD1-MD9. An instance of metal regions/segments MS extending in the Y direction and overlapping/overlying pluralities of gate regions/structures G7 and MD regions/segments MD7 is configured as output terminal OUT.

Pluralities of MD regions/segments MD3 and MD7 include respective MD regions/segments 310 and 320 that overlap/underlie power rail PR2 and overlap/overlie active regions/areas AA2 and AA3, thereby depicting electrical connections between corresponding S/D structures of active areas AA2 and AA3 through MD regions/segments 310 and 320, also referred to as conductive paths 310 and 320 in some embodiments.

The portions of active region/area AA2 and pluralities of gate regions G3, G4, G7, and G8 included in, and adjacent to, the corresponding S/D structures are configured as NMOS pull-down transistors in row R1 in which the gate structures are configured to receive input signal A3, and the portions of active region/area AA3 and pluralities of gate regions G3, G4, G7, and G8 included in, and adjacent to, the corresponding S/D structures are configured as NMOS pull-down transistors in row R2 in which the gate structures are configured to receive input signal A2 as discussed above with respect to FIG. 3A. Portions of active areas AA2 and AA3 and adjacent pluralities of gate regions/structures G2, G5, G6, and G9 are configured as NMOS pull-down transistors in respective rows R1 and R2 in which the gate structures are configured to receive respective input signals A4 and A1. Portions of active regions/areas AA1 and AA4 and adjacent pluralities of gate regions G2-G9 are configured as PMOS pull-up transistors in respective rows R1 and R2 in which the gate structures are configured to receive respective input signals A3/A4 and A1/A2. MD regions/segments 310 and 320 are thereby configured as conductive regions/segments of NAND device 300 extending in the Y direction between rows R1 and R2 and across power rail PR2 in accordance with the schematic diagram depicted in FIG. 3A, whereby the benefits discussed above are capable of being obtained.

Figure 4B:
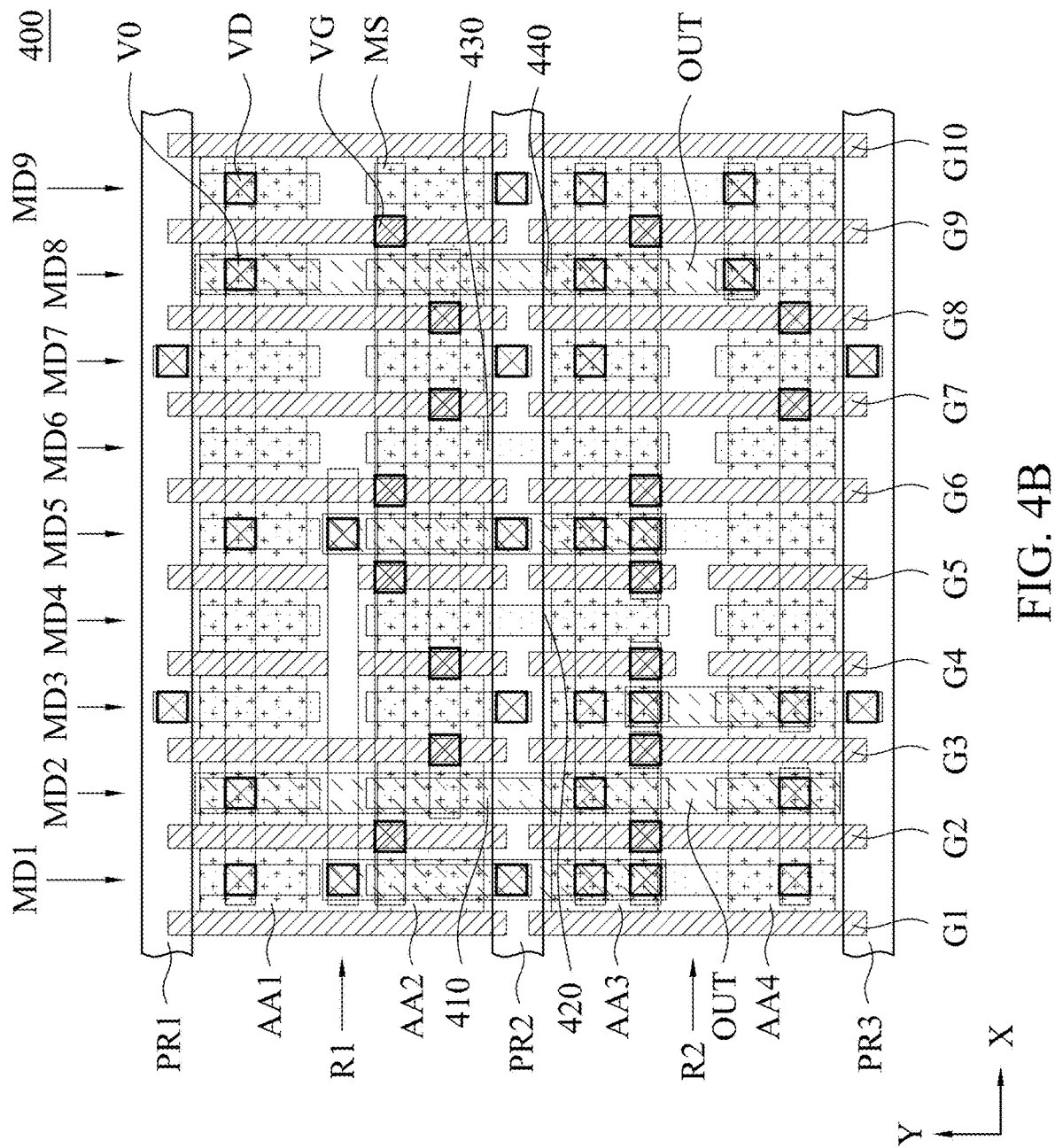
FIG. 4B is a plan view of an IC layout diagram and corresponding IC logic device, in accordance with some embodiments.

Diagram/device 400 depicted in FIG. 4B includes n-type active regions/areas AA1 and AA4 adjacent to respective power rails PR1 and PR3 configured to carry power supply reference voltage VSS, p-type active regions/areas AA2 and AA3 adjacent to power rail PR2 configured to carry power supply voltage VDD, pluralities of gate regions/structures G1-G10, and pluralities of MD regions/structures MD1-MD9. Instances of metal regions/segments MS extending in the Y direction and overlapping/overlying pluralities of MD regions/segments MD2 and MD8 are configured as output terminal OUT.

Pluralities of MD regions/segments MD2, MD4, MD6, and MD8 include respective MD regions/segments 410-440 that overlap/underlie power rail PR2 and overlap/overlie active regions/areas AA2 and AA3, thereby depicting electrical connections between corresponding S/D structures of active areas AA2 and AA3 through MD regions/segments 410-440, also referred to as conductive paths 410-440 in some embodiments.

The portions of active region/area AA2 and pluralities of gate regions G2-G9 included in, and adjacent to, the corresponding S/D structures are configured as PMOS pull-up transistors in row R1 in which the gate structures are configured to receive input signals B1 and B2, and the portions of active region/area AA3 and pluralities of gate regions G2-G9 included in, and adjacent to, the corresponding S/D structures are configured as PMOS pull-up transistors in row R2 in which the gate structures are configured to receive input signals A1 and A2 as discussed above with respect to FIG. 4A. Portions of active regions/areas AA1 and AA4 and adjacent pluralities of gate regions G2-G9 are configured as NMOS pull-down transistors in respective rows R1 and R2 in which the gate structures are configured to receive respective input signals B1/B2 and A1/A2. MD regions/segments 410-440 are thereby configured as conductive regions/segments of AOI device 400 extending in the Y direction between rows R1 and R2 and across power rail PR2 in accordance with the schematic diagram depicted in FIG. 4A, whereby the benefits discussed above are capable of being obtained.

Figure 5B:
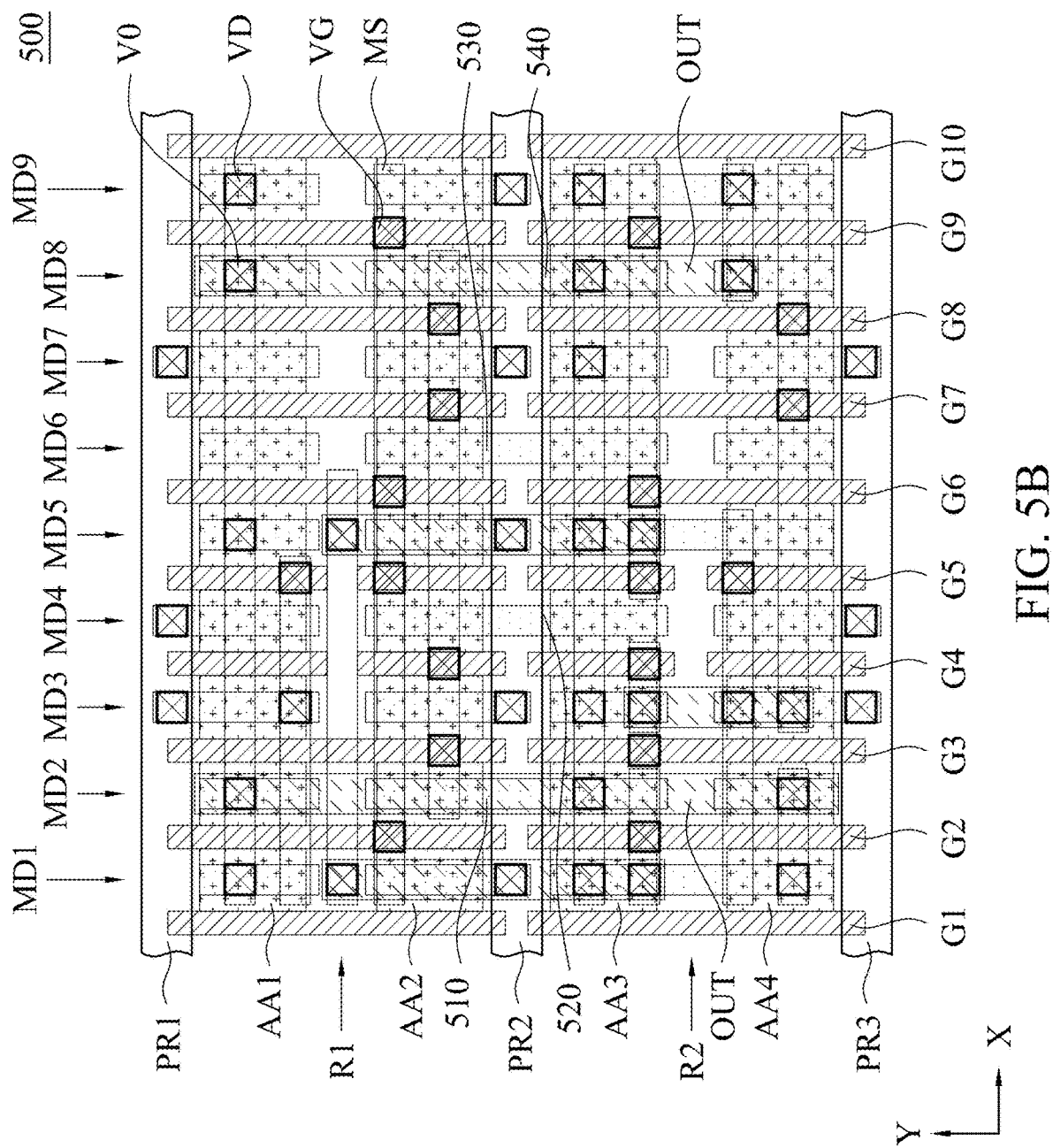
FIG. 5B is a plan view of an IC layout diagram and corresponding IC logic device, in accordance with some embodiments.

Diagram/device 500 depicted in FIG. 5B includes p-type active regions/areas AA1 and AA4 adjacent to respective power rails PR1 and PR3 configured to carry power supply voltage VDD, n-type active regions/areas AA2 and AA3 adjacent to power rail PR2 configured to carry power supply reference voltage VSS, pluralities of gate regions/structures G1-G10, and pluralities of MD regions/structures MD1-MD9. Instances of metal regions/segments MS extending in the Y direction and overlapping/overlying pluralities of MD regions/segments MD2 and MD8 are configured as output terminal OUT.

Pluralities of MD regions/segments MD2, MD4, MD6, and MD8 include respective MD regions/segments 510-540 that overlap/underlie power rail PR2 and overlap/overlie active regions/areas AA2 and AA3, thereby depicting electrical connections between corresponding S/D structures of active areas AA2 and AA3 through MD regions/segments 510-540, also referred to as conductive paths 510-540 in some embodiments.

The portions of active region/area AA2 and pluralities of gate regions G2-G9 included in, and adjacent to, the corresponding S/D structures are configured as NMOS pull-down transistors in row R1 in which the gate structures are configured to receive input signals B1 and B2, and the portions of active region/area AA3 and pluralities of gate regions G2-G9 included in, and adjacent to, the corresponding S/D structures are configured as NMOS pull-down transistors in row R2 in which the gate structures are configured to receive input signals A1 and A2 as discussed above with respect to FIG. 5A. Portions of active regions/areas AA1 and AA4 and adjacent pluralities of gate regions G2-G9 are configured as PMOS pull-up transistors in respective rows R1 and R2 in which the gate structures are configured to receive respective input signals B1/B2 and A1/A2. MD regions/segments 510-540 are thereby configured as conductive regions/segments of OAI device 500 extending in the Y direction between rows R1 and R2 and across power rail PR2 in accordance with the schematic diagram depicted in FIG. 5A, whereby the benefits discussed above are capable of being obtained.

Figure 6B:
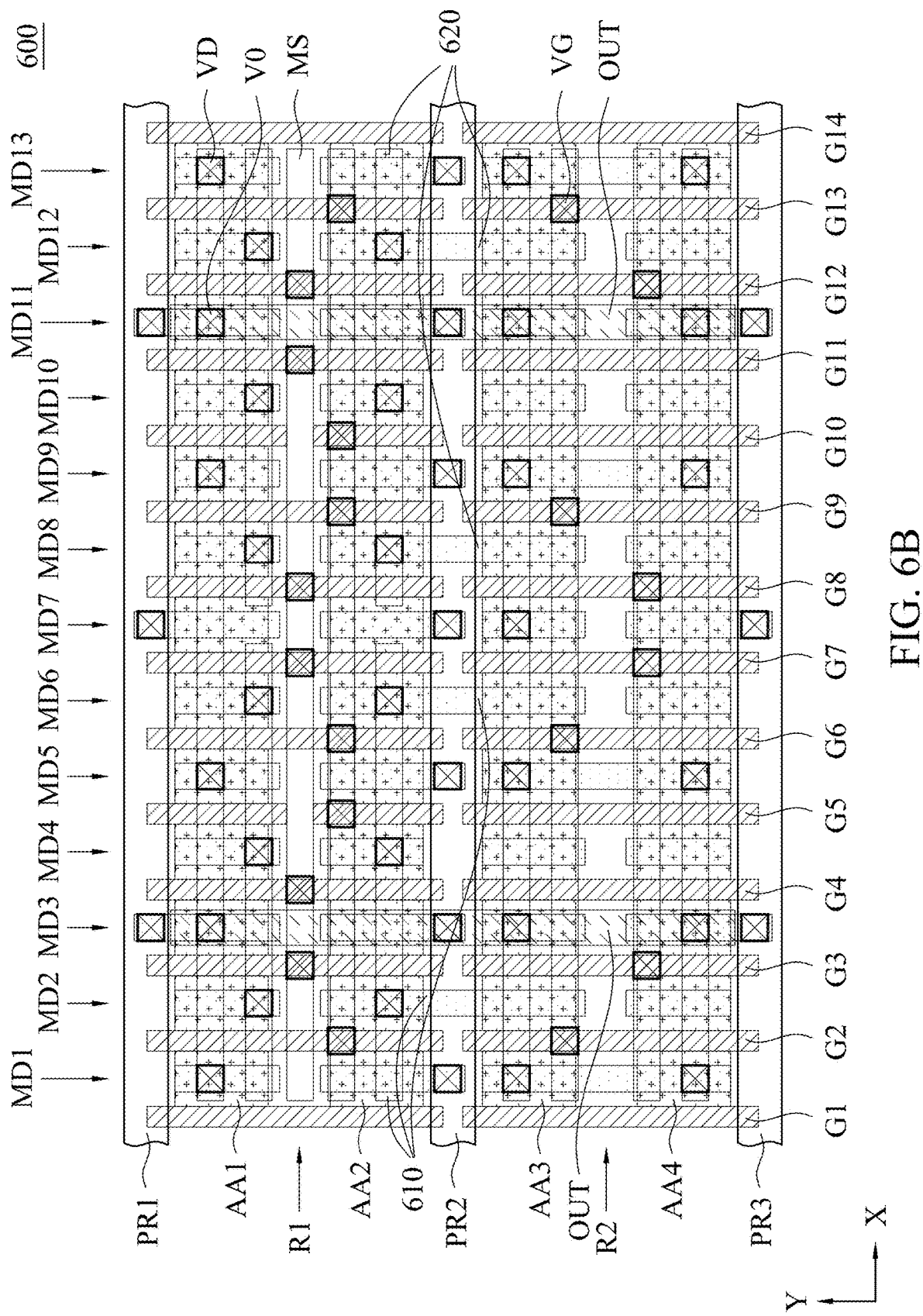
FIG. 6B is a plan view of an IC layout diagram and corresponding IC logic device, in accordance with some embodiments.

Diagram/device 600 depicted in FIG. 6B includes n-type active regions/areas AA1 and AA4 adjacent to respective power rails PR1 and PR3 configured to carry power supply reference voltage VSS, p-type active regions/areas AA2 and AA3 adjacent to power rail PR2 configured to carry power supply voltage VDD, pluralities of gate regions/structures G1-G14, and pluralities of MD regions/structures MD1-MD13. Instances of metal regions/segments MS extending in the Y direction and overlapping/overlying pluralities of MD regions/segments MD3 and MD11 are configured as output terminal OUT.

Pluralities of MD regions/segments MD2, MD6, MD8, and MD12 include respective MD regions/segments that overlap/underlie power rail PR2 and overlap/overlie active regions/areas AA2 and AA3. An instance of metal region/segment MS extending in the X direction overlaps/overlies and is electrically connected to each of the overlapping/overlying MD regions/segments of pluralities of MD regions/segments MD2 and MD6 and an MD region/segment of plurality of MD regions/segments MD4 through instances of via region/structure VD, the features thereby being collectively configured as conductive path 610 between corresponding S/D structures in active regions/areas AA2 and AA3. An instance of metal region/segment MS extending in the X direction overlaps/overlies and is electrically connected to each of the overlapping/overlying MD regions/segments of pluralities of MD regions/segments MD8 and MD10 and an MD region/segment of plurality of MD regions/segments MD12 through instances of via region/structure VD, the features thereby being collectively configured as conductive path 620 between corresponding S/D structures in active regions/areas AA2 and AA3.

The portions of active region/area AA2 and pluralities of gate regions G2-G13 included in, and adjacent to, the corresponding S/D structures are configured as PMOS pull-up transistors in row R1 in which the gate structures are configured to receive input signals B1 and B2, and the portions of active region/area AA3 and pluralities of gate regions G2-G13 included in, and adjacent to, the corresponding S/D structures are configured as PMOS pull-up transistors in row R2 in which the gate structures are configured to receive input signals A1 and A2 as discussed above with respect to FIG. 6A. Portions of active regions/areas AA1 and AA4 and adjacent pluralities of gate regions G2-G13 are configured as NMOS pull-down transistors in respective rows R1 and R2 in which the gate structures are configured to receive respective input signals B1/B2 and A1/A2. Conductive paths 610 and 620 of AOI device 600 are thereby configured to include MD regions/segments extending in the Y direction between rows R1 and R2 and across power rail PR2 in accordance with the schematic diagram depicted in FIG. 6A, whereby the benefits discussed above are capable of being obtained.

Figure 7B:
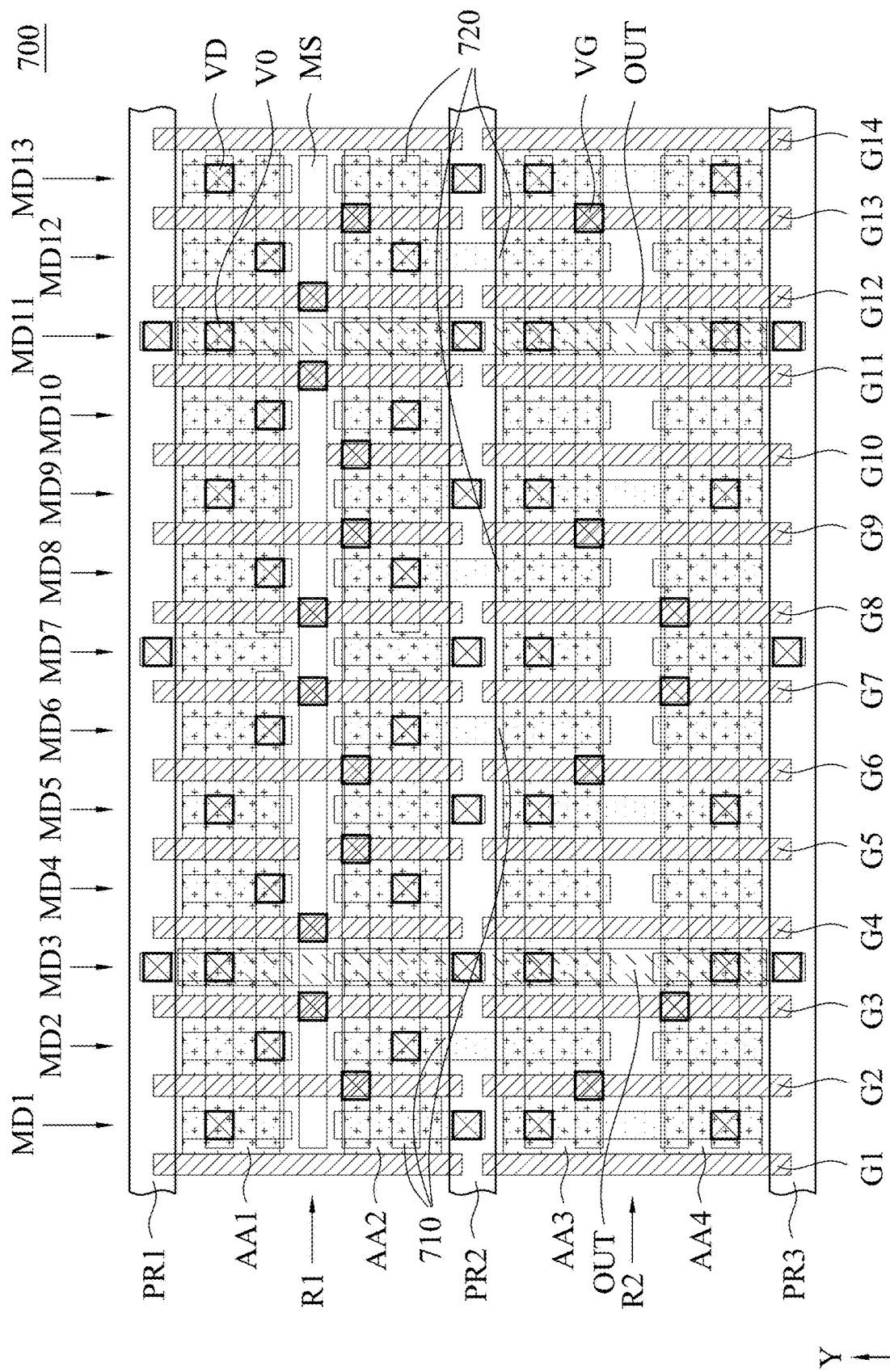
FIG. 7B is a plan view of an IC layout diagram and corresponding IC logic device, in accordance with some embodiments.

Diagram/device 700 depicted in FIG. 7B includes p-type active regions/areas AA1 and AA4 adjacent to respective power rails PR1 and PR3 configured to carry power supply voltage VDD, n-type active regions/areas AA2 and AA3 adjacent to power rail PR2 configured to carry power supply reference voltage VSS, pluralities of gate regions/structures G1-G14, and pluralities of MD regions/structures MD1-MD13. Instances of metal regions/segments MS extending in the Y direction and overlapping/overlying pluralities of MD regions/segments MD3 and MD11 are configured as output terminal OUT.

Pluralities of MD regions/segments MD2, MD6, MD8, and MD12 include respective MD regions/segments that overlap/underlie power rail PR2 and overlap/overlie active regions/areas AA2 and AA3. An instance of metal region/segment MS extending in the X direction overlaps/overlies and is electrically connected to each of the overlapping/overlying MD regions/segments of pluralities of MD regions/segments MD2 and MD6 and an MD region/segment of plurality of MD regions/segments MD4 through instances of via region/structure VD, the features thereby being collectively configured as conductive path 710 between corresponding S/D structures in active regions/areas AA2 and AA3. An instance of metal region/segment MS extending in the X direction overlaps/overlies and is electrically connected to each of the overlapping/overlying MD regions/segments of pluralities of MD regions/segments MD8 and MD10 and an MD region/segment of plurality of MD regions/segments MD12 through instances of via region/structure VD, the features thereby being collectively configured as conductive path 720 between corresponding S/D structures in active regions/areas AA2 and AA3.

The portions of active region/area AA2 and pluralities of gate regions G2-G13 included in, and adjacent to, the corresponding S/D structures are configured as NMOS pull-down transistors in row R1 in which the gate structures are configured to receive input signals B1 and B2, and the portions of active region/area AA3 and pluralities of gate regions G2-G13 included in, and adjacent to, the corresponding S/D structures are configured as NMOS pull-down transistors in row R2 in which the gate structures are configured to receive input signals A1 and A2 as discussed above with respect to FIG. 7A. Portions of active regions/areas AA1 and AA4 and adjacent pluralities of gate regions G2-G14 are configured as PMOS pull-up transistors in respective rows R1 and R2 in which the gate structures are configured to receive respective input signals B1/B2 and A1/A2. Conductive paths 710 and 720 of OAI device 700 are thereby configured to include MD regions/segments extending in the Y direction between rows R1 and R2 and across power rail PR2 in accordance with the schematic diagram depicted in FIG. 7A, whereby the benefits discussed above are capable of being obtained.

Figure 8B:
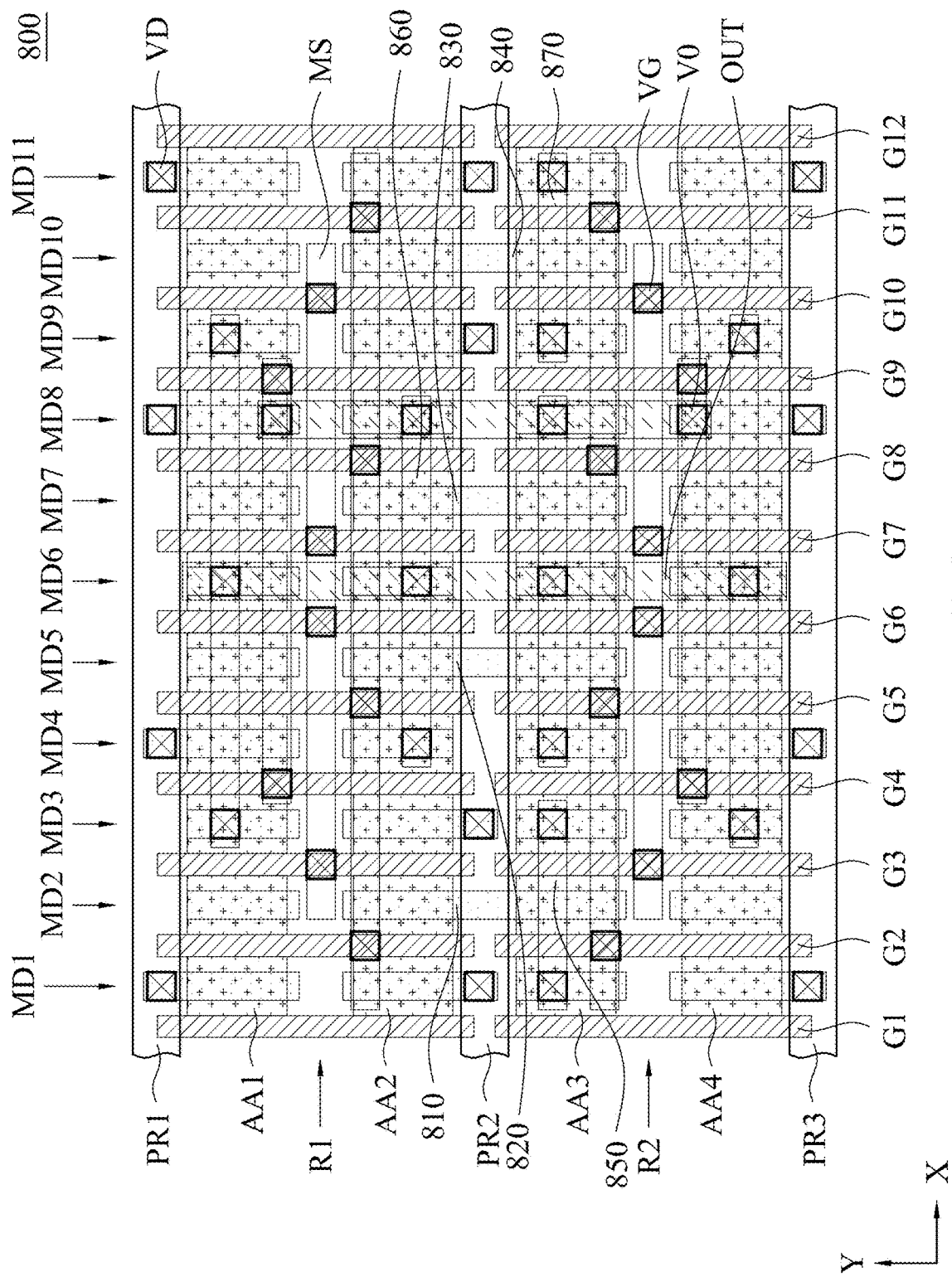
FIG. 8B is a plan view of an IC layout diagram and corresponding IC logic device, in accordance with some embodiments.

Diagram/device 800 depicted in FIG. 8B includes n-type active regions/areas AA1 and AA4 adjacent to respective power rails PR1 and PR3 configured to carry power supply reference voltage VSS, p-type active regions/areas AA2 and AA3 adjacent to power rail PR2 configured to carry power supply voltage VDD, pluralities of gate regions/structures G1-G12, and pluralities of MD regions/structures MD1-MD11. An instance of metal region/segment MS extending in the Y direction and overlapping/overlying pluralities of MD regions/segments MD6 is configured as output terminal OUT.

Pluralities of MD regions/segments MD2, MD5, MD7, and MD10 include respective MD regions/segments that overlap/underlie power rail PR2 and overlap/overlie active regions/areas AA2 and AA3, thereby depicting electrical connections between corresponding S/D structures of active areas AA2 and AA3 through MD regions/segments 810-840, also referred to as conductive paths 810-840 in some embodiments.

The portions of active region/area AA2 and pluralities of gate regions G2, G3, G5-G8, G10, and G11 included in, and adjacent to, the corresponding S/D structures are configured as PMOS pull-up transistors in row R1 in which the gate structures are configured to receive input signals B1 and B2, and the portions of active region/area AA3 and pluralities of gate regions G2, G3, G5-G8, G10, and G11 included in, and adjacent to, the corresponding S/D structures are configured as PMOS pull-up transistors in row R2 in which the gate structures are configured to receive input signals A1 and A2 as discussed above with respect to FIG. 8A. Portions of active regions/areas AA1 and AA4 and adjacent pluralities of gate regions G2-G11 are configured as NMOS pull-down transistors in respective rows R1 and R2 in which the gate structures are configured to receive respective input signals C, B1/B2, and A1/A2. MD regions/segments 810-840 are thereby configured as conductive regions/segments of AOI device 800 extending in the Y direction between rows R1 and R2 and across power rail PR2 in accordance with the schematic diagram depicted in FIG. 8A, whereby the benefits discussed above are capable of being obtained.

An instance of metal region/segment MS extending in the X direction overlaps/overlies and is electrically connected to an MD region/segment of each of pluralities of MD regions/segments MD1 and MD3 through instances of via region/structure VD, the features thereby being collectively configured as conductive path 850 between corresponding S/D structures in active region/area AA3. An instance of metal region/segment MS extending in the X direction overlaps/overlies and is electrically connected to an MD region/segment of each of pluralities of MD regions/segments MD4, MD6, and MD8 through instances of via region/structure VD, the features thereby being collectively configured as conductive path 860 between corresponding S/D structures in active region/area AA2. An instance of metal region/segment MS extending in the X direction overlaps/overlies and is electrically connected to an MD region/segment of each of pluralities of MD regions/segments MD9 and MD11 through instances of via region/structure VD, the features thereby being collectively configured as conductive path 870 between corresponding S/D structures in active region/area AA3.

The portions of active regions/areas AA2 and AA3 and pluralities of gate regions G2-G11 included in, and adjacent to, the corresponding S/D structures are configured as PMOS pull-up transistors in rows R1 and R2 in which the gate structures are configured to receive input signals C, B1/B2, and A1/A2 as discussed above with respect to FIG. 8A. Conductive paths 850-870 of AOI device 800 are thereby configured to include instances of metal regions/segments MS extending in the X direction for lengths less than five times a gate pitch of gate regions/structures G1-G12, thereby reducing segment lengths, speed degradation, and electromigration-based reliability risks compared to some approaches in which segment lengths are greater than five times a gate pitch.

Figure 9B:
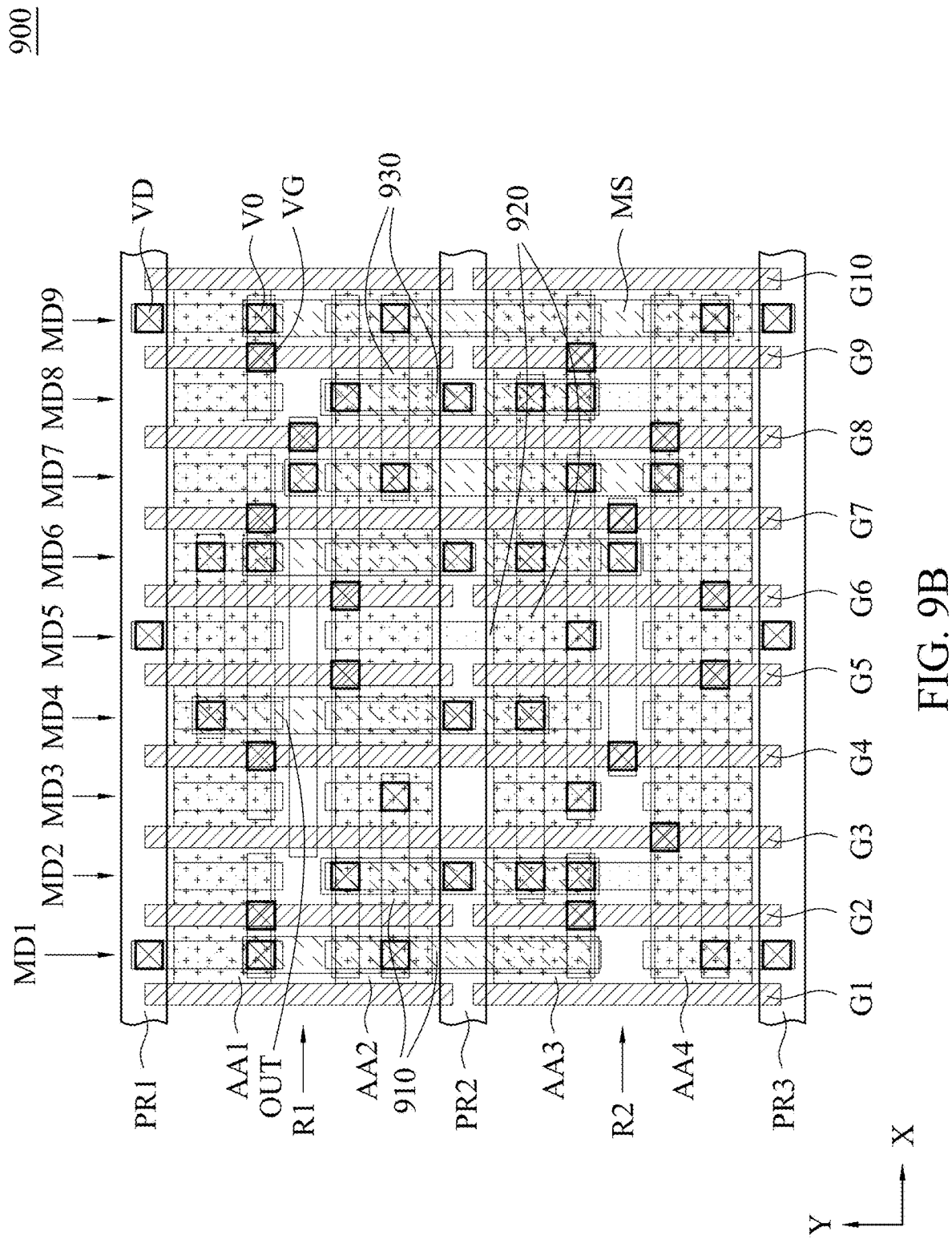
FIG. 9B is a plan view of an IC layout diagram and corresponding IC logic device, in accordance with some embodiments.

Diagram/device 900 depicted in FIG. 9B includes n-type active regions/areas AA1 and AA4 adjacent to respective power rails PR1 and PR3 configured to carry power supply reference voltage VSS, p-type active regions/areas AA2 and AA3 adjacent to power rail PR2 configured to carry power supply voltage VDD, pluralities of gate regions/structures G1-G10, and pluralities of MD regions/structures MD1-MD9. An instance of metal region/segment MS extending in the Y direction and overlapping/overlying plurality of MD regions/segments MD4 is configured as output terminal OUT.

Pluralities of MD regions/segments MD1, MD5, and MD9 include respective MD regions/segments that overlap/underlie power rail PR2 and overlap/overlie active regions/areas AA2 and AA3. An instance of metal region/segment MS extending in the X direction overlaps/overlies and is electrically connected to each of the overlapping/overlying MD region/segment of plurality of MD regions/segments MD1 and an MD region/segment of plurality of MD regions/segments MD3 through instances of via region/structure VD, the features thereby being collectively configured as conductive path 910 between corresponding S/D structures in active regions/areas AA2 and AA3. An instance of metal region/segment MS extending in the X direction overlaps/overlies and is electrically connected to each of the overlapping/overlying MD region/segment of plurality of MD regions/segments MD5 and MD regions/segments of pluralities of MD regions/segments MD3 and MD7 through instances of via region/structure VD, the features thereby being collectively configured as conductive path 920 between corresponding S/D structures in active regions/areas AA2 and AA3. An instance of metal region/segment MS extending in the X direction overlaps/overlies and is electrically connected to each of the overlapping/overlying MD region/segment of plurality of MD regions/segments MD9 and an MD region/segment of plurality of MD regions/segments MD7 through instances of via region/structure VD, the features thereby being collectively configured as conductive path 930 between corresponding S/D structures in active regions/areas AA2 and AA3.

The portions of active regions/areas AA2 and AA3 and pluralities of gate regions G2-G9 included in, and adjacent to, the corresponding S/D structures are configured as PMOS pull-up transistors in rows R1 and R2 in which the gate structures are configured to receive input signals B and A1-A3 as discussed above with respect to FIG. 9A. Portions of active regions/areas AA1 and AA4 and adjacent pluralities of gate regions G2-G9 are configured as NMOS pull-down transistors in respective rows R1 and R2 in which the gate structures are configured to receive input signals B and A1-A3. Conductive paths 910-930 of AOI device 900 are thereby configured to include MD regions/segments extending in the Y direction between rows R1 and R2 and across power rail PR2 in accordance with the schematic diagram depicted in FIG. 9A, whereby the benefits discussed above are capable of being obtained.

Figure 10B:
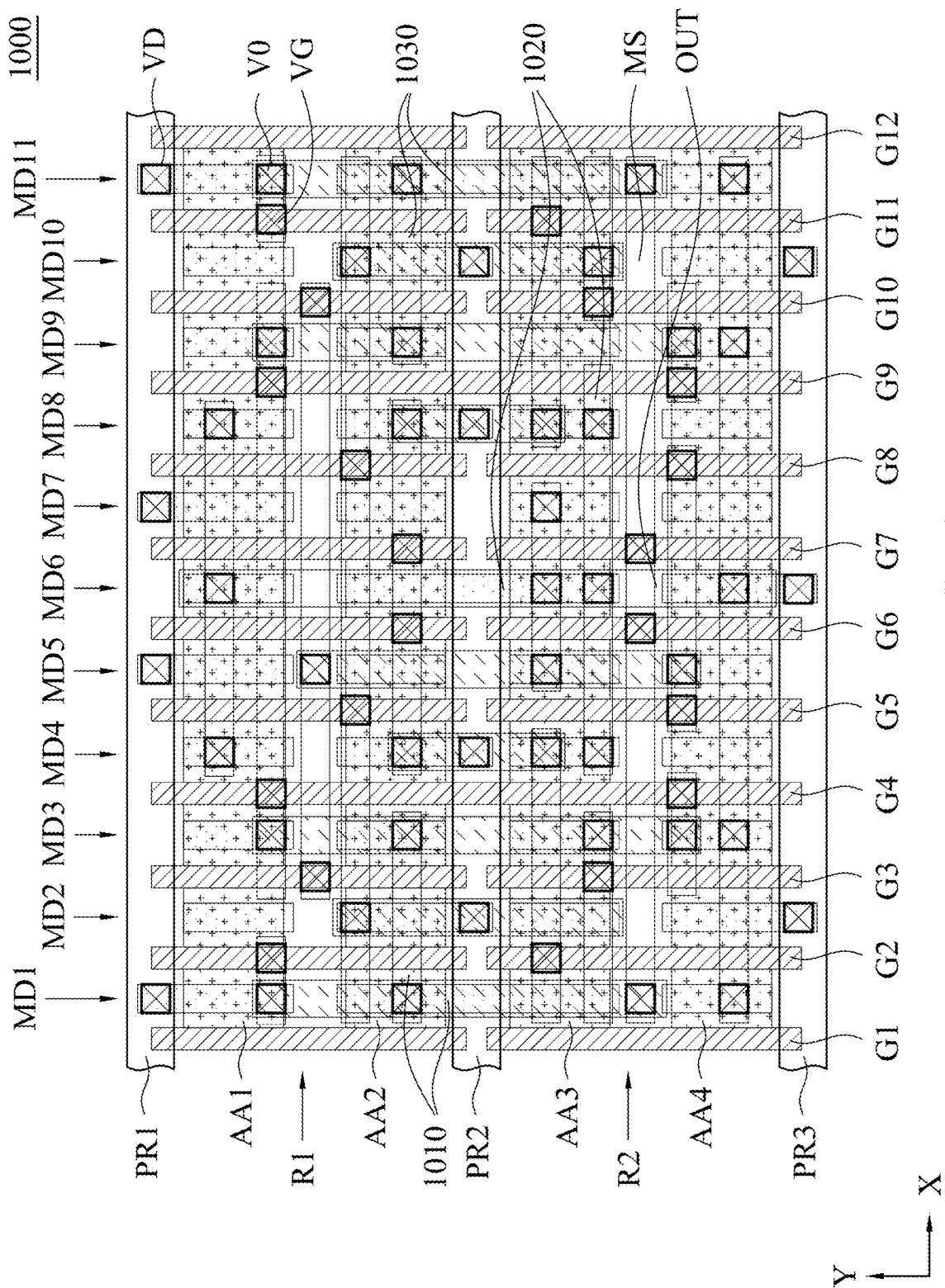
FIG. 10B is a plan view of an IC layout diagram and corresponding IC logic device, in accordance with some embodiments.

Diagram/device 1000 depicted in FIG. 10B includes n-type active regions/areas AA1 and AA4 adjacent to respective power rails PR1 and PR3 configured to carry power supply reference voltage VSS, p-type active regions/areas AA2 and AA3 adjacent to power rail PR2 configured to carry power supply voltage VDD, pluralities of gate regions/structures G1-G12, and pluralities of MD regions/structures MD1-MD11. An instance of metal region/segment MS extending in the Y direction and overlapping/overlying plurality of MD regions/segments MD6 is configured as output terminal OUT.

Pluralities of MD regions/segments MD1, MD6, and MD10 include respective MD regions/segments that overlap/underlie power rail PR2 and overlap/overlie active regions/areas AA2 and AA3. An instance of metal region/segment MS extending in the X direction overlaps/overlies and is electrically connected to each of the overlapping/overlying MD region/segment of plurality of MD regions/segments MD1 and an MD region/segment of plurality of MD regions/segments MD3 through instances of via region/structure VD, the features thereby being collectively configured as conductive path 1010 between corresponding S/D structures in active regions/areas AA2 and AA3. An instance of metal region/segment MS extending in the X direction overlaps/overlies and is electrically connected to each of the overlapping/overlying MD region/segment of plurality of MD regions/segments MD6 and MD regions/segments of pluralities of MD regions/segments MD4 and MD8 through instances of via region/structure VD, the features thereby being collectively configured as conductive path 1020 between corresponding S/D structures in active regions/areas AA2 and AA3. An instance of metal region/segment MS extending in the X direction overlaps/overlies and is electrically connected to each of the overlapping/overlying MD region/segment of plurality of MD regions/segments MD11 and an MD region/segment of plurality of MD regions/segments MD9 through instances of via region/structure VD, the features thereby being collectively configured as conductive path 1030 between corresponding S/D structures in active regions/areas AA2 and AA3.

The portions of active regions/areas AA2 and AA3 and pluralities of gate regions G2-G11 included in, and adjacent to, the corresponding S/D structures are configured as PMOS pull-up transistors in rows R1 and R2 in which the gate structures are configured to receive input signals C, B, and A1-A3 as discussed above with respect to FIG. 10A. Portions of active regions/areas AA1 and AA4 and adjacent pluralities of gate regions G2-G9 are configured as NMOS pull-down transistors in respective rows R1 and R2 in which the gate structures are configured to receive input signals C, B, and A1-A3. Conductive paths 1010-1030 of AOI device 1000 are thereby configured to include MD regions/segments extending in the Y direction between rows R1 and R2 and across power rail PR2 in accordance with the schematic diagram depicted in FIG. 10A, whereby the benefits discussed above are capable of being obtained.

Figure 11B:
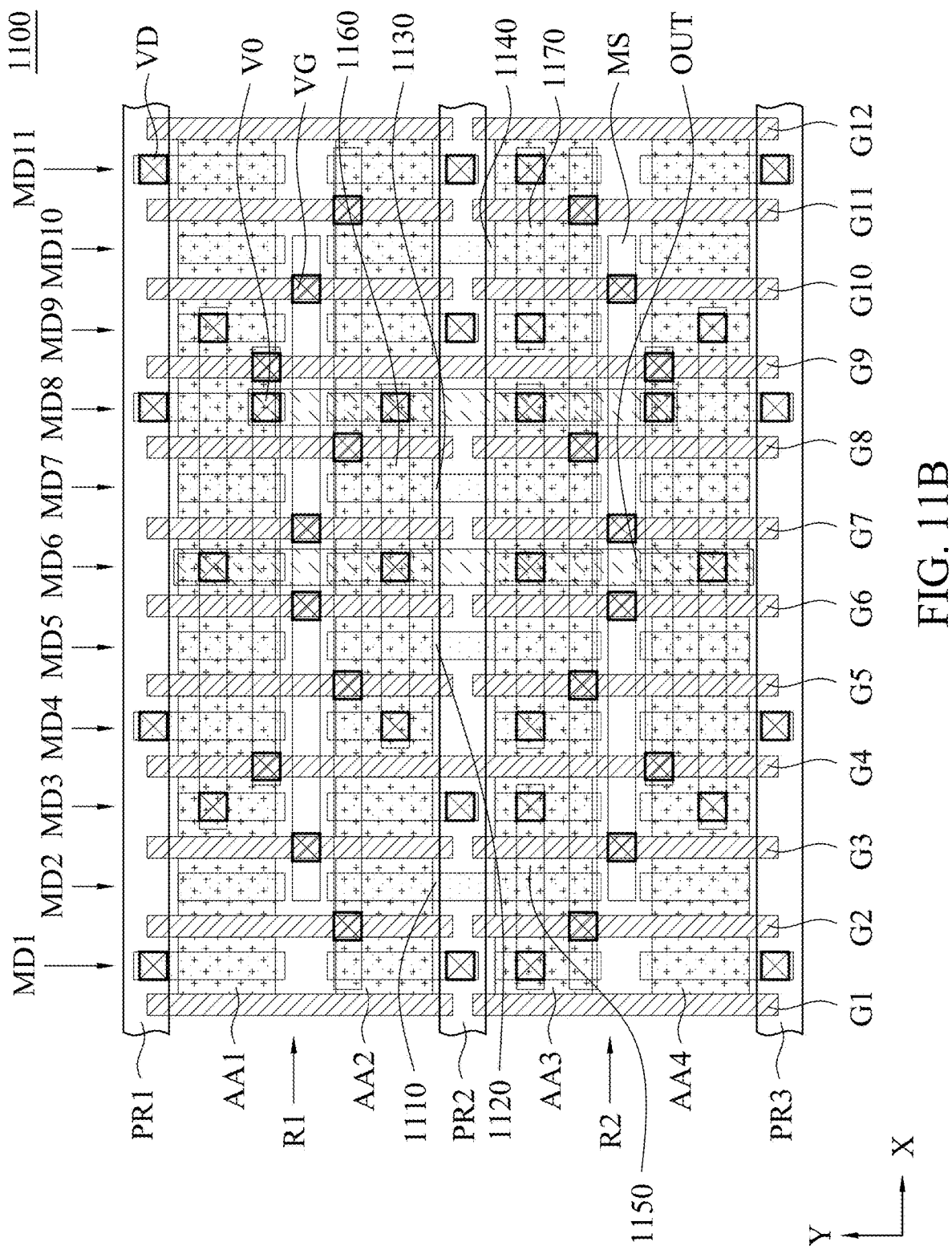
FIG. 11B is a plan view of an IC layout diagram and corresponding IC logic device, in accordance with some embodiments.

Diagram/device 1100 depicted in FIG. 11B includes p-type active regions/areas AA1 and AA4 adjacent to respective power rails PR1 and PR3 configured to carry power supply voltage VDD, n-type active regions/areas AA2 and AA3 adjacent to power rail PR2 configured to carry power supply reference voltage VSS, pluralities of gate regions/structures G1-G12, and pluralities of MD regions/structures MD1-MD11. An instance of metal region/segment MS extending in the Y direction and overlapping/overlying pluralities of MD regions/segments MD6 is configured as output terminal OUT.

Pluralities of MD regions/segments MD2, MD5, MD7, and MD10 include respective MD regions/segments that overlap/underlie power rail PR2 and overlap/overlie active regions/areas AA2 and AA3, thereby depicting electrical connections between corresponding S/D structures of active areas AA2 and AA3 through MD regions/segments 1110-1140, also referred to as conductive paths 1110-1140 in some embodiments.

The portions of active region/area AA2 and pluralities of gate regions G2, G3, G5-G8, G10, and G11 included in, and adjacent to, the corresponding S/D structures are configured as NMOS pull-down transistors in row R1 in which the gate structures are configured to receive input signals B1 and B2, and the portions of active region/area AA3 and pluralities of gate regions G2, G3, G5-G8, G10, and G11 included in, and adjacent to, the corresponding S/D structures are configured as NMOS pull-down transistors in row R2 in which the gate structures are configured to receive input signals A1 and A2 as discussed above with respect to FIG. 11A. Portions of active regions/areas AA1 and AA4 and adjacent pluralities of gate regions G2-G11 are configured as PMOS pull-up transistors in respective rows R1 and R2 in which the gate structures are configured to receive respective input signals C, B1/B2, and A1/A2. MD regions/segments 1110-1140 are thereby configured as conductive regions/segments of OAI device 1100 extending in the Y direction between rows R1 and R2 and across power rail PR2 in accordance with the schematic diagram depicted in FIG. 11A, whereby the benefits discussed above are capable of being obtained.

An instance of metal region/segment MS extending in the X direction overlaps/overlies and is electrically connected to an MD region/segment of each of pluralities of MD regions/segments MD1 and MD3 through instances of via region/structure VD, the features thereby being collectively configured as conductive path 1150 between corresponding S/D structures in active region/area AA3. An instance of metal region/segment MS extending in the X direction overlaps/ overlies and is electrically connected to an MD region/segment of each of pluralities of MD regions/segments MD4, MD6, and MD8 through instances of via region/structure VD, the features thereby being collectively configured as conductive path 1160 between corresponding S/D structures in active region/area AA2. An instance of metal region/segment MS extending in the X direction overlaps/overlies and is electrically connected to an MD region/segment of each of pluralities of MD regions/segments MD9 and MD11 through instances of via region/structure VD, the features thereby being collectively configured as conductive path 1170 between corresponding S/D structures in active region/area AA3.

The portions of active regions/areas AA2 and AA3 and pluralities of gate regions G2-G11 included in, and adjacent to, the corresponding S/D structures are configured as NMOS pull-down transistors in rows R1 and R2 in which the gate structures are configured to receive input signals C, B1/B2, and A1/A2 as discussed above with respect to FIG. 11A. Conductive paths 1150-1170 of OAI device 1100 are thereby configured to include instances of metal regions/segments MS extending in the X direction for lengths less than five times a gate pitch of gate regions/structures G1-G12, thereby reducing segment lengths, speed degradation, and electromigration-based reliability risks compared to some approaches in which segment lengths are greater than five times a gate pitch.

Figure 12B:
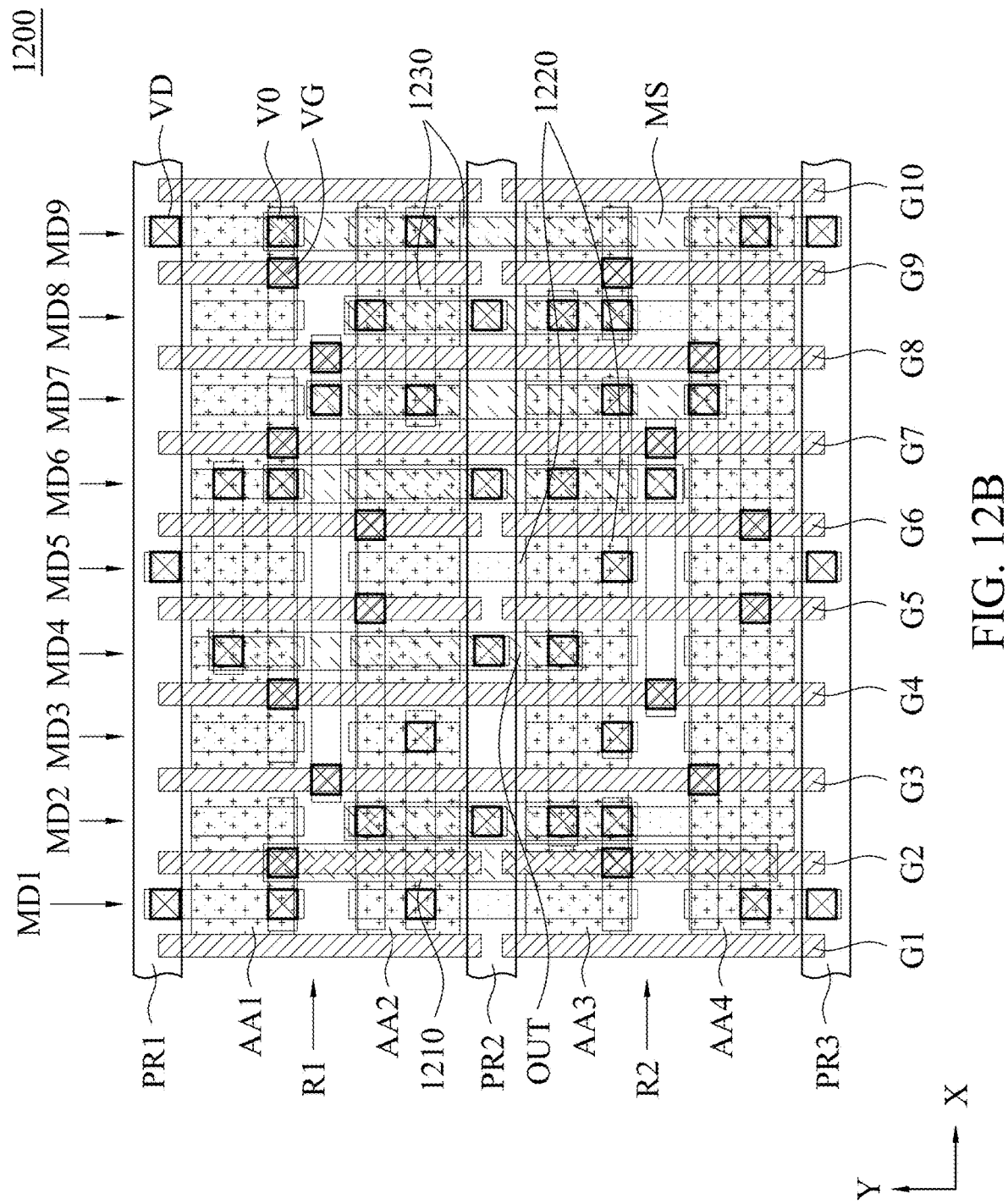
FIG. 12B is a plan view of an IC layout diagram and corresponding IC logic device, in accordance with some embodiments.

Diagram/device 1200 depicted in FIG. 12B includes p-type active regions/areas AA1 and AA4 adjacent to respective power rails PR1 and PR3 configured to carry power supply voltage VDD, n-type active regions/areas AA2 and AA3 adjacent to power rail PR2 configured to carry power supply reference voltage VSS, pluralities of gate regions/structures G1-G10, and pluralities of MD regions/structures MD1-MD9. An instance of metal region/segment MS extending in the Y direction and overlapping/overlying plurality of MD regions/segments MD4 is configured as output terminal OUT.

Pluralities of MD regions/segments MD1, MD5, and MD9 include respective MD regions/segments that overlap/underlie power rail PR2 and overlap/overlie active regions/areas AA2 and AA3. An instance of metal region/segment MS extending in the X direction overlaps/overlies and is electrically connected to each of the overlapping/overlying MD region/segment of plurality of MD regions/segments MD1 and an MD region/segment of plurality of MD regions/segments MD3 through instances of via region/structure VD, the features thereby being collectively configured as conductive path 1210 between corresponding S/D structures in active regions/areas AA2 and AA3. An instance of metal region/segment MS extending in the X direction overlaps/overlies and is electrically connected to each of the overlapping/overlying MD region/segment of plurality of MD regions/segments MD5 and MD regions/segments of pluralities of MD regions/segments MD3 and MD7 through instances of via region/structure VD, the features thereby being collectively configured as conductive path 1220 between corresponding S/D structures in active regions/areas AA2 and AA3. An instance of metal region/segment MS extending in the X direction overlaps/overlies and is electrically connected to each of the overlapping/overlying MD region/segment of plurality of MD regions/segments MD9 and an MD region/segment of plurality of MD regions/segments MD7 through instances of via region/structure VD, the features thereby being collectively configured as conductive path 1230 between corresponding S/D structures in active regions/areas AA2 and AA3.

The portions of active regions/areas AA2 and AA3 and pluralities of gate regions G2-G9 included in, and adjacent to, the corresponding S/D structures are configured as NMOS pull-down transistors in rows R1 and R2 in which the gate structures are configured to receive input signals B and A1-A3 as discussed above with respect to FIG. 12A. Portions of active regions/areas AA1 and AA4 and adjacent pluralities of gate regions G2-G9 are configured as PMOS pull-up transistors in respective rows R1 and R2 in which the gate structures are configured to receive input signals B and A1-A3. Conductive paths 1210-1230 of OAI device 1200 are thereby configured to include MD regions/segments extending in the Y direction between rows R1 and R2 and across power rail PR2 in accordance with the schematic diagram depicted in FIG. 12A, whereby the benefits discussed above are capable of being obtained.

Figure 13B:
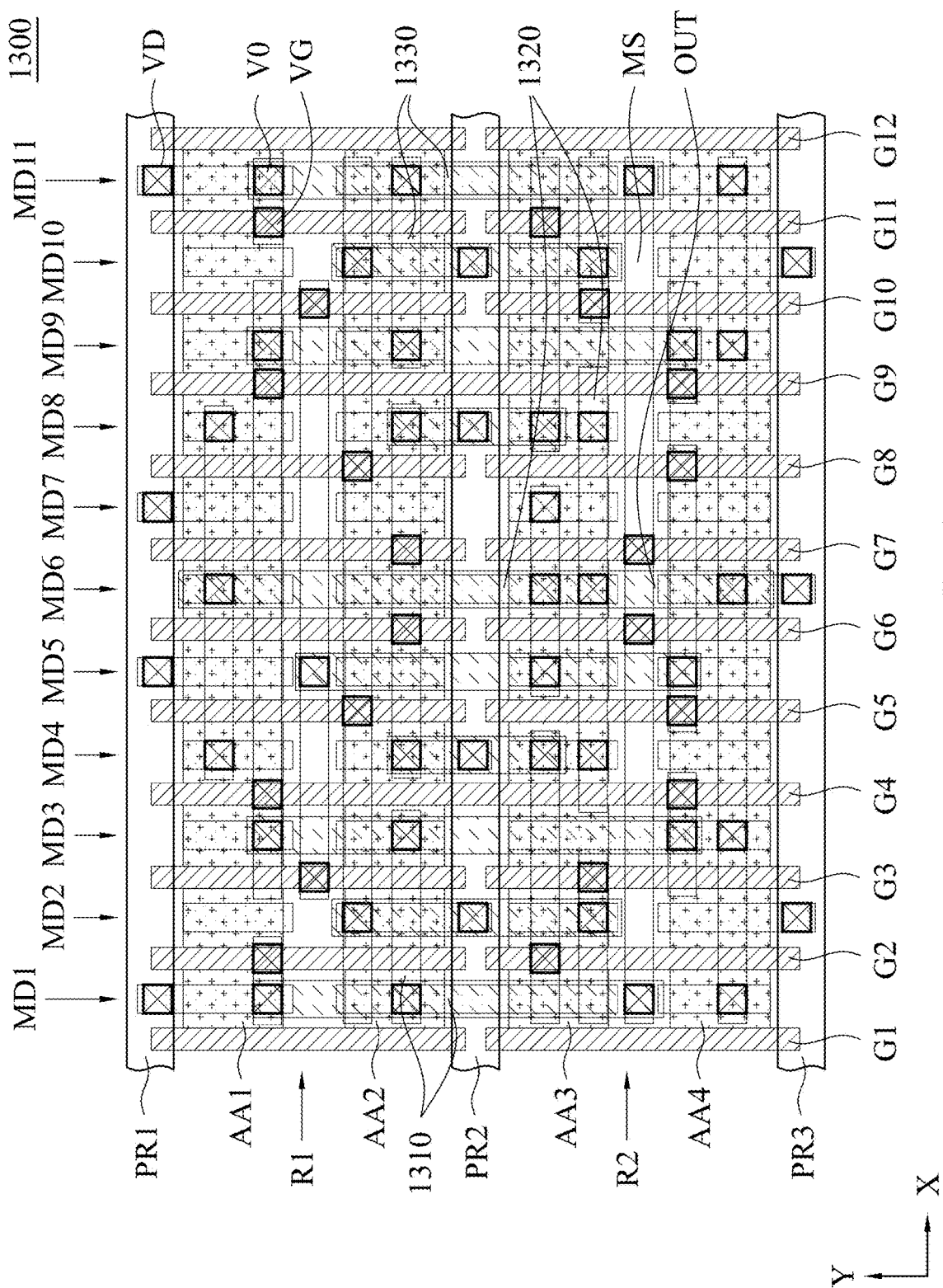
FIG. 13B is a plan view of an IC layout diagram and corresponding IC logic device, in accordance with some embodiments.

Diagram/device 1300 depicted in FIG. 13B includes p-type active regions/areas AA1 and AA4 adjacent to respective power rails PR1 and PR3 configured to carry power supply voltage VDD, n-type active regions/areas AA2 and AA3 adjacent to power rail PR2 configured to carry power supply reference voltage VSS, pluralities of gate regions/structures G1-G12, and pluralities of MD regions/structures MD1-MD11. An instance of metal region/segment MS extending in the Y direction and overlapping/overlying plurality of MD regions/segments MD6 is configured as output terminal OUT.

Pluralities of MD regions/segments MD1, MD6, and MD10 include respective MD regions/segments that overlap/underlie power rail PR2 and overlap/overlie active regions/areas AA2 and AA3. An instance of metal region/segment MS extending in the X direction overlaps/overlies and is electrically connected to each of the overlapping/overlying MD region/segment of plurality of MD regions/segments MD1 and an MD region/segment of plurality of MD regions/segments MD3 through instances of via region/structure VD, the features thereby being collectively configured as conductive path 1310 between corresponding S/D structures in active regions/areas AA2 and AA3. An instance of metal region/segment MS extending in the X direction overlaps/overlies and is electrically connected to each of the overlapping/overlying MD region/segment of plurality of MD regions/segments MD6 and MD regions/segments of pluralities of MD regions/segments MD4 and MD8 through instances of via region/structure VD, the features thereby being collectively configured as conductive path 1320 between corresponding S/D structures in active regions/areas AA2 and AA3. An instance of metal region/segment MS extending in the X direction overlaps/overlies and is electrically connected to each of the overlapping/overlying MD region/segment of plurality of MD regions/segments MD11 and an MD region/segment of plurality of MD regions/segments MD9 through instances of via region/structure VD, the features thereby being collectively configured as conductive path 1330 between corresponding S/D structures in active regions/areas AA2 and AA3.

The portions of active regions/areas AA2 and AA3 and pluralities of gate regions G2-G11 included in, and adjacent to, the corresponding S/D structures are configured as NMOS pull-down transistors in rows R1 and R2 in which the gate structures are configured to receive input signals C, B, and A1-A3 as discussed above with respect to FIG. 13A. Portions of active regions/areas AA1 and AA4 and adjacent pluralities of gate regions G2-G9 are configured as PMOS pull-up transistors in respective rows R1 and R2 in which the gate structures are configured to receive input signals C, B, and A1-A3. Conductive paths 1310-1330 of OAI device 1300 are thereby configured to include MD regions/segments extending in the Y direction between rows R1 and R2 and across power rail PR2 in accordance with the schematic diagram depicted in FIG. 13A, whereby the benefits discussed above are capable of being obtained.

Figure 14:
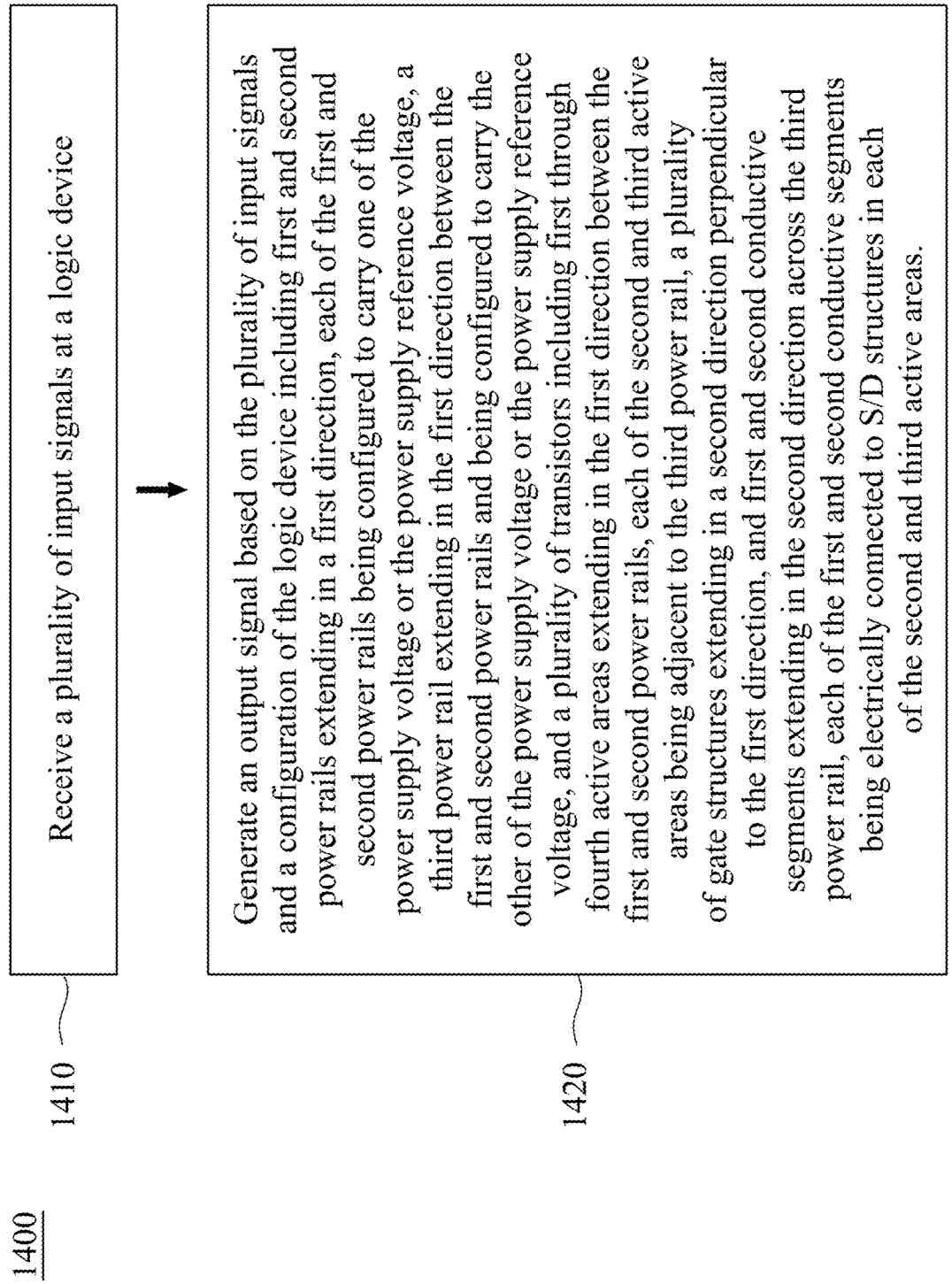
FIG. 14 is a flowchart of a method of operating an IC logic device, in accordance with some embodiments.

FIG. 14 is a flowchart of a method 1400 of operating a logic device, in accordance with one or more embodiments. Method 1400 is usable with a logic device, e.g., logic device 100C, 200-1, 200-2, or 300-1300 discussed above with respect to FIGS. 1A-13B.

The sequence in which the operations of method 1400 are depicted in FIG. 14 is for illustration only; the operations of method 1400 are capable of being executed in sequences that differ from that depicted in FIG. 14. In some embodiments, operations in addition to those depicted in FIG. 14 are performed before, between, during, and/or after the operations depicted in FIG. 14. In some embodiments, the operations of method 1400 are a subset of operations of a method of operating an IC.

At operation 1410, a plurality of input signals is received at the logic device. In some embodiments, receiving the plurality of input signals includes receiving a subset of input signals A1-A4, B1, B2, B, or C at logic device 100C, 200-1, 200-2, or 300-1300 in accordance with the embodiments discussed above with respect to FIGS. 1A-13B.

Receiving the plurality of signals includes receiving each signal having either a logically high voltage level, e.g., a voltage level within a predetermined threshold of a voltage level of power supply voltage VDD, or a logically low voltage level, e.g., a voltage level within a predetermined threshold of a voltage level of power supply reference voltage VSS.

At operation 1420, an output signal is generated based on the plurality of input signals and a configuration of the logic device. Generating the output signal based on the plurality of input signals includes performing one of an AOI, OAI, or four-input NAND operation on the plurality of input signals.

Generating the output signal based on the configuration of the logic device includes the logic device including first and second power rails extending in a first direction, each of the first and second power rails being configured to carry one of the power supply voltage or the power supply reference voltage, a third power rail extending in the first direction between the first and second power rails and being configured to carry the other of the power supply voltage or the power supply reference voltage, and a plurality of transistors. The plurality of transistors includes first through fourth active areas extending in the first direction between the first and second power rails, each of the second and third active areas being adjacent to the third power rail, a plurality of gate structures extending in a second direction perpendicular to the first direction, and first and second conductive segments extending in the second direction across the third power rail, each of the first and second conductive segments being electrically connected to S/D structures in each of the second and third active areas.

In some embodiments, generating the output signal based on the configuration of the logic device includes generating the output signal based on the configuration of logic devices 100C, 200-1, 200-2, or 300-1300 discussed above with respect to FIGS. 1A-13B.

By executing the operations of method 1400, an AOI, OAI, or NAND operation is performed using a double height cell configured as discussed above, thereby obtaining the benefits discussed above with respect to logic devices 100C, 200-1, 200-2, and 300-1300.

FIG. 15 is a flowchart of a method 1500 of manufacturing an IC device, in accordance with some embodiments. Method 1500 is operable to form one or more of IC devices 100C, 200-1, 200-2, or 300-1300 discussed above with respect to FIGS. 1A-13B.

In some embodiments, the operations of method 1500 are performed in the order depicted in FIG. 15. In some embodiments, the operations of method 1500 are performed in an order other than the order depicted in FIG. 15. In some embodiments, one or more additional operations are performed before, during, and/or after the operations of method 1500. In some embodiments, performing some or all of the operations of method 1500 includes performing one or more operations as discussed below with respect to IC manufacturing system 1800 and FIG. 18.

At operation 1510, in some embodiments, first and second active areas are formed in a first row extending in a first direction and third and fourth active areas are formed in a second row adjacent to the first row, wherein each active area includes a plurality of S/D structures. Forming the third and fourth active areas in the second row adjacent to the first row includes forming the third active area adjacent to the second active area. In some embodiments, forming the first through fourth active areas includes forming active areas AA1-AA4 discussed above with respect to FIGS. 2B-2E and 3B-13B.

In various embodiments, each of forming the first and fourth active areas includes forming an n-type active area and each of forming the second and third active areas includes forming a p-type active area, or each of forming the first and fourth active areas includes forming a p-type active area and each of forming the second and third active areas includes forming an n-type active area. In some embodiments, forming the first through fourth pluralities of active areas includes forming the first and fourth or second and third active areas in one or more n-wells.

In various embodiments, forming the first through fourth pluralities of active areas includes performing one or more implantation processes in areas of a semiconductor substrate corresponding to the first through fourth pluralities of active areas, whereby predetermined doping concentrations and types are achieved for one or more given dopants as discussed above with respect to FIGS. 2B-2E and 3B-13B.

In some embodiments, forming the first through fourth active areas includes forming the corresponding pluralities of S/D structures in and/or on portions of the first through fourth active areas, e.g., by performing one or more implantation processes, etching processes, and/or deposition processes.

At operation 1520, first and second conductive segments are constructed extending in a second direction perpendicular to the first direction, wherein each of the first and second conductive segments overlies and is electrically connected to S/D structures in each of the second and third active areas. In some embodiments, constructing the first and second conductive segments includes constructing two or more MD segments, e.g., MD segments of pluralities of MD segments MD1-MD13 discussed above with respect to FIGS. 2B, 2D, and 3B-13B. In some embodiments, constructing the first and second conductive segments includes constructing two or more metal segments, e.g., two of metal segments 210-2 through 240-2 discussed above with respect to FIGS. 2C and 2E.

In some embodiments, constructing the first and second conductive segments includes constructing third and fourth conductive segments extending in the second direction, wherein each of the third and fourth conductive segments overlies and is electrically connected to S/D structures in each of the second and third active areas. In some embodiments, constructing the third and fourth conductive segments includes constructing two or more additional MD segments of pluralities of MD segments MD1-MD13 as discussed above with respect to FIGS. 2B, 2D, 4B-8B, and 11B.

In various embodiments, constructing the first and second conductive segments includes performing a plurality of manufacturing operations, e.g., one or more of a lithography, diffusion, deposition, etching, planarizing, or other operation suitable for constructing one or more conductive materials configured to form a continuous, low resistance structure as discussed above with respect to FIGS. 2B-2E and 3B-13B.

At operation 1530, additional conductive segments, a plurality of gate structures, and a plurality of via structures are constructed, thereby forming one of an AOI, OAI, or four-input NAND device including the first and second conductive segments and pull-up and pull-down transistors in each of the first and second rows.

In some embodiments, constructing the additional conductive segments, plurality of gate structures, and plurality of via structures includes constructing instances of metal segments MS, some or all of gate structures G1-G14, and instances of via structures VD, VG, and V0, each discussed above with respect to FIGS. 2B-2E and 3B-13B.

In various embodiments, constructing the additional conductive segments, plurality of gate structures, and plurality of via structures includes performing a plurality of manufacturing operations, e.g., one or more of a lithography, diffusion, deposition, etching, planarizing, or other operation suitable for constructing the various features in accordance with the configurations discussed above with respect to FIGS. 2B-2E and 3B-13B.

In some embodiments, forming the one of the AOI, OAI, or four-input NAND device including the first and second conductive segments and pull-up and pull-down transistors in each of the first and second rows includes forming the one of the AOI, OAI, or four-input NAND device in accordance with a schematic diagram of a device 200-1300 discussed above with respect to FIGS. 2A-13A.

At operation 1540, in some embodiments, first through third power rails extending in the first direction are constructed, wherein the first and second power rails are aligned with the first row, the second and third power rails are aligned with the second row, and each of the first and second conductive segments crosses a plane perpendicular to the first and second conductive segments and including the second power rail.

In some embodiments, constructing the first through third power rails extending in the first direction includes constructing power rails PR1-PR3 extending in the X direction as discussed above with respect to FIGS. 1C, 2B-2E, and 3B-13B.

In some embodiments, each of the first and second conductive segments crossing the plane perpendicular to the first and second conductive segments and including the second power rail includes one or more additional conductive segments crossing the plane, e.g., as discussed above with respect to FIGS. 2B-2E and 4B-13B.

In various embodiments, constructing the first through third power rails includes performing a plurality of manufacturing operations, e.g., one or more of a lithography, diffusion, deposition, etching, planarizing, or other operation suitable for constructing metal segments overlying, buried in, and/or on a backside of a semiconductor substrate, as discussed above with respect to FIGS. 2B-2E and 3B-13B.

By performing some or all of the operations of method 1500, an AOI, OAI, or four-input NAND IC device is manufactured in which first and second conductive segments cross a plane including a second power rail, thereby obtaining the benefits discussed above with respect to IC devices 100C, 200-1, 200-2, and 300-1300 and FIGS. 1A-13B.

Figure 16:
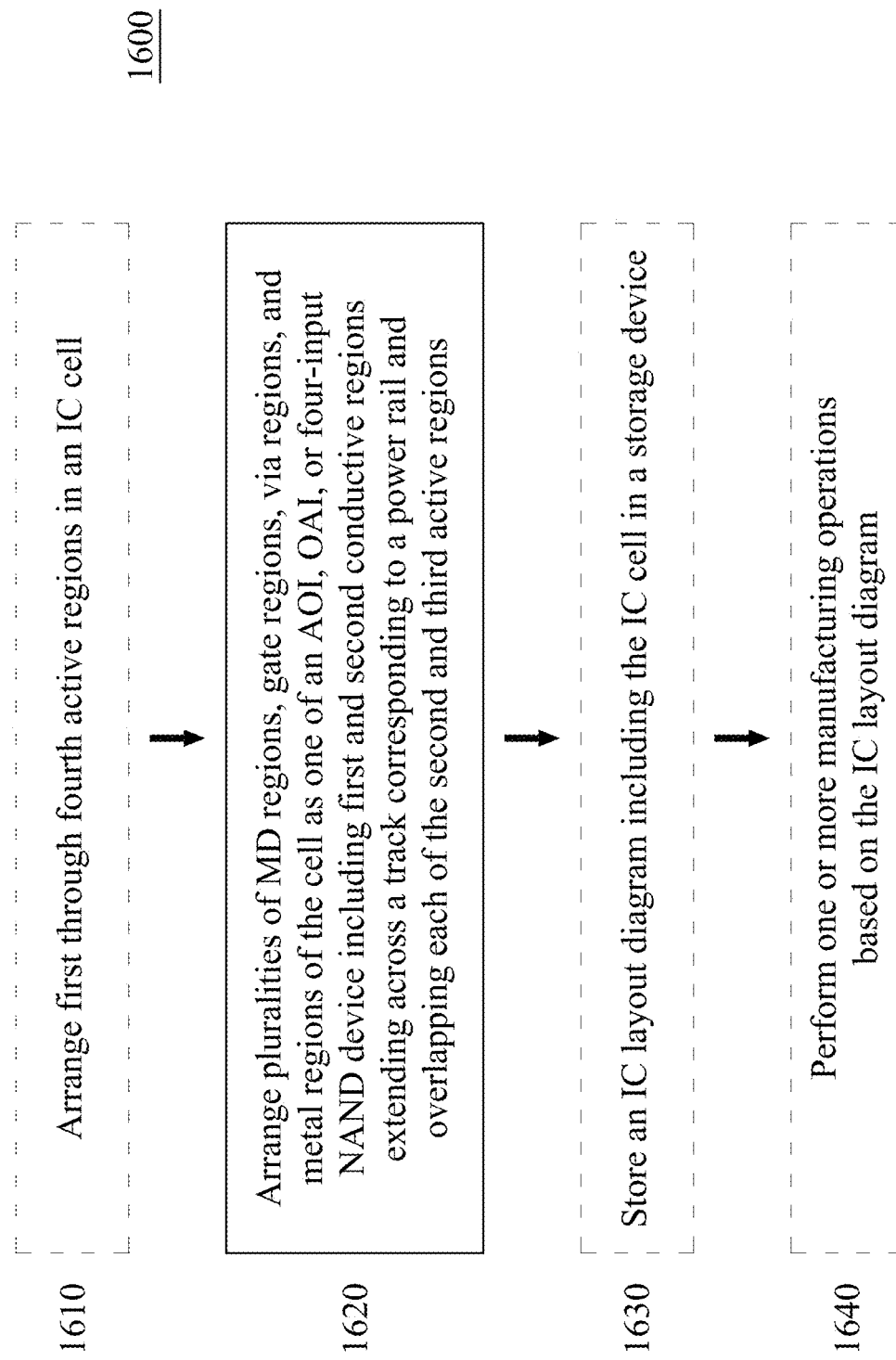
FIG. 16 is a flowchart of a method of generating an IC layout diagram, in accordance with some embodiments.

FIG. 16 is a flowchart of a method 1600 of generating an IC layout diagram, e.g., an IC layout diagram 100C, 200-1, 200-2, and/or 300-1300 discussed above with respect to FIGS. 1A-13B, in accordance with some embodiments.

In some embodiments, generating the IC layout diagram includes generating the IC layout diagram corresponding to an IC device, e.g., an IC device 100C, 200-1, 200-2, and/or 300-1300 discussed above with respect to FIGS. 1A-13B, manufactured based on the generated IC layout diagram.

In some embodiments, some or all of method 1600 is executed by a processor of a computer, e.g., a processor 1702 of an IC layout diagram generation system 1700, discussed below with respect to FIG. 17.

Some or all of the operations of method 1600 are capable of being performed as part of a design procedure performed in a design house, e.g., a design house 1820 discussed below with respect to FIG. 18.

In some embodiments, the operations of method 1600 are performed in the order depicted in FIG. 16. In some embodiments, the operations of method 1600 are performed simultaneously and/or in an order other than the order depicted in FIG. 16. In some embodiments, one or more operations are performed before, between, during, and/or after performing one or more operations of method 1600.

At operation 1610, in some embodiments, first through fourth active regions are arranged in an IC cell, also referred to as a double-height cell in some embodiments. Arranging the first through fourth active regions in the IC cell includes arranging the first and second active regions in a first row and arranging the third and fourth active regions in a second row, e.g., rows R1 and R2 discussed above with respect to FIGS. 1C, 2B-2E, and 3B-13B.

In some embodiments, arranging the first through fourth active regions in the IC cell includes arranging the first through fourth active regions according to cell dimensions based on tracks corresponding to first through third power rails, e.g., power rails PR1-PR3 discussed above with respect to FIGS. 1C, 2B-2E, and 3B-13B.

At operation 1620, pluralities of MD regions, gate regions, via regions, and metal regions of the cell are arranged as one of an AOI, OAI, or four-input NAND device including first and second conductive regions extending across a track corresponding to a power rail and overlapping each of the second and third active regions.

Arranging the pluralities of MD regions, gate regions, via regions, and metal regions of the cell as one of the AOI, OAI, or four-input NAND device includes configured pull-up and pull-down transistors in each of the first and second rows.

In some embodiments, arranging the pluralities of MD regions, gate regions, via regions, and metal regions of the cell as one of the AOI, OAI, or four-input NAND device includes arranging some or all of pluralities of MD regions MD1-MD13, gate regions G1-G14, instances of via regions VD, VG, and V0, and instances of metal regions MS in accordance with a schematic diagram 200-1300 discussed above with respect to FIGS. 2A-13A.

In some embodiments, the first and second conductive regions extending across the track corresponding to the power rail include first and second MD regions, e.g., MD regions of pluralities of MD regions MD1-MD13 discussed above with respect to FIGS. 2B, 2D, and 3B-13B. In some embodiments, the first and second conductive regions extending across the track corresponding to the power rail include first and second metal regions, e.g., two of metal regions 210-2 through 240-2 discussed above with respect to FIGS. 2C and 2E.

In some embodiments, arranging the pluralities of MD regions, gate regions, via regions, and metal regions of the cell as one of the AOI, OAI, or four-input NAND device including the first and second conductive regions extending across the track corresponding to the power rail includes arranging the one of the AOI, OAI, or four-input NAND device including one or more additional conductive regions extending across the track corresponding to the power rail, e.g., as discussed above with respect to FIGS. 2B, 2D, 4B-8B, and 11B.

In some embodiments, the first and second conductive regions extending across the track corresponding to the power rail includes the first, second, and any additional conductive regions extending across the track corresponding to power rail PR2 as discussed above with respect to FIGS. 1C, 2B-2E, and 3B-13B.

In some embodiments, arranging the pluralities of MD regions, gate regions, via regions, and metal regions of the cell as one of the AOI, OAI, or four-input NAND device including the first and second conductive regions overlapping each of the second and third active regions includes the first, second, and any additional conductive regions overlapping each of the second and third active regions at locations corresponding to S/D regions as discussed above with respect to FIGS. 2B-2E and 3B-13B.

At operation 1630, in some embodiments, an IC layout diagram including the cell is stored in a storage device. In some embodiments, storing the IC layout diagram including the cell in the storage device includes storing the cell in a cell library, e.g., cell library 1707 of IC layout diagram generation system 1700, discussed below with respect to FIG. 17.

In various embodiments, storing the IC layout diagram in the storage device includes storing the IC layout diagram in a non-volatile, computer-readable memory and/or includes storing the IC layout diagram over a network, e.g., network 1714 of IC layout diagram generation system 1700, discussed below with respect to FIG. 17.

At operation 1640, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed above with respect to FIG. 15 and below with respect to FIG. 18.

By executing some or all of the operations of method 1600, an IC layout diagram is generated corresponding to an IC device in which an AOI, OAI, or four-input NAND IC device includes first and second conductive segments that cross a plane including a second power rail, thereby obtaining the benefits discussed above with respect to IC devices 100C, 200-1, 200-2, and 300-1300 and FIGS. 1A-13B.

Figure 17:
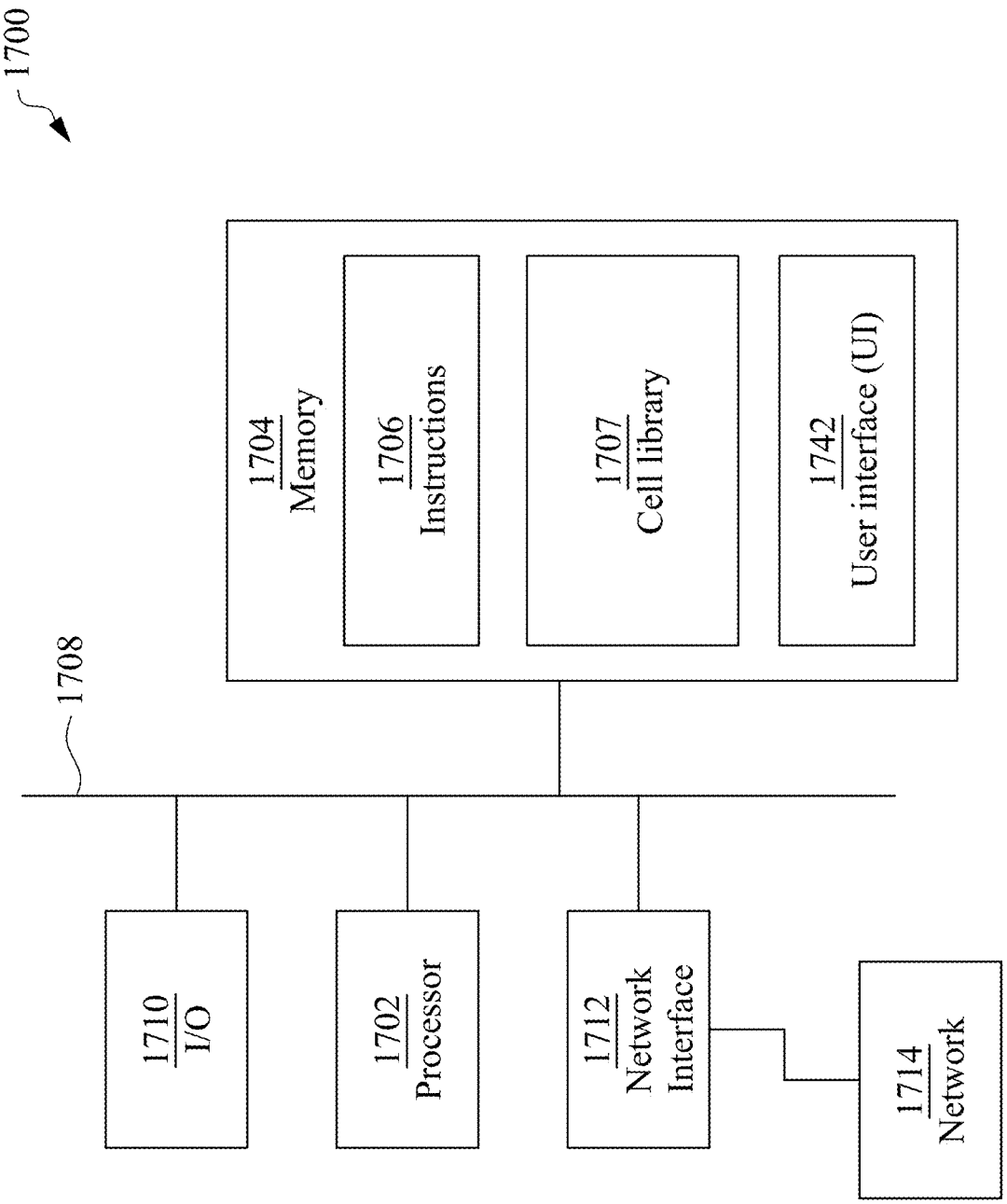
FIG. 17 is a block diagram of an IC layout diagram generation system, in accordance with some embodiments.

FIG. 17 is a block diagram of IC layout diagram generation system 1700, in accordance with some embodiments. Methods described herein of designing IC layout diagrams in accordance with one or more embodiments are implementable, for example, using IC layout diagram generation system 1700, in accordance with some embodiments.

In some embodiments, IC layout diagram generation system 1700 is a general purpose computing device including a hardware processor 1702 and a non-transitory, computer-readable storage medium 1704. Storage medium 1704, amongst other things, is encoded with, i.e., stores, computer program code 1706, i.e., a set of executable instructions. Execution of code 1706 by hardware processor 1702 represents (at least in part) an EDA tool which implements a portion or all of a method, e.g., method 1600 of generating an IC layout diagram described above with respect to FIG. 5 and/or method 700 of generating an IC layout diagram described above with respect to FIG. 7 (hereinafter, the noted processes and/or methods).

Processor 1702 is electrically coupled to computer-readable storage medium 1704 via a bus 1708. Processor 1702 is also electrically coupled to an I/O interface 1710 by bus 1708. A network interface 1712 is also electrically connected to processor 1702 via bus 1708. Network interface 1712 is connected to a network 1714, so that processor 1702 and computer-readable storage medium 1704 are capable of connecting to external elements via network 1714. Processor 1702 is configured to execute computer program code 1706 encoded in computer-readable storage medium 1704 in order to cause IC layout diagram generation system 1700 to be usable for performing a portion or all of the noted processes and/or methods. In one or more embodiments, processor 1702 is a central processing unit (CPU), a multi-processor, a distributed processing system, an application specific integrated circuit (ASIC), and/or a suitable processing unit.

In one or more embodiments, computer-readable storage medium 1704 is an electronic, magnetic, optical, electromagnetic, infrared, and/or a semiconductor system (or apparatus or device). For example, computer-readable storage medium 1704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1704 includes a compact disk-read only memory (CD-ROM), a compact disk-read/write (CD-R/W), and/or a digital video disc (DVD).

In one or more embodiments, computer-readable storage medium 1704 stores computer program code 1706 configured to cause IC layout diagram generation system 1700 (where such execution represents (at least in part) the EDA tool) to be usable for performing a portion or all of the noted processes and/or methods. In one or more embodiments, computer-readable storage medium 1704 also stores information which facilitates performing a portion or all of the noted processes and/or methods. In one or more embodiments, computer-readable storage medium 1704 stores cell library 1707 of cells including such cells as disclosed herein, e.g., cells 100C, 200-1, 200-2, and 300-1300 discussed above with respect to FIGS. 1A-13B.

IC layout diagram generation system 1700 includes I/O interface 1710. I/O interface 1710 is coupled to external circuitry. In one or more embodiments, I/O interface 1710 includes a keyboard, keypad, mouse, trackball, trackpad, touchscreen, and/or cursor direction keys for communicating information and commands to processor 1702.

IC layout diagram generation system 1700 also includes network interface 1712 coupled to processor 1702. Network interface 1712 allows system 1700 to communicate with network 1714, to which one or more other computer systems are connected. Network interface 1712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 1700.

IC layout diagram generation system 1700 is configured to receive information through I/O interface 1710. The information received through I/O interface 1710 includes one or more of instructions, data, design rules, libraries of standard cells, and/or other parameters for processing by processor 1702. The information is transferred to processor 1702 via bus 1708. IC layout diagram generation system 1700 is configured to receive information related to a UI through I/O interface 1710. The information is stored in computer-readable medium 1704 as user interface (UI) 1742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 1700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 18:
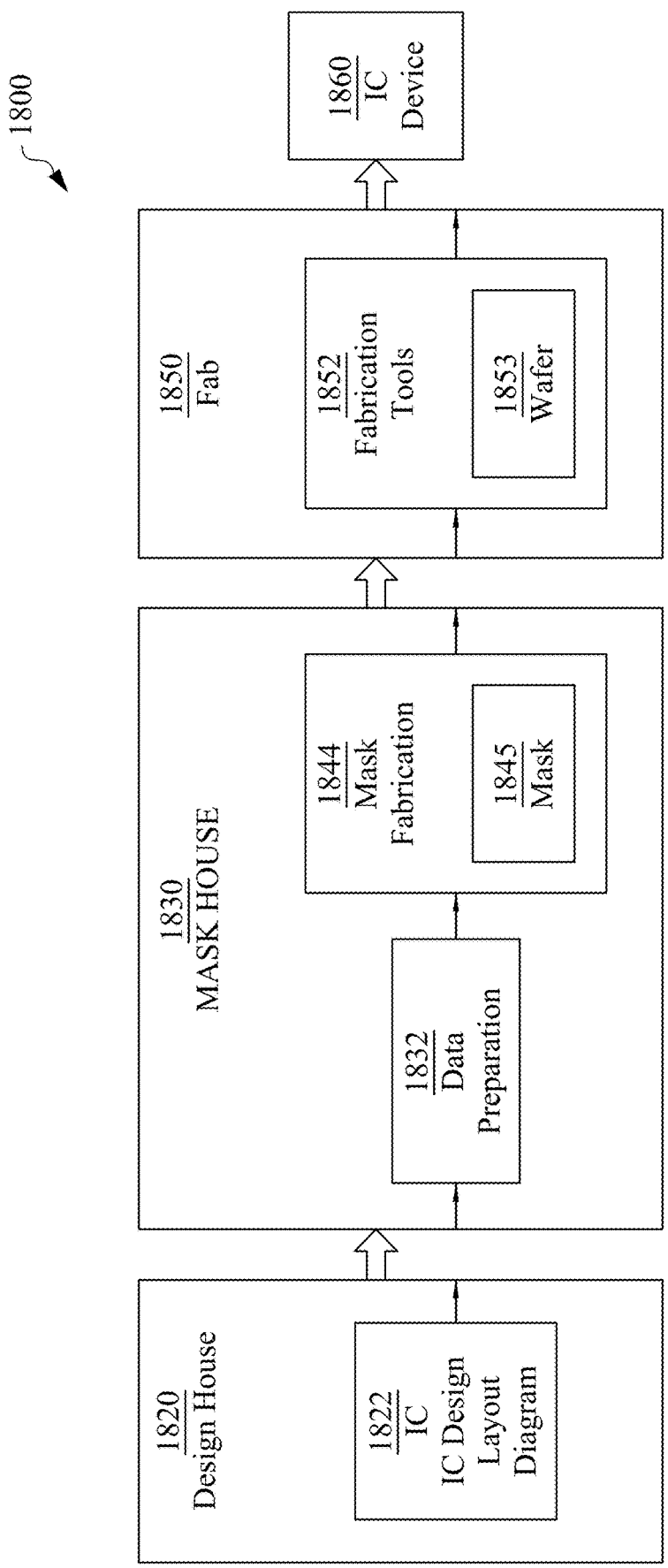
FIG. 18 is a block diagram of an IC manufacturing system, and an IC manufacturing flow associated therewith, in accordance with some embodiments.

FIG. 18 is a block diagram of IC manufacturing system 1800, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 1800.

In FIG. 18, IC manufacturing system 1800 includes entities, such as a design house 1820, a mask house 1830, and an IC manufacturer/fabricator ("fab") 1850, that interact with one another in the design, development, and manufacturing cycles and/or services related to manufacturing an IC device 1860. The entities in system 1800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1820, mask house 1830, and IC fab 1850 is owned by a single larger company. In some embodiments, two or more of design house 1820, mask house 1830, and IC fab 1850 coexist in a common facility and use common resources.

Design house (or design team) 1820 generates an IC design layout diagram 1822. IC design layout diagram 1822 includes various geometrical patterns, e.g., a cell 100C, 200-1, 200-2, or 300-1300 discussed above with respect to FIGS. 1A-13B. The geometrical patterns correspond to patterns of metal, oxide, or semiconductor layers that make up the various components of IC device 1860 to be fabricated. The various layers combine to form various IC features. For example, a portion of IC design layout diagram 1822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1820 implements a proper design procedure to form IC design layout diagram 1822. The design procedure includes one or more of logic design, physical design or place and route. IC design layout diagram 1822 is presented in one or more data files having information of the geometrical patterns. For example, IC design layout diagram 1822 can be expressed in a GDSII file format or DFII file format.

Mask house 1830 includes data preparation 1832 and mask fabrication 1844. Mask house 1830 uses IC design layout diagram 1822 to manufacture one or more masks 1845 to be used for fabricating the various layers of IC device 1860 according to IC design layout diagram 1822. Mask house 1830 performs mask data preparation 1832, where IC design layout diagram 1822 is translated into a representative data file (RDF). Mask data preparation 1832 provides the RDF to mask fabrication 1844. Mask fabrication 1844 includes a mask writer. A mask writer converts the RDF to an image on a substrate, such as a mask (reticle) 1845 or a semiconductor wafer 1853. The design layout diagram 1822 is manipulated by mask data preparation 1832 to comply with particular characteristics of the mask writer and/or requirements of IC fab 1850. In FIG. 18, mask data preparation 1832 and mask fabrication 1844 are illustrated as separate elements. In some embodiments, mask data preparation 1832 and mask fabrication 1844 can be collectively referred to as mask data preparation.

In some embodiments, mask data preparation 1832 includes optical proximity correction (OPC) which uses lithography enhancement techniques to compensate for image errors, such as those that can arise from diffraction, interference, other process effects and the like. OPC adjusts IC design layout diagram 1822. In some embodiments, mask data preparation 1832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1832 includes a mask rule checker (MRC) that checks the IC design layout diagram 1822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1822 to compensate for limitations during mask fabrication 1844, which may undo part of the modifications performed by OPC in order to meet mask creation rules.

In some embodiments, mask data preparation 1832 includes lithography process checking (LPC) that simulates processing that will be implemented by IC fab 1850 to fabricate IC device 1860. LPC simulates this processing based on IC design layout diagram 1822 to create a simulated manufactured device, such as IC device 1860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 1822.

It should be understood that the above description of mask data preparation 1832 has been simplified for the purposes of clarity. In some embodiments, data preparation 1832 includes additional features such as a logic operation (LOP) to modify the IC design layout diagram 1822 according to manufacturing rules. Additionally, the processes applied to IC design layout diagram 1822 during data preparation 1832 may be executed in a variety of different orders.

After mask data preparation 1832 and during mask fabrication 1844, a mask 1845 or a group of masks 1845 are fabricated based on the modified IC design layout diagram 1822. In some embodiments, mask fabrication 1844 includes performing one or more lithographic exposures based on IC design layout diagram 1822. In some embodiments, an electron-beam (e-beam) or a mechanism of multiple e-beams is used to form a pattern on a mask (photomask or reticle) 1845 based on the modified IC design layout diagram 1822. Mask 1845 can be formed in various technologies. In some embodiments, mask 1845 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1845 includes a transparent substrate (e.g., fused quartz) and an opaque material (e.g., chromium) coated in the opaque regions of the binary mask. In another example, mask 1845 is formed using a phase shift technology. In a phase shift mask (PSM) version of mask 1845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1844 is used in a variety of processes. For example, such a mask(s) is used in an ion implantation process to form various doped regions in semiconductor wafer 1853, in an etching process to form various etching regions in semiconductor wafer 1853, and/or in other suitable processes.

IC fab 1850 is an IC fabrication business that includes one or more manufacturing facilities for the fabrication of a variety of different IC products. In some embodiments, IC Fab 1850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1850 includes wafer fabrication tools 1852 configured to execute various manufacturing operations on semiconductor wafer 1853 such that IC device 1860 is fabricated in accordance with the mask(s), e.g., mask 1845. In various embodiments, fabrication tools 1852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1850 uses mask(s) 1845 fabricated by mask house 1830 to fabricate IC device 1860. Thus, IC fab 1850 at least indirectly uses IC design layout diagram 1822 to fabricate IC device 1860. In some embodiments, semiconductor wafer 1853 is fabricated by IC fab 1850 using mask(s) 1845 to form IC device 1860. In some embodiments, the IC fabrication includes performing one or more lithographic exposures based at least indirectly on IC design layout diagram 1822. Semiconductor wafer 1853 includes a silicon substrate or other proper substrate having material layers formed thereon. Semiconductor wafer 1853 further includes one or more of various doped regions, dielectric features, multi-level interconnects, and the like (formed at subsequent manufacturing steps).

In some embodiments, an IC device includes first and second power rails extending in a first direction, wherein each of the first and second power rails is configured to carry one of a power supply voltage or a power supply reference voltage, a third power rail extending in the first direction between the first and second power rails, wherein the third power rail is configured to carry the other of the power supply voltage or the power supply reference voltage, and a plurality of transistors including first through fourth active areas extending in the first direction between the first and second power rails, wherein each of the second and third active areas is adjacent to the third power rail, a plurality of gate structures extending in a second direction perpendicular to the first direction, and first and second conductive segments extending in the second direction across the third power rail. Each of the first and second conductive segments is electrically connected to a first set of S/D structures in each of the second and third active areas, and the plurality of transistors is configured as one of an AOI, an OAI, or a four-input NAND gate. In some embodiments, the first and second conductive segments include respective first and second MD segments underlying the third power rail and overlying the corresponding first set of S/D structures in the second and third active areas. In some embodiments, the IC device includes third and fourth MD segments underlying the third power rail and overlying a corresponding second set of S/D structures in the second and third active areas. In some embodiments, the IC device includes first through third metal segments extending in the first direction, wherein the first metal segment overlies the first and second MD segments and overlies and is electrically connected to fifth through seventh MD segments overlying a corresponding third set of S/D structures in the second active area, the second metal segment overlies the third MD segment and overlies and is electrically connected to eighth and ninth MD segments overlying a corresponding fourth set of S/D structures in the third active area, and the third metal segment overlies the fourth MD segment and overlies and is electrically connected to tenth and eleventh MD segments overlying a corresponding fifth set of S/D structures in the third active area. In some embodiments, the IC device includes a first conductive path including the first MD segment and a first metal segment extending in the first direction and electrically connected to each of the first MD segment and a third MD segment overlying a corresponding first S/D structure of a second set of S/D structures in the second active area, and a second conductive path including the second MD segment and a second metal segment extending in the first direction and electrically connected to each of the second MD segment and a fourth MD segment overlying a corresponding second S/D structure of the second set of S/D structures in the second active area. In some embodiments, the first conductive path includes a fifth MD segment extending in the second direction across the third power rail and electrically connected to the first metal segment and the corresponding S/D structures of the first and second sets of S/D structures in each of the second and third active areas, and the second conductive path includes a sixth MD segment extending in the second direction across the third power rail and electrically connected to the second metal segment and the corresponding S/D structures of the first and second sets of S/D structures in each of the second and third active areas. In some embodiments, the IC device includes a third conductive path including a fifth MD segment extending in the second direction across the third power rail and electrically connected to a corresponding third set of S/D structures in each of the second and third active areas, and a third metal segment extending in the first direction and electrically connected to each of the fifth MD segment and sixth and seventh MD segments overlying a corresponding fourth set of S/D structures in the third active area. In some embodiments, each of the first and second conductive segments includes a metal segment overlying each of the third power rail and the corresponding first set of S/D structures in the second and third active areas. In some embodiments, each of the first and second power rails is configured to carry the power supply voltage, the third power rail is configured to carry the power supply reference voltage, each of the first and fourth active areas includes a p-type active area, and each of the second and third active areas includes an n-type active area. In some embodiments, each of the first and second power rails is configured to carry the power supply reference voltage, the third power rail is configured to carry the power supply voltage, each of the first and fourth active areas includes an n-type active area, and each of the second and third active areas includes a p-type active area.

In some embodiments, an IC device includes a first row of transistors including first and second active areas extending in a first direction adjacent to respective first and second power rails, each of the first and second active areas including a plurality of first S/D structures, and a first plurality of gate structures extending between the first and second power rails in a second direction perpendicular to the first direction, wherein the first row of transistors is configured to receive a first subset of a plurality of input signals, a second row of transistors including third and fourth active areas extending in the first direction adjacent to the second power rail and a third power rail, respectively, each of the third and fourth active areas including a plurality of second S/D structures, and a second plurality of gate structures extending between the second and third power rails in the second direction, wherein the second row of transistors is configured to receive a second subset of the plurality of input signals, and first and second conductive segments extending in the second direction across the second power rail. Each of the first and second conductive segments is electrically connected to a first S/D structure of the plurality of first S/D structures in the second active area and to a second S/D structure of the plurality of second S/D structures in the third active area, and the first and second rows of transistors and first and second conductive segments are configured as one of an AOI, an OAI, or a four-input NAND gate. In some embodiments, the first row of transistors includes pull-up transistors including the first active area and configured to receive the first subset of the plurality of input signals and pull-down transistors including the second active area and configured to receive the first subset of the plurality of input signals, and the second row of transistors includes pull-down transistors including the third active area and configured to receive the second subset of the plurality of input signals and pull-up transistors including the fourth active area and configured to receive the second subset of the plurality of input signals. In some embodiments, the first row of transistors includes pull-down transistors including the first active area and configured to receive the first subset of the plurality of input signals and pull-up transistors including the second active area and configured to receive the first subset of the plurality of input signals, and the second row of transistors includes pull-up transistors including the third active area and configured to receive the second subset of the plurality of input signals and pull-down transistors including the fourth active area and configured to receive the second subset of the plurality of input signals. In some embodiments, each of the first and second rows of transistors is configured to receive the respective first or second subset of the plurality of input signals including a total of two input signals. In some embodiments, each of the first and second rows of transistors is configured to receive an input signal of the plurality of input signals in addition to the first and second subsets of the plurality of input signals. In some embodiments, the IC device includes a metal segment extending in the second direction across the second power rail and configured to carry an output signal.

In some embodiments, a method of manufacturing an IC device includes, in a semiconductor substrate, forming first and second active areas in a first row extending in a first direction and third and fourth active areas in a second row adjacent to the first row, wherein each of the first active area, the second active area, the third active area, and the fourth active area includes a plurality of S/D structures, constructing first and second conductive segments extending in a second direction, wherein each of the first and second conductive segments overlies and is electrically connected to a S/D structure of the plurality of S/D structures in each of the second and third active areas, constructing additional conductive segments, a plurality of gate structures, and a plurality of via structures, thereby forming one of an AOI, an OAI, or a four-input NAND device including the first and second conductive segments and pull-up and pull-down transistors in each of the first and second rows, and constructing first through third power rails extending in the first direction. The first and second power rails are aligned with the first row, the second and third power rails are aligned with the second row, and each of the first and second conductive segments crosses a plane perpendicular to the first and second conductive segments and including the second power rail. In some embodiments, constructing the first and second conductive segments includes constructing MD segments. In some embodiments, constructing the first and second conductive segments includes constructing third and fourth conductive segments extending in the second direction, wherein each of the third and fourth conductive segments overlies and is electrically connected to a S/D structure of the plurality of S/D structures in each of the second and third active areas. In some embodiments, each of forming the first and fourth active areas includes forming an n-type active area and each of forming the second and third active areas includes forming a p-type active area, or each of forming the first and fourth active areas includes forming a p-type active area and each of forming the second and third active areas includes forming an n-type active area.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) device comprising:
    first and second power rails extending in a first direction, wherein each of the first and second power rails is configured to carry one of a power supply voltage or a power supply reference voltage;
    a third power rail extending in the first direction between the first and second power rails, wherein the third power rail is configured to carry the other of the power supply voltage or the power supply reference voltage; and
    a plurality of transistors comprising:
        first through fourth active areas extending in the first direction between the first and second power rails, wherein each of the second and third active areas is adjacent to the third power rail;
        a plurality of gate structures extending in a second direction perpendicular to the first direction; and
        first and second conductive segments extending in the second direction across the third power rail, wherein each of the first and second conductive segments is electrically connected to a first set of source/drain (S/D) structures in each of the second and third active areas,
    wherein the plurality of transistors is configured as one of an and-or-inverter (AOI), an or-and-inverter (OAI), or a four-input NAND gate.

2. The IC device of claim 1, wherein the first and second conductive segments comprise respective first and second metal-like defined (MD) segments underlying the third power rail and overlying the corresponding first set of S/D structures in the second and third active areas.

3. The IC device of claim 2, further comprising third and fourth MD segments underlying the third power rail and overlying a corresponding second set of S/D structures in the second and third active areas.

4. The IC device of claim 3, further comprising first through third metal segments extending in the first direction, wherein
    the first metal segment overlies the first and second MD segments and overlies and is electrically connected to fifth through seventh MD segments overlying a corresponding third set of S/D structures in the second active area,
    the second metal segment overlies the third MD segment and overlies and is electrically connected to eighth and ninth MD segments overlying a corresponding fourth set of S/D structures in the third active area, and
    the third metal segment overlies the fourth MD segment and overlies and is electrically connected to tenth and eleventh MD segments overlying a corresponding fifth set of S/D structures in the third active area.

5. The IC device of claim 2, further comprising:
    a first conductive path comprising the first MD segment and a first metal segment extending in the first direction and electrically connected to each of the first MD segment and a third MD segment overlying a corresponding first S/D structure of a second set of S/D structures in the second active area; and
    a second conductive path comprising the second MD segment and a second metal segment extending in the first direction and electrically connected to each of the second MD segment and a fourth MD segment overlying a corresponding second S/D structure of the second set of S/D structures in the second active area.

6. The IC device of claim 5, wherein
    the first conductive path further comprises a fifth MD segment extending in the second direction across the third power rail and electrically connected to the first metal segment and the corresponding S/D structures of the first and second sets of S/D structures in each of the second and third active areas, and
    the second conductive path further comprises a sixth MD segment extending in the second direction across the third power rail and electrically connected to the second metal segment and the corresponding S/D structures of the first and second sets of S/D structures in each of the second and third active areas.

7. The IC device of claim 5, further comprising a third conductive path comprising:
    a fifth MD segment extending in the second direction across the third power rail and electrically connected to a corresponding third set of S/D structures in each of the second and third active areas; and
    a third metal segment extending in the first direction and electrically connected to each of the fifth MD segment and sixth and seventh MD segments overlying a corresponding fourth set of S/D structures in the third active area.

8. The IC device of claim 1, wherein each of the first and second conductive segments comprises a metal segment overlying each of the third power rail and the corresponding first set of S/D structures in the second and third active areas.

9. The IC device of claim 1, wherein
    each of the first and second power rails is configured to carry the power supply voltage,
    the third power rail is configured to carry the power supply reference voltage,
    each of the first and fourth active areas comprises a p-type active area, and
    each of the second and third active areas comprises an n-type active area.

10. The IC device of claim 1, wherein
    each of the first and second power rails is configured to carry the power supply reference voltage,
    the third power rail is configured to carry the power supply voltage,
    each of the first and fourth active areas comprises an n-type active area, and
    each of the second and third active areas comprises a p-type active area.

11. An integrated circuit (IC) device comprising:
a first row of transistors comprising:
  first and second active areas extending in a first direction adjacent to respective first and second power rails, each of the first and second active areas comprising a plurality of first source/drain (S/D) structures; and
  a first plurality of gate structures extending between the first and second power rails in a second direction perpendicular to the first direction,
  wherein the first row of transistors is configured to receive a first subset of a plurality of input signals;
a second row of transistors comprising:
  third and fourth active areas extending in the first direction adjacent to the second power rail and a third power rail, respectively, each of the third and fourth active areas comprising a plurality of second S/D structures; and
  a second plurality of gate structures extending between the second and third power rails in the second direction,
  wherein the second row of transistors is configured to receive a second subset of the plurality of input signals; and
first and second conductive segments extending in the second direction across the second power rail,
wherein
  each of the first and second conductive segments is electrically connected to a first S/D structure of the plurality of first S/D structures in the second active area and to a second S/D structure of the plurality of second S/D structures in the third active area, and
  the first and second rows of transistors and first and second conductive segments are configured as one of an and-or-inverter (AOI), an or-and-inverter (OAI), or a four-input NAND gate.

12. The IC device of claim 11, wherein
the first row of transistors comprises:
  pull-up transistors comprising the first active area and configured to receive the first subset of the plurality of input signals; and
  pull-down transistors comprising the second active area and configured to receive the first subset of the plurality of input signals, and
the second row of transistors comprises:
  pull-down transistors comprising the third active area and configured to receive the second subset of the plurality of input signals; and
  pull-up transistors comprising the fourth active area and configured to receive the second subset of the plurality of input signals.

13. The IC device of claim 11, wherein
the first row of transistors comprises:
  pull-down transistors comprising the first active area and configured to receive the first subset of the plurality of input signals; and
  pull-up transistors comprising the second active area and configured to receive the first subset of the plurality of input signals, and
the second row of transistors comprises:
  pull-up transistors comprising the third active area and configured to receive the second subset of the plurality of input signals; and
  pull-down transistors comprising the fourth active area and configured to receive the second subset of the plurality of input signals.

14. The IC device of claim 11, wherein
each of the first and second rows of transistors is configured to receive the respective first or second subset of the plurality of input signals comprising a total of two input signals.

15. The IC device of claim 14, wherein
each of the first and second rows of transistors is configured to receive an input signal of the plurality of input signals in addition to the first and second subsets of the plurality of input signals.

16. The IC device of claim 11, further comprising:
a metal segment extending in the second direction across the second power rail and configured to carry an output signal.

17. An integrated circuit (IC) device comprising:
first and second power rails extending in a first direction, wherein the first and second power rails are configured to carry one of a power supply voltage or a power supply reference voltage;
a third power rail extending in the first direction between the first and second power rails, wherein the third power rail is configured to carry the other of the power supply voltage or the power supply reference voltage; and
a plurality of transistors configured as one of an and-or-inverter (AOI), an or-and-inverter (OAI), or a four-input NAND gate, wherein the plurality of transistors comprises:
  a first active area extending adjacent to the first power rail;
  second and third active areas extending adjacent to the third power rail;
  a fourth active area extending adjacent to the second power rail;
  a plurality of gate structures extending in a second direction perpendicular to the first direction; and
  a plurality of metal-like defined (MD) segments extending in the second direction and comprising:
    a first MD segment overlying and electrically connected to each of a first source/drain (S/D) structure in the second active area and a second S/D structure in the third active area, and
    a second MD segment overlying and electrically connected to each of a third S/D structure in the second active area and a fourth S/D structure in the third active area.

18. The IC device of claim 17, wherein the plurality of MD segments further comprises:
a third MD segment overlying and electrically connected to each of a fifth S/D structure in the second active area and a sixth S/D structure in the third active area, and
a fourth MD segment overlying and electrically connected to each of a seventh S/D structure in the second active area and an eighth S/D structure in the third active area.

19. The IC device of claim 17, wherein the plurality of MD segments further comprises:
a third MD segment electrically connected to each of the first power rail and a fifth S/D structure in the first active area,
a fourth MD segment electrically connected to each of the second power rail and a sixth S/D structure in the fourth active area, and
a fifth MD segment electrically connected to each of the third power rail and a seventh S/D structure in the second or third active area.

20. The IC device of claim 17, wherein
at least four gate structures of the plurality of gate structures are positioned between the first and second MD segments of the plurality of MD segments.

\* \* \* \* \*